US008351490B2

(12) United States Patent
Chen et al.

(10) Patent No.: US 8,351,490 B2
(45) Date of Patent: Jan. 8, 2013

(54) RADIO FREQUENCY IDENTIFICATION TRANSCEIVER

(75) Inventors: Xuesong Chen, Singapore (SG); Pradeep B. Khannur, Singapore (SG); Wooi Gan Yeoh, Singapore (SG); Rajinder Singh, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 588 days.

(21) Appl. No.: 12/524,442

(22) PCT Filed: Jan. 28, 2008

(86) PCT No.: PCT/SG2008/000030
§ 371 (c)(1),
(2), (4) Date: Nov. 16, 2009

(87) PCT Pub. No.: WO2008/091230
PCT Pub. Date: Jul. 31, 2008

(65) Prior Publication Data
US 2010/0080270 A1   Apr. 1, 2010

Related U.S. Application Data

(60) Provisional application No. 60/886,773, filed on Jan. 26, 2007, provisional application No. 60/941,454, filed on Jun. 1, 2007.

(51) Int. Cl.
*H04L 27/32* (2006.01)
(52) U.S. Cl. ........ 375/219; 375/319; 375/316; 375/295; 340/572.2; 340/572.1; 340/10.1; 340/10.2

(58) Field of Classification Search ............... 375/219, 375/316, 295; 340/572.2, 572.1, 10.1, 10.2
See application file for complete search history.

(56) References Cited

U.S. PATENT DOCUMENTS

| | | | | |
|---|---|---|---|---|
| 4,084,137 A * | 4/1978 | Welti | ............ | 375/260 |
| 5,751,223 A * | 5/1998 | Turner | ............ | 340/10.41 |
| 6,026,125 A | 2/2000 | Larrick, Jr. et al. | | |
| 7,155,179 B1 * | 12/2006 | Rothenberg | ............ | 455/114.2 |
| 7,424,061 B2 * | 9/2008 | Heikkila | ............ | 375/259 |
| 7,852,949 B2 * | 12/2010 | Jurgensen et al. | ............ | 375/242 |
| 7,860,075 B2 * | 12/2010 | Benjebbour et al. | ............ | 370/347 |
| 2004/0248528 A1 | 12/2004 | Rozenblit et al. | | |

(Continued)

FOREIGN PATENT DOCUMENTS

CA    2391480    5/2001

(Continued)

OTHER PUBLICATIONS

International Search Report for PCT/SG2008/000030 filed Jan. 28, 2008; mailed Apr. 24, 2008.

(Continued)

*Primary Examiner* — Siu Lee
(74) *Attorney, Agent, or Firm* — Connolly Bove Lodge & Hutz LLP

(57) ABSTRACT

A radio frequency identification transceiver is disclosed. The radio frequency identification transceiver includes: a transmitter path, including; a pulse shaper to tunably shape the pulse of a signal to be transmitted in different predefined frequency ranges; a modulator to modulate the shaped pulse to be transmitted into one of a plurality of predefined frequency ranges; a receiver path, including: a demodulator to demodulate a received signal from a plurality of predefined frequency ranges.

16 Claims, 49 Drawing Sheets

U.S. PATENT DOCUMENTS

| | | | |
|---|---|---|---|
| 2006/0037449 A1* | 2/2006 | Lavallee | 83/54 |
| 2006/0107307 A1* | 5/2006 | Knox et al. | 726/2 |
| 2006/0261956 A1* | 11/2006 | Sundstrom et al. | 340/572.2 |
| 2007/0041476 A1* | 2/2007 | Seon | 375/340 |
| 2007/0076813 A1* | 4/2007 | Haartsen | 375/285 |

FOREIGN PATENT DOCUMENTS

| | | |
|---|---|---|
| CN | 1411651 A | 4/2003 |
| CN | 1488201 A | 4/2004 |
| CN | 1674570 A | 9/2005 |
| WO | 02/09373 | 1/2002 |
| WO | 2005/065423 | 7/2005 |

OTHER PUBLICATIONS

Written Opinion for PCT/SG2008/000030 filed Jan. 28, 2008; mailed Apr. 24, 2008.

Zhang et al. "A Low Power CMOS UWB Pulse Generator," 48th Midwest Symposium on Circuits and Systems, vol. 2, p. 1410-1413, Aug. 7-10, 2005.

Smaini et al. "Single-Chip CMOS Pulse Generator for UWB Systems," IEEE Journal of Solid-State Circuits, vol. 41, No. 7, Jul. 2006, p. 1551-1561.

* cited by examiner

The low cut off frequency changes according to the data rate

| Switch | LNA Gain | Mode |
|--------|--------------------|-------------|
| 0 | High gain - default | Listen mode |
| 1 | Low gain | Talk mode |

FIGURE 18
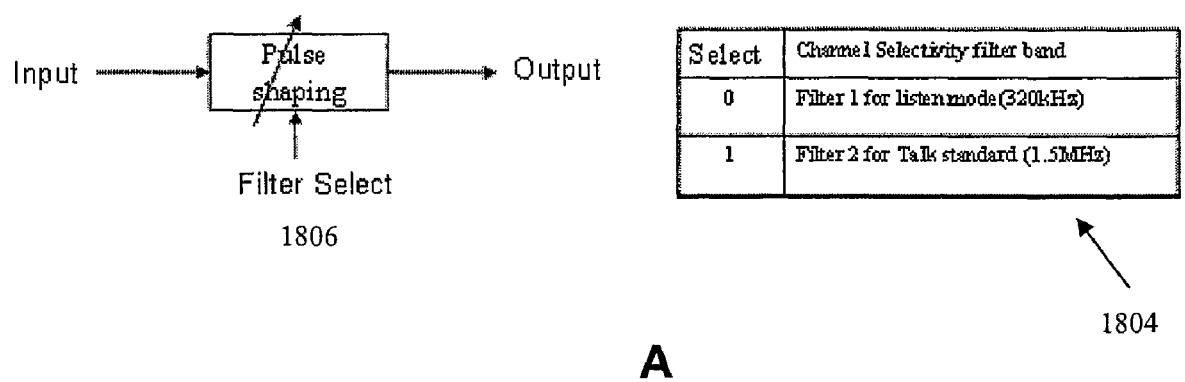
A
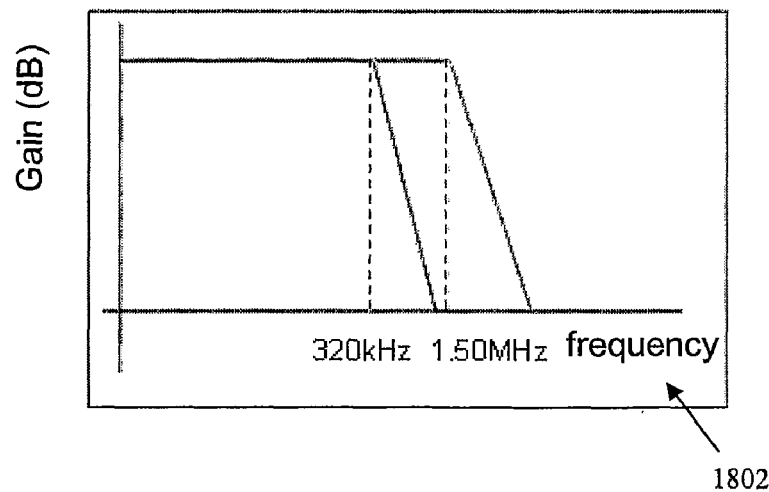
B

FIGURE 23
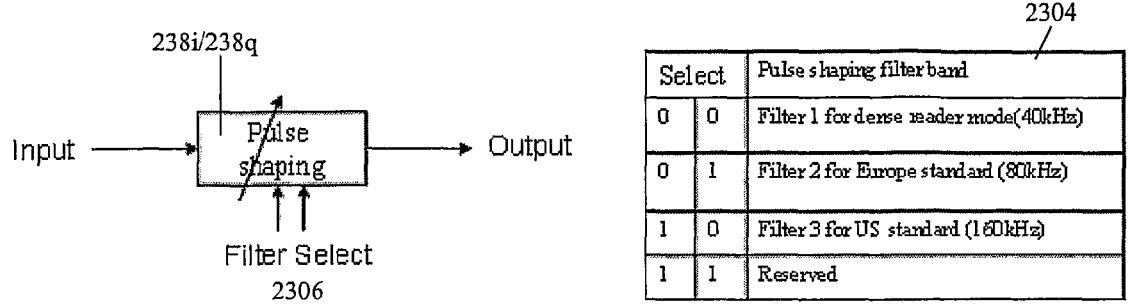
A
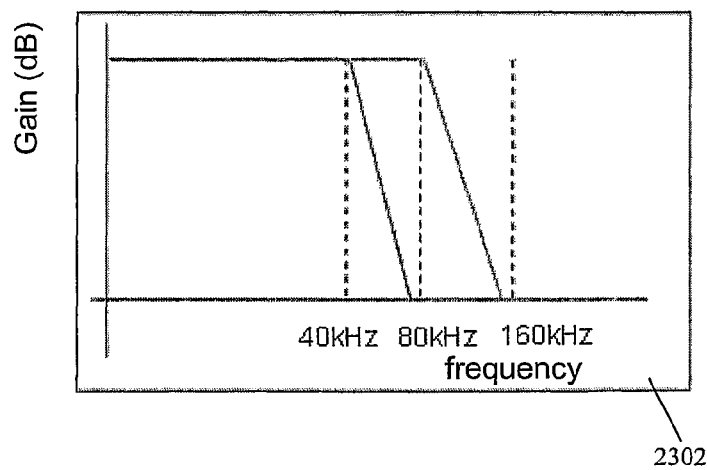
B

FIGURE 30

| D5 | D4 | Description |
|----|----|-------------|
| 0 | 0 | Talk mode: All On |
| 0 | 1 | Listen mode: Tx On (PA, PLL, Modulator, DAC, PSF) Rx Off (LNA, Mixer, VGA, Demodulator, ADC) |
| 1 | 0 | Rx On (LNA, Mixer, PLL, VGA, Demodulator, ADC) Tx Off (PA, Modulator, DAC, PSF) |
| 1 | 1 | All OFF |

3002

3004

| Power Control Register | | | | | | | | | | | | | | | | | | | |
|---|---|---|---|---|---|---|---|---|---|---|---|---|---|---|---|---|---|---|---|
| Power On/Off control for individual blocks | | | | | | | | | | | | | | | | Op. Code | | | |
| D19 | D18 | D17 | D16 | D15 | D14 | D13 | D12 | D11 | D10 | D9 | D8 | D7 | D6 | D5 | D4 | D3 | D2 | D1 | D0 |
| C16 | C15 | C14 | C13 | C12 | C11 | C10 | C9 | C8 | C7 | C6 | C5 | C4 | C3 | C2 | C1 | 1 | 1 | 1 | 1 |

| Bits | Value | Power down control (0 – ON; 1 – OFF) |
|------|-------|--------------------------------------|
| C1 | 0/1 | Reset – all off |
| C2 | 0/1 | DAC ON/OFF |
| C3 | 0/1 | Pulse shaping filter ON/OFF |
| C4 | 0/1 | Modulator ON/OFF |
| C5 | 0/1 | PA ON/OFF |
| C6 | 0/1 | LNA ON/OFF |
| C7 | 0/1 | Mixer ON/OFF |
| C8 | 0/1 | VGA ON/OFF |
| C9 | 0/1 | ADC ON/OFF |
| C10 | 0/1 | Demodulator ON/OFF |
| C11 | 0/1 | PLL1 ON/OFF |
| C12 | 0/1 | PLL2 ON/OFF |
| C13 | 0/1 | PLL1 BUFFER ON/OFF |
| C14 | 0/1 | PLL2 BUFFER ON/OFF |

3006

FIGURE 34
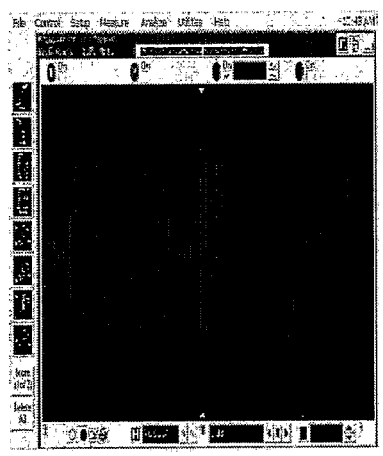 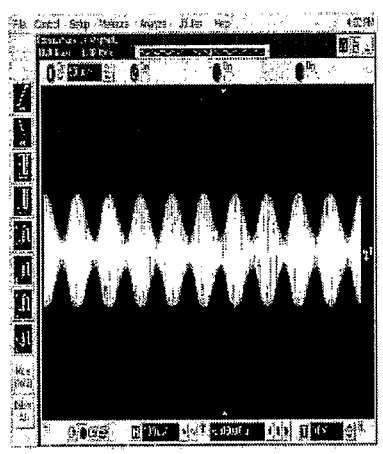 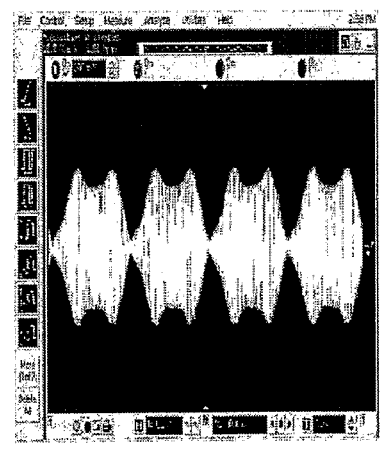
A	B	C

FIGURE 35
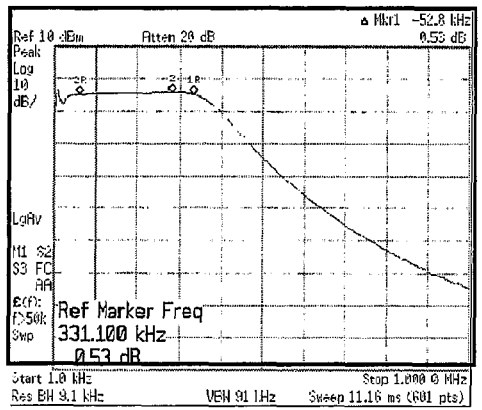 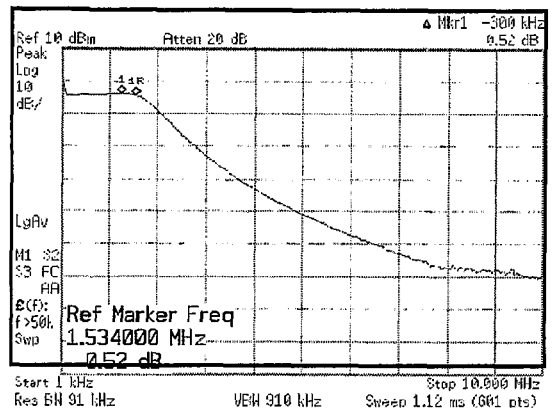
A B

FIGURE 38

| Parameter | Measured Results | |
|---|---|---|
| Operating Frequency | 860 ~ 960MHz | |
| Transmit power | +10dBm with power control of 16dB in 1dB step | |
| Receiver Sensitivity | -96dbm – LBT Mode | |
| | -85dBm – Talk mode | |
| IIP3 | -10dBm – LBT Mode | |
| | 0dBm – Talk mode | |
| Synthesizer performance | Lock range: 860 ~ 960MHz | |
| | Frequency step: 50kHz | |
| | Phase noise | |
| | @ 100kHz Offset | -101dBc/Hz |
| | @ 50kHz Offset | -92dBc/Hz |
| ADCs | 10-bit resolution; SFDR=59dB; INL: 1.3 (LSB); DNL: 0.55 (LSB) | |
| DACs | 10-bit resolution | |
| Channel-select filters – Selectable Cutoff Frequency | LBT mode: 330kHz | |
| | Talk mode: 1.53MHz | |
| Pulse-shaping filters – Selectable Cutoff Frequency | 40kHz | |
| | 80kHz | |
| | 160kHz | |
| Modulation | DSB-ASK/PR-ASK/SSB-ASK | |
| On-chip demodulator | ASK (up to 640kbps) | |
| Power consumption | 300mA from 1.8V supply – when all the blocks are ON | |
| Operating voltage | 1.8V ± 10% | |
| Operating temperature | -25° C to +75° C | |
| Die size | 6mm X 6mm | |
| Package | TQFP100 | |

FIGURE 39

| Transponder Type | Fully-discrete reader | Using the Reader IC presented in this Paper |
|---|---|---|
| EPC Gen 2 (ISO 18000-6C) | 1.6m | 1.5m |
| Philips HSL (ISO 18000-6B) | 1.8m | 1.5m |
| EM4122 | 1.2m | 1.0m |

FIGURE 43
Tx data:
ASK modulated
signal spectrum:
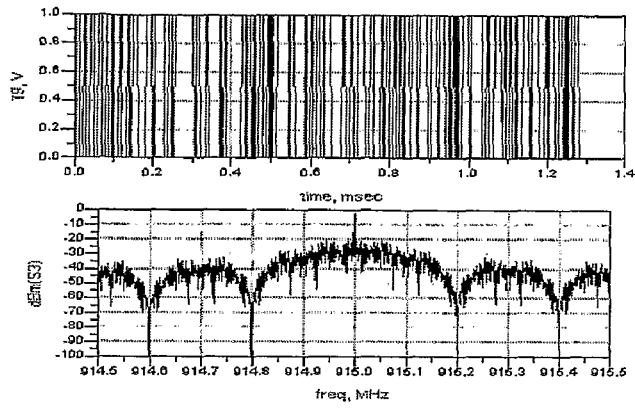
Demodulated signal:
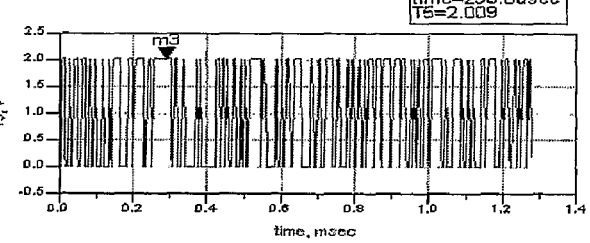
BER versus Es/N0:
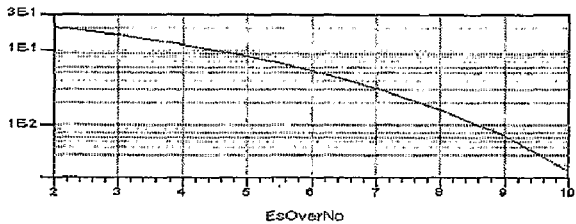

RADIO FREQUENCY IDENTIFICATION TRANSCEIVER

CROSS-REFERENCE TO RELATED APPLICATIONS

This application is a National Stage Application under 35 USC §371(c) of PCT Application No. PCT/SG2008/000033, entitled "A RADIO FREQUENCY INDENTIFICATION TRANSCEIVER," filed Jan. 28, 2008, which claims priority to U.S. Provisional Patent Application No. 60/886,773, filed Jan. 26, 2007 and claims priority to U.S. Provisional Patent Application No. 60/941,454, filed Jun. 1, 2007, all which is hereby incorporated by reference herein.

FIELD OF THE INVENTION

The invention relates to a radio frequency identification transceiver.

BACKGROUND OF THE INVENTION

Demand for Radio Frequency Identification (RFID) is increasing rapidly with advancement in integrated circuit (IC) technologies and decreasing size and cost of RFID tags. These enable numerous applications which require very small size and low-cost RFID readers. Some of these applications include tagging items in retail stores, warehouse management, baggage tracing and tracking at the airports. This increase in demand calls for a corresponding need for small form factor and low-cost handheld RFID readers.

RFID frequency bands start from as low as 125 kHz. But for long read range ultra-high frequency (UHF), 860 MHz to 960 MHz band, is preferred since the size of the reader and tags are comparable to wavelength. Further, the 860 MHz to 960 MHz band falls within the approved frequency bands for UHF RFID in major countries. For USA, the minimum frequency resolution is about 50 kHz. EPC Global Class-1 Generation-2 protocol focuses on the frequency band from 860 MHz to 960 MHz. The European RFID standard calls for stringent spectrum mask requirement as disclosed in publication European Telecommunications Standards Institute EN 302 208-1 V1.1.2, European Standard, 2006-03.

There are known single-chip transceivers providing radio frequency (RF), mixed-signal, and digital baseband functionality for a physical layer of a UHF RFID reader. The RFID reader IC has a die size of 21 mm$^2$ and is realized in a 0.18 μm silicon germanium (SiGe) BiCMOS process. The chip dissipates 1.5 W when simultaneously transmitting a +20 dBm signal and receiving −85 dBm tag signals in the presence of a 0 dBm self jammer.

There is also a known complementary metal-oxide-semiconductor (CMOS) RF transceiver for UHF mobile RFID reader operating at 900 MHz band. The transceiver is designed and fabricated in a 0.18 μm CMOS process, where the design focus is on the linearity rather than the noise figure.

There is also a known reader front-end which allows for detection of the tag information in the presence of large in-band blockers, based on the RFID range. The proposed reader allows for amplification of the weakest desired signal by 18 dB while rejecting the TX blocker and its noise floor as well as LO phase noise by 30 dB on average, resulting in a better than 50 dB of signal-to-blocker ratio. TX blocker rejection is achieved through a combination of signals traveling in two RF paths, a linear path and a nonlinear path. In the linear path, both the desired and the blocker signals are equally amplified through a low noise amplifier (LNA) and in the nonlinear path, the desired signal limits both the blocker and the desired signals. The limiting function only preserves the frequency and phase of the stronger blocker signal. The blocker signal is then rejected by subtracting the outputs of the linear and nonlinear paths. Therefore, the blocker signal is cancelled out but the desired signal is amplified through the linear path.

There is a known RFID reader accessible through a personal computer, where the RFID reader includes a PC card interface and a controller both operating according to clock signals from a crystal oscillator. The RFID reader further includes a linearized power amplifier modulator in a transmit path, a receive chain capable of demodulating EPC global Class_1 and Class_0 signals from RFID tags, and an integrated switching device for selecting one of a plurality of antenna for transmitting or receiving RF signals.

Another RFID reader provides sensitivity enhancement for a single antenna RFID interrogating device by separately coupling a nulling signal formed using a portion of a transmit signal into a receiver. The phase and amplitude of nulling signal can be adjusted so that the nulling signal cancels that a reflected transmit signal from the antenna, resulting in the small backscattered signal from the distant RFID tag to be more easily detected, and improving the sensitivity of the RFID receiver.

A known receiver uses a lumped constant network approach to eliminate costly and bulky couplers, circulators and distributed delay lines. A single-pole, four-throw (sp4t) antenna switching arrangement is also provided. The receiver provides a hand-held receiver capable of operation over distances of approximately three to five meters. This allows the construction of a hand-held receiver having high performance (i.e., a long reading distance) and good discrimination (i.e., the ability to accurately read closely-spaced tags moving rapidly past a check point). When used with compatible RFID tags, the system may also be used to alter the identification or other information stored within the RFID tags.

It would be advantageous to have a RFID transceiver that provides the above functions on a single integrated device and yet is able to operate in one of a plurality of predefined frequency ranges. The present invention provides such a RFID transceiver that matches the performance of currently available, but more expensive and bulkier RFID transceivers.

SUMMARY OF THE INVENTION

According to one aspect of the invention, there is provided a radio frequency identification transceiver, including: a transmitter path, including; a pulse shaper to tunably shape the pulse of a signal to be transmitted in different predefined frequency ranges; a modulator to modulate the shaped pulse to be transmitted into one of a plurality of predefined frequency ranges; a receiver path, including: a demodulator to demodulate a received signal from a plurality of predefined frequency ranges.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 18A shows a block level representation of a channel select filter (CSF) of a RFID transceiver built in accordance to an embodiment of the present invention.

FIG. 18B shows frequency characteristics of a CSF.

FIG. 23A shows a block level representation of a PSF in a transmitter path of a RFID transceiver built in accordance with an embodiment of the invention.

FIG. 23B shows frequency characteristics of a PSF.

FIG. 30 summarises logic control of an ASIC.

FIG. 34A shows DSB-ASK modulation of a RFID transceiver built in accordance with an embodiment of the invention.

FIG. 34B shows PR-ASK modulation of a RFID transceiver built in accordance with an embodiment of the invention.

FIG. 34C shows SSB-ASK modulation of a RFID transceiver built in accordance with an embodiment of the invention.

FIG. 35A shows a channel-select filter response in listen before talk mode of a RFID transceiver built in accordance with an embodiment of the invention.

FIG. 35B shows a channel-select filter response in talk mode of a RFID transceiver built in accordance with an embodiment of the invention.

FIG. 38 shows a table summarizing the performance results of a RFID transceiver built in accordance with an embodiment of the invention.

FIG. 39 shows a table summarizing the range performance results of a RFID transceiver built in accordance with an embodiment of the invention.

FIG. 43 shows waveforms in a receiver path of a RFID transceiver built in accordance with an embodiment of the invention, where an ideal local oscillator is used.

DESCRIPTION

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

Figure 1:
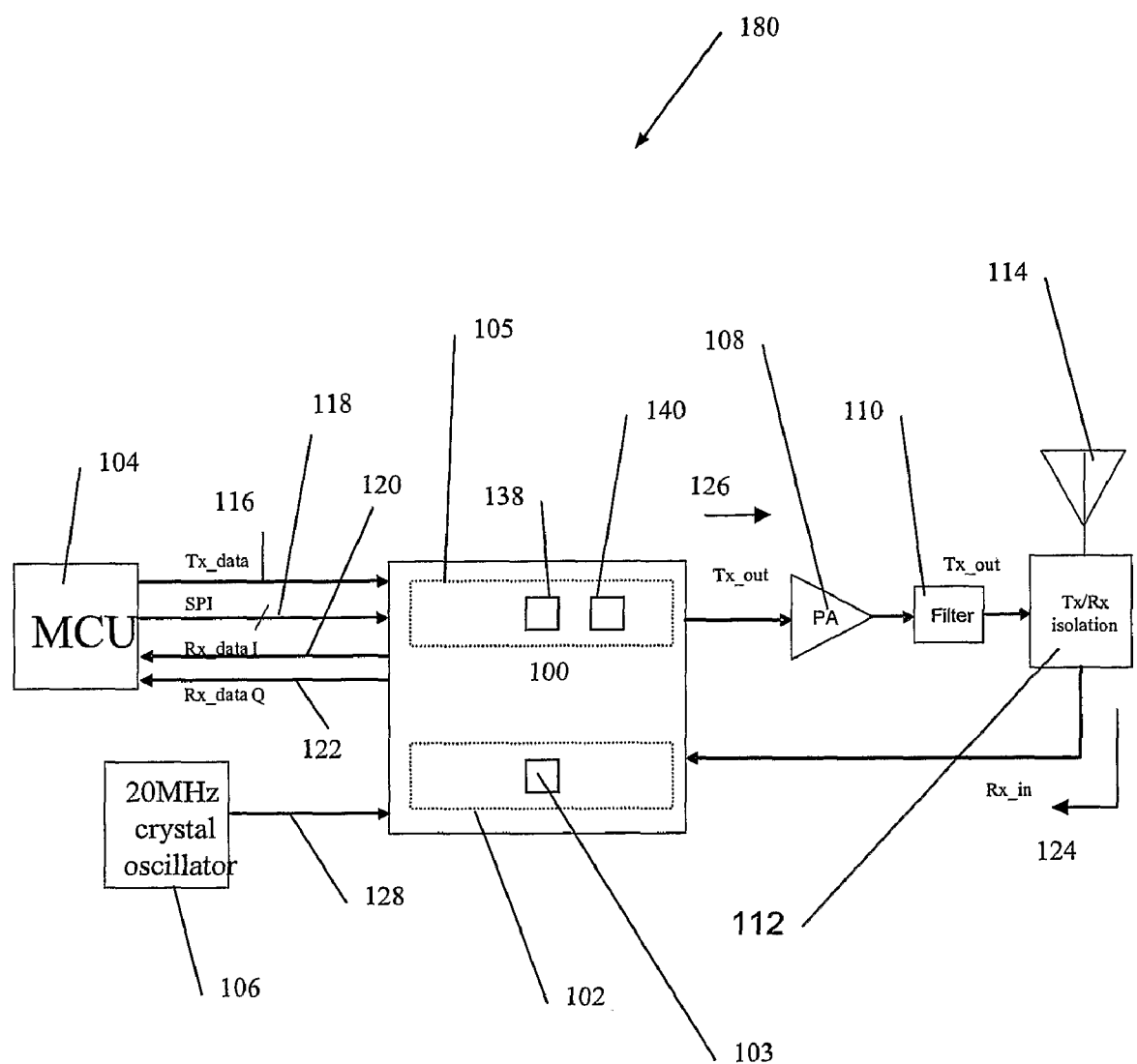
FIG. 1 shows a block level representation of a RFID (Radio Frequency Identification) system built in accordance to an embodiment of the present invention

FIG. 1 shows a block level representation of a RFID (Radio Frequency Identification) system 180 built in accordance to an embodiment of the present invention.

The RFID system 180 includes a RFID transceiver 100 electrically connected with a microcontroller (MCU) 104, a crystal oscillator 106, a transmitter/receiver (Tx/Rx) isolation unit 112 and a power amplifier (PA) 108. The PA 108 is in turn connected with a filter 110 and the filter 110 is also connected with the Tx/Rx isolation unit 112. An antenna 114 is coupled to the Tx/Rx isolation unit 112 to transmit signals (Tx_out) 126 from the RFID transceiver 100 and to send received signals (Rx_in) 124 to the RFID transceiver 100.

The RFID transceiver 100 includes a transmitter path 105 and a receiver path 102. The transmitter path 105 includes a pulse shaper 138 to tunably shape the pulse of a signal to be transmitted 126 in different predefined frequency ranges; a modulator 140 to modulate the shaped pulse to be transmitted 126 into one of a plurality of predefined frequency ranges. The receiver path 102 includes a demodulator 103 to demodulate the received signal 124 from a plurality of predefined frequency ranges.

It is advantageous to achieve isolation between the transmitter portion and the receiver portion in a RFID reader system having an integrated transmitter and receiver arrangement. This is because the transmitter output may leak into the receiver front-end if the transmitter and the receiver front-end are not sufficiently isolated. The capability of the receiver front end to handle a leaked signal from the transmitter, without affecting performing of the desired signals, is referred to as the receiver front-end linearity. It is difficult to achieve, using 0.18-μm CMOS (Complimentary Metal Oxide Semiconductor) technology, an integrated transmitter and receiver arrangement that has the same linearity compared to a discrete transmitter and receiver arrangement. It was found that the above arrangement of the RFID system 180 provided good isolation between the transmitter portion and the receiver portion.

In use, the MCU 104 controls the operation of the RFID transceiver 100 by sending, to the RFID transceiver 100, data for transmission (Tx_data) 116 and serial peripheral interface (SPI) circuit control signals 118. The MCU 104 also processes both in-phase (I) receiver data (Rx_data I) 120 and quadrature-phase (Q) receiver data (Rx_data Q) 122 from the RFID module 100. The crystal oscillator 106 is used to provide a stable reference clock signal 128 to the RFID module 100, and has a resonance of 20 MHz in this embodiment. The PA 108 allows for the RFID transceiver 100 to be used over longer distances.

The transmitted Tx_out signal 126 is a carrier signal modulated with the Tx_data 116, while Rx_data I 120 and Rx_data Q 122 RFID are both data demodulated from the received Rx_in signal 124. The Tx/Rx isolation unit 112 ensures that the transmitted Tx_out signal 126 and the received Rx_in signal 124 are isolated from each other.

Figure 2:
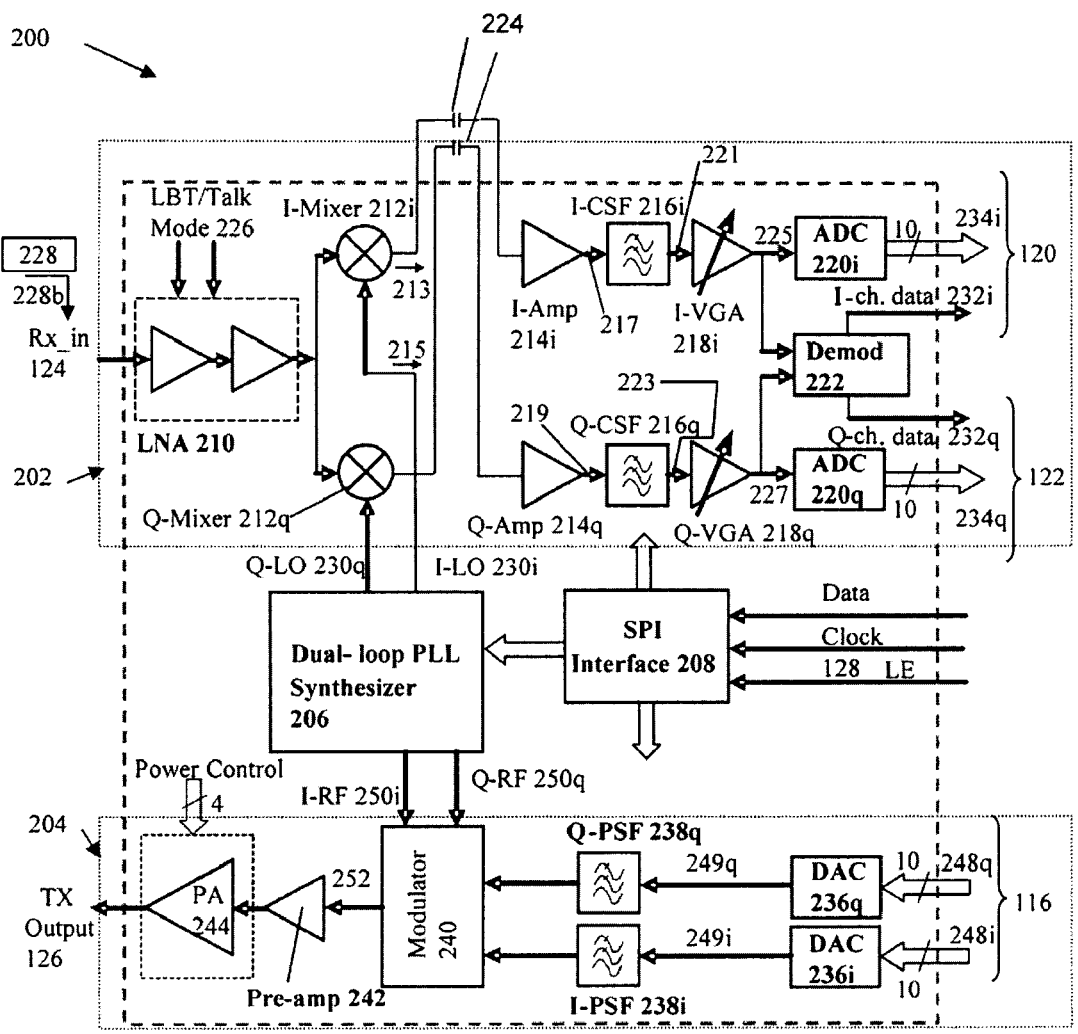
FIG. 2 shows a block level representation of the architecture of a RFID transceiver built in accordance to an embodiment of the present invention.
Figure 2A:
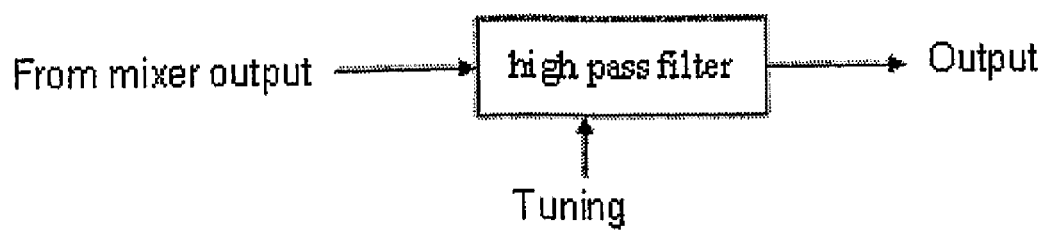
FIG. 2A shows a block level representation of a high pass filter of a RFID transceiver built in accordance to an embodiment of the present invention.

FIG. 2 shows a block level representation of the architecture of a RFID transceiver 200 built in accordance to an embodiment of the present invention. It will be appreciated that the RFID transceiver 200 can be used in place of the RFID transceiver 100 of FIG. 1.

The RFID transceiver 200 includes a receiver path 202, a transmitter path 204, a dual-loop phase locked loop (PLL) synthesizer 206 and a serial peripheral interface (SPI) circuit 208.

I) Receiver Path 202

The receiver path 202 includes: a low-noise amplifier (LNA) 210; a set of in-phase (I) and quadrature-phase (Q) mixers 212i (I-Mixer) and 212q (Q-Mixer); a set of I and Q amplifiers 214i (I-Amp) and 214q (Q-Amp); a set of I and Q channel-select filters (CSF) 216i (I-CSF) and 216q (Q-CSF); a set of I and Q variable gain amplifiers (VGA) 218i (I-VGA) and 218q (Q-VGA); a set of analogue to digital converters (ADC) 220i and 220q; and an amplitude-shift keying (ASK) demodulator 222.

The Rx_in signal 124 enters the input of the LNA 210, while the LNA 210 output is coupled to both respective inputs of the I-Mixer 212i and Q-Mixer 212q. Thus, the receiver path 202 includes at least one amplifier to amplify the received signal 124. The LNA 210 can operate in a high gain mode or a low gain mode depending on the different operation modes of the RFID transceiver 200.

The I-Mixer 212i and the Q-Mixer 212q outputs are coupled to respective inputs of the I-Amp 214i and the Q-Amp 214q respectively via external direct (DC) blocking capacitors 224. The I-Amp 214i and the Q-Amp 214q outputs are coupled to respective inputs of the I-CSF 216i and the Q-CSF 216q, while the outputs of the I-CSF 216i and the Q-CSF 216q are connected to respective inputs of the I-VGA 218i and the Q-VGA 218q. The I-VGA 218i output is coupled to the respective ADC 220i input and the ASK demodulator 222 input, while the Q-VGA 218q output is coupled to the respective ADC 220q input and the ASK demodulator 222 input.

The receiver path 202 uses a direct-conversion architecture, since the receiver input Rx_in signal 124 includes a backscatter signal 228b from an RFID tag 228, where the backscatter signal 228b has the same frequency as the transmitted carrier in the transmitted Tx_out signal 126. The receiver front-end down converts the received signal Rx_in signal 124 to baseband signals. Also, at the receiver front-end, the LNA 210 is designed to achieve high sensitivity in the listen-before-talk (LBT) mode and high Input Third Order Intercept Point IIP3 in the talk-mode, where a control signal LBT/Talk Mode 226 determines the respective instantaneous mode (LBT or Talk) the LNA 210 is in. In the embodiment shown in FIG. 2, the LNA 210 is designed with switchable gain, which provides the advantage that the LNA 210 can be used in both the listen-before-talk mode and talk-mode under the European Telecommunications Standards Institute (ETSI) RFID standard. The LNA 210 is switched to low gain for talk mode and high gain for LBT mode. The LNA 210 will be elaborated upon later with reference to FIGS. 15 and 16.

In a RFID system, RFID tags are not battery powered and work in a passive mode taking power from the RFID reader. The read range is limited mainly by the RFID tag 228 sensitivity rather than by the passive RFID reader sensitivity. Currently available RFID tags have sensitivity of around −10 dBm.

The PLL 206 is coupled to the I-Mixer 212i and the Q-Mixer 212q, so that the PLL 206 provides the I-Mixer 212i and the Q-Mixer 212q respectively with an in-phase local oscillator signal (I-LO) 230i and a quadrature local oscillator signal (Q-LO) 230q. The signals I-LO 230i and Q-LO 230q facilitate mixing, in the I-Mixer 212i and the Q-Mixer 212q, of the Rx_in signal 124 with I and Q local oscillator (LO) frequencies employed by the RFID module 200, where the Rx_in signal 124 includes the incoming backscatter signal 228b from the RFID tag 228. The mixing achieves down conversion in the I-Mixer 212i and the Q-Mixer 212q, so that the I-Mixer 212i provides an output signal 213 having a first differential in-phase signal and a second differential in-phase signal and the Q-Mixer 212q provides an output signal 215 having a first differential quadrature signal and a second differential quadrature signal.

The external blocking capacitors 224 help to block fixed DC offset.

Figure 2B:
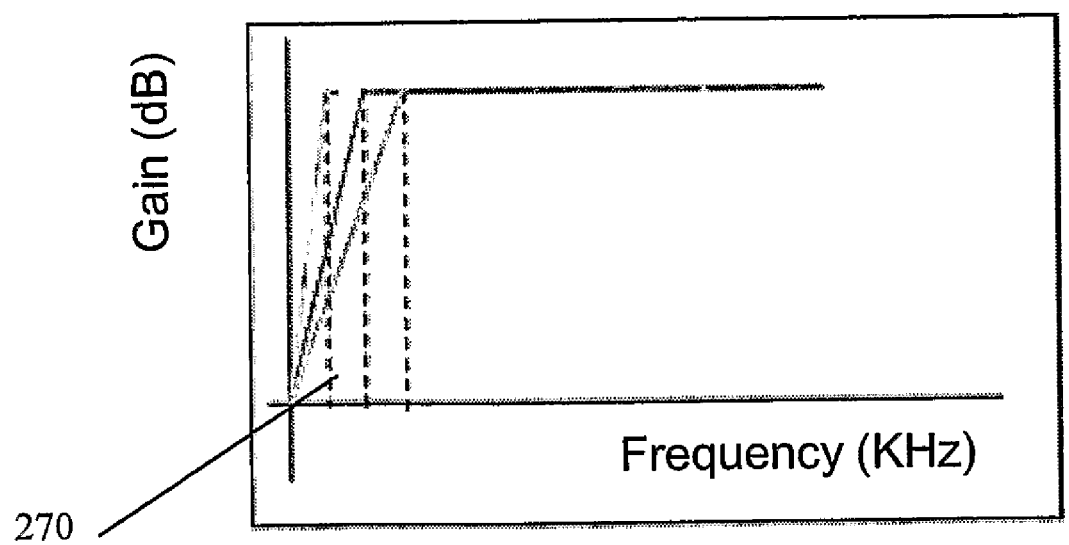
FIG. 2B shows the frequency characteristics of a high pass filter of a RFID transceiver built in accordance to an embodiment of the present invention.

In another embodiment, a high pass filter (not shown in FIG. 2, but refer reference numeral 224/424 in FIG. 4) is deployed in the receiver path 202, between the I-Mixer 212i and the Q-Mixer 212q outputs and their respective I-VGA 218i and Q-VGA 218q inputs. The high pass filter may be a single order high pass filter including external AC coupling capacitors 424 (FIG. 4) and the input resistors of the respective I-VGA 214i and Q-VGA 214. Higher order high pass filters may be required which can be deployed as 224. Referring to FIG. 2B in conjunction with FIG. 2, to reduce information loss, the corner frequency 270 of the high pass filter is designed to be as low as possible. In designing the corner frequency 270 of the high pass filter to be as low as possible, the settling time increases. However, RFID protocols specify, for RFID tag detection, shorter data preambles compared to other communication protocols. The shorter data preamble means that the RFID tag 228 has to be detected within a shorter settling time. Thus, to detect the RFID tag 228 via backscatter modulation, the high pass filter is made tunable in accordance to the backscatter signal 228b data rate settling time. For example, the corner frequency is chosen to be between about 5 to about 10 percent of the backscatter frequency.

Returning to FIG. 2, since the I-Mixer 212i and the Q-mixer 112q have direct-conversion architectures, fully differential architecture is chosen for analog base-band signal processing components, namely the I-Amp 214i, the Q-Amp 214q, the I-CSF 216i, the Q-CSF 216q, the I-VGA 218i, the Q-VGA 218q, the ADCs 220i and 220q, and the ASK demodulator 222.

The I-Amp 214i and the Q-Amp 214q, acting as intermediate-frequency (IF) amplifiers, respectively amplify the output signal 213 (having the first differential in-phase signal and the second differential in-phase signal) emitted from the I-Mixer 212i and amplify the output signal 215 (having the first differential quadrature signal and the second differential quadrature signal) from the Q-Mixer 212q. In the embodiment shown in FIG. 2, the I-Amp 214i and the Q-Amp 214q each provide amplification of around 12 dB.

The I-CSF 216i and the Q-CSF 216q allows the RFID transceiver 200 to operate in channels complying with, in the embodiment shown in FIG. 2, either the FCC (Federal Communications Commission) or the ETSI (European Telecommunications Standards Institute) standards. Each of the I-CSF 216i and the Q-CSF 216q have a tunable pass-band frequency to be either around 320 kHz or around 1.5 MHz. The tunable I-CSF 216i filters the amplified differential signal 217 provided by the I-Amp 214i, while the tunable Q-CSF 216q filters the amplified differential signal 219 provided by the Q-Amp 214q.

A received signal strength indicator (RSSI) circuit (not shown, but compare RSSI circuits 405i and 405q in FIG. 4) may be placed along the receiver path 202 to detect the strength of the signal (from the respective external blocking capacitors 224) realized in logarithmic form. The output from the RSSI circuit may be used to control the gains of both the I-VGA 218i and the Q-VGA 218q to improve the dynamic receive range. Successive detection architecture is adopted for realizing the logarithmic amplifier. It is composed of five stages of limiting amplifier combined with a full-wave rectifier and low pass filter. The limiting amplifier design may use the same architecture as the fixed gain amplifier shown in FIG. 20.

The VGAs 218i and 218q each provide, in the embodiment shown in FIG. 2, a 60 dB gain in the receiver path 202, with control range of about 48 dB. The I-VGA 218i amplifies the output 221 (having the filtered first differential in-phase signal and the filtered second differential in-phase signal) from the I-CSF 216i. The Q-VGA 218q amplifies the output 223 (having the filtered first differential quadrature signal and the filtered second differential quadrature signal) from the Q-CSF 216q.

The output signals 225 and 227 from the I-VGA 218i and the Q-VGA 218q are sent to both the ASK demodulator 222 and the respective ADCs 220i and 220q. Thus, the ASK demodulator 222 and the ADCs 220i and 220q receive the amplified filtered first differential in-phase signal (in output signal 225), the amplified filtered second differential in-phase signal (in output signal 225), the amplified filtered first differential quadrature signal (in output signal 227), and the amplified filtered second differential quadrature signal (in output signal 227). The ASK demodulator 222 demodulates the signals from both the I-VGA 218*i* and the Q-VGA 218*q* into I-ch. data 232*i* and Q-ch. data 232*q*.

On the other hand, the ADCs 220*i* and 220*q*, which both may be of 10-bit configuration, provide digital outputs 234*i* and 234*q* for further processing by digital signal processing (DSP), if desired. Thus, the in-phase analog-to-digital converter ADC 220*i* converts an analog in-phase signal provided by the I-VGA 218*i* to the digital in-phase signal 234*i*. On the other hand, the quadrature analog-to-digital converter ADC 220*q* converts an analog quadrature signal provided by the Q-VGA 218*q* to the digital quadrature signal 234*q*. It will be appreciated, in the embodiment shown in FIG. 2, that the ADCs 220*i* and 220*q* are designed, together with the I—CSF 216*i* and the Q-CSF 216*q*, to meet the requirements under interference conditions specified in both the FCC and the ETSI standards.

Collectively, the outputs 234*i* and 232*i* form the Rx_data I 120 (also refer FIG. 1); while the outputs 234*q* and 232*q* form the Rx_data Q 122 (also refer FIG. 1).

The architecture of the receiver path 202 may be easier to integrate compared to using a superheterodyne architecture and achieves a reduction in chip area without the conversion to an intermediate frequency stage. The receiver path 202 architecture converts the modulated RF signals to base band signals directly which means the LO and the RF carrier frequencies are the same. Another advantage is synchronization is not needed between the I and Q branches for ASK demodulation, thus simplifying design of the base-band. The two I and Q branches ensure that there one branch detects the backscatter signal 228*b* even when there is a phase difference in the backscatter signal 228*b* carrier frequency and the local oscillator of the RFID transceiver 200 (i.e. the operating frequency of the RFID transceiver 200).

II) Transmitter Path 204

The transmitter path 204 includes a set of I and Q digital-to-analogue converters (DAC) 236*i* and 236*q*; a set of tunable I and Q pulse-shaping filters (PSF) 238*i* (I-PSF) and 238*q* (Q-PSF); a modulator 240; a pre-amplifier 242 and a power amplifier (PA) 244.

I and Q transmit data 248*i* and 248*q* from an external processor (not shown) are sent to their respective I and Q DACs 236*i* and 236*q* inputs. The I and Q DACs 236*i* and 236*q* outputs are coupled to respective inputs of the I-PSF 238*i* and the Q-PSF 238*q*. The I-PSF 238*i* and the Q-PSF 238*q* outputs are coupled to respective inputs of the modulator 240. The modulator 240 output is coupled to the pre-amplifier 242 input, while the pre-amplifier will output the TX out signal 126 (also see FIG. 1).

In the embodiment shown in FIG. 2, the DACs 236*i* and 236*q* have 10-bit configurations, where the resolutions of the 10-bit DACs 236*i* and 236*q* are selected based on a consideration of system optimization between analog and digital portions. The DAC 236*i* converts a digital signal 248*i* to an analog signal 249*i* to be transmitted, wherein the DAC 236*i* is coupled to the pulse shaper I-PSF 238*i* such that the analog signal 249*i* to be transmitted is supplied to the pulse shaper I-PSF 238*i*. The DAC 236*q* converts a digital signal 248*q* to an analog signal 249*q* to be transmitted, wherein the DAC 236*q* is coupled to the pulse shaper I-PSF 238*q* such that the analog signal 249*q* to be transmitted is supplied to the pulse shaper I-PSF 238*q*.

By feeding proper data bits to the respective I and Q DACs 236*i* and 236*q*, various modulations schemes, namely double-sideband-amplitude-shift keying (DSB-ASK), phase-reversed ASK (PR-ASK) or single-sideband ASK (SSB-ASK) as desired, by the various communication standard protocols used within the 860 MHz to 960 MHz RFID band, can be realized.

These standard protocols are, for example, the EPC (Electronic Product Code) Class-1 Generation-2 standard, where there are a multiple-reader mode and a dense-reader mode. Under the EPC Class-1 Generation-2 standard, these two modes specify different transmit spectrum mask and different transmit bandwidth requirement. Similarly, the European standard ETSI EN 302 208-1 specifies another reader mode with a respective transmission spectrum mask and a transmission bandwidth.

Figure 24:
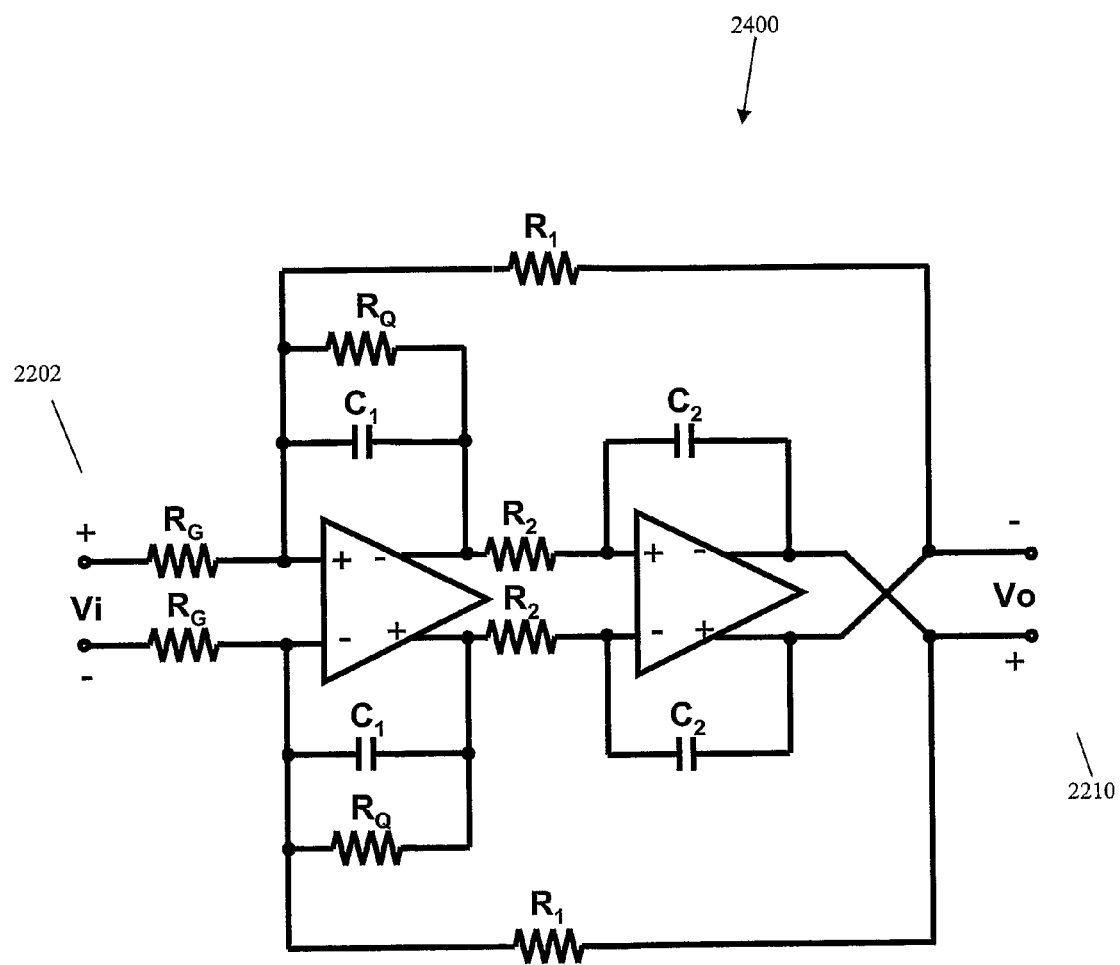
FIG. 24 shows a biquad structure schematic diagram of a PSF in a receiver path of a RFID transceiver built in accordance with an embodiment of the invention.

For the RFID transceiver 200 to operate within the above standard protocols, the pulse shaping filters I-PSF 238*i* and Q-PSF 238*q* are made tunable to reduce the transmission bandwidth so that the baseband waveform spectrum is shaped to fit within the respective transmitting mask specified by the respective standard protocols. In this embodiment shown in FIG. 2, the tunable pulse shaping filters I-PSF 238*i* and Q-PSF 238*q* are switchable to select three pass bands of 40 KHz, 80 KHz and 160 KHz for 0.5 dB bandwidth. A first attenuation of 30 dB starts at 150 KHz, 300 KHz and 750 KHz respectively. A second attenuation of 65 dB begins at 280 KHz, 560 KHz and 1120 KHz respectively. Further, the I-PSF 238*i* and the Q-PSF 238*q* remove spectral spur introduced by the I and Q DACs 236*i* and 236*q*. Further details on the architecture of the I-PSF 238*i* and the Q-PSF 238*q* are shown in FIG. 24.

The modulator 240 adopts an I Q configuration to realize the three modulation schemes, DSB-ASK, PR-ASK and SSB-ASK. For DSB-ASK and PR_ASK, only the I-section of the I-Q modulator 240 is used. For SSB-ASK, both the I and Q sections of the I-Q modulator 240 are needed. The PLL 206 is coupled to the modulator 240 to provide an in-phase radio frequency oscillator signal (I-RF) 250*i* and a quadrature radio frequency oscillator signal (Q-RF) 250*q*. The I-RF 250*i* and the Q-RF 250*q* signals provide the carrier radio frequency (RF), having a predefined or desired frequency range, for transmission. The signals I-RF 250*i* and Q-RF 250*q* are modulated, in the I-Mixer 212*i* and the Q-Mixer 212*q*, with the I-PSF 238*i* and the Q-PSF 238*q* output signals with the transmission data 248*i* and 248*q*.

The modulated carrier signal 252 is amplified by the PA 244 to about +10 dBm. Thus, the transmitter path 204 further includes at least one amplifier to amplify the modulated signal 252 to be transmitted. In the embodiment shown in FIG. 2, the PA 244 provides a 10 dBm 1 dB compression point output power with a gain control of around 15 dB. Further, the transmitter path 204 may further include an attenuator (not shown) to attenuate portions of the modulated signal 252 to be transmitted, wherein the attenuator (not shown) is coupled to the modulator 240 to receive the modulated signal 252 to be transmitted. The attenuator may be a passive device that operates independently from the PA 244.

To meet ETSI standards, an RFID transceiver should have a sensitivity of around −96 dBm or mode in the listen mode. Under the ETSI standard, testing to determine whether a signal is present is based on the detection of the presence of the center frequency of a pre-selected channel. However, for detected signals having a power level around the threshold level of about −96 dBm, a small DC voltage will also be obtained under direct conversion. The small DC voltage may be submerged in DC offset caused by some LO leakage in the direct conversion architecture, thus making detection of the small DC voltage difficult.

Two test modes, using external software control of the signals I-LO 230i and Q-LO 230q, are used by the RFID transceiver 200 of FIG. 2 to detect the presence of a backscatter signal 228b having a power level around the threshold level of about −96 dBm. The two test modes are used in the direct conversion architecture.

Figure 2C:
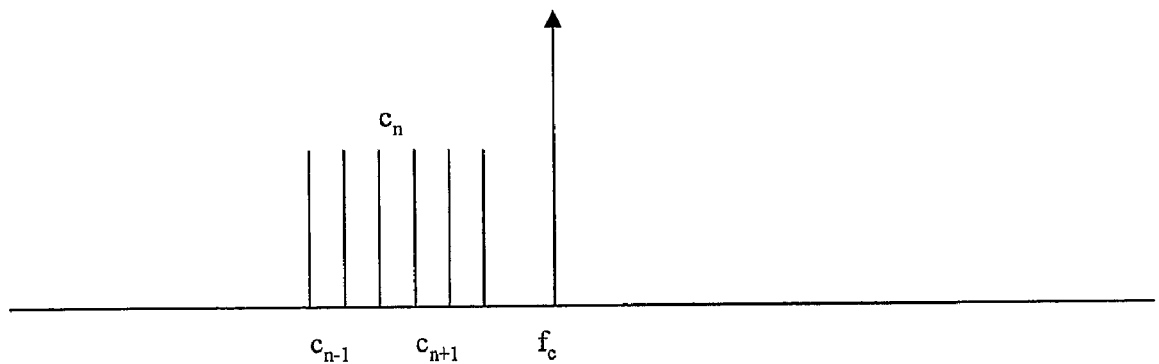
FIG. 2C shows testing to detect the presence of the center frequency of a pre-selected channel.

Referring to FIG. 2C in conjunction with FIG. 2, the first test mode setting has the data signals I-LO 230i and Q-LO 230q set to the pre-selected channel frequency $c_n$ when RF scanning is performed, i.e. the transmitter path 204 is switched on and an un-modulated Tx_out signal 126 is transmitted to verify that the RFID transceiver 200 is operating at the pre-selected channel frequency $c_n$. Next, the RFID transceiver 200 is switched off, and then only the receiver path 202 is switched on. The software will set the local oscillator (LO) frequency to adjacent channels having frequency intervals of 200 kHz either greater ($c_{n+1}$, $c_{n+2}$, ...) or lesser ($c_{n-1}$, $c_{n-2}$, ...) than from the pre-selected channel frequency $c_n$. The RFID transceiver 200 will continue to cycle through the various adjacent channels ($c_{n-1}$, $c_{n-2}$, $c_{n+1}$, $c_{n+2}$) if no Rx_in signal 124 having the pre-selected channel frequency $c_n$ is detected.

In the scenario where the local oscillator frequency is set to either $c_{n+1}$ (i.e. the offset frequency immediately greater than the pre-selected channel frequency $c_n$) the RFID transceiver 200 will be able to detect the pre-selected channel frequency $c_n$, as the pre-selected channel frequency $c_n$ is only offset by about 200 kHz from the local oscillator frequency $c_{n+1}$. The local oscillator frequency of the RFID transceiver 200 will then be set to $c_{n-1}$ (i.e. the offset frequency immediately less than the pre-selected channel frequency $c_n$) to verify that the RFID transceiver 200 still detects the pre-selected channel frequency $c_n$. Subsequently, the local oscillator frequency of the RFID transceiver 200 will be set to the pre-selected channel frequency $c_n$.

The second test mode setting has the local oscillator frequency set to an offset frequency of the pre-selected channel center frequency $c_n$, for example, 100 kHz. At the same time, the transmitter path 204 is transmitting a 100 kHz clock signal 116 from the base band. With SSB modulation, the transmitted Tx_out signal 126 will contain the pre-selected channel center frequency $c_n$. Along the receiver path 202, the down converted signal (i.e. the signal emitted from the I-Mixer 212i and the Q-Mixer 212q will have a 100 kHz frequency, which is detectable by the RFID transceiver 200. The local oscillator frequency of the RFID transceiver 200 will then be switched to the channel center frequency $c_n$ for normal operation.

Returning to FIG. 2, the RFID transceiver 200 works in half duplex mode. Thus, the DACs 248i and 248q, along with the ADCs 220i and 220q, can share the same interface pins (not shown), making the shared pins bi-directional I/O (input/output) pins. The sharing of pins reduces the pin count by half, and allows for a more compact chip.

III) Dual Loop Synthesizer 206

The dual loop synthesizer 206 generates the desired or predefined frequency, which the RFID transceiver 200 is to be operated at, in the form of in-phase and quadrature-phase (Q) components (through the I-RF 250i and Q-RF 250q signals) for feeding to the transmitter path 204 for modulation, and to the receiver path 202 for down-conversion through the signals I-LO 230i and Q-LO 230q. Further detail on the dual loop synthesizer 206 architecture is provided later with reference to FIG. 7.

IV) SPI Interface/Circuit 208

The RFID transceiver 200 communicates with peripheral devices via the SPI interface 208. The SPI interface 208 provides programmability and control of various aspects of the RFID transceiver 200, such as the transmitter path 204 power; frequency setting of the dual loop synthesizer 206; activation/de-activation of the various components in both the transmitter path 204; and the receiver path 202 to conserve power when needed. The SPI interface 208 allows writing control & configuration data into the RFID transceiver 200 via the micro-controller 104 (FIG. 1). There are 20 shift registers which are used to fulfill different requirements of control conditions. The SPI circuit 208 may be a digital circuit synthesized from Verilog code.

Different RFID systems, built in accordance with embodiments of the invention, are described under the heading "Other RFID system embodiments"

Other RFID System Embodiments

Figure 3:
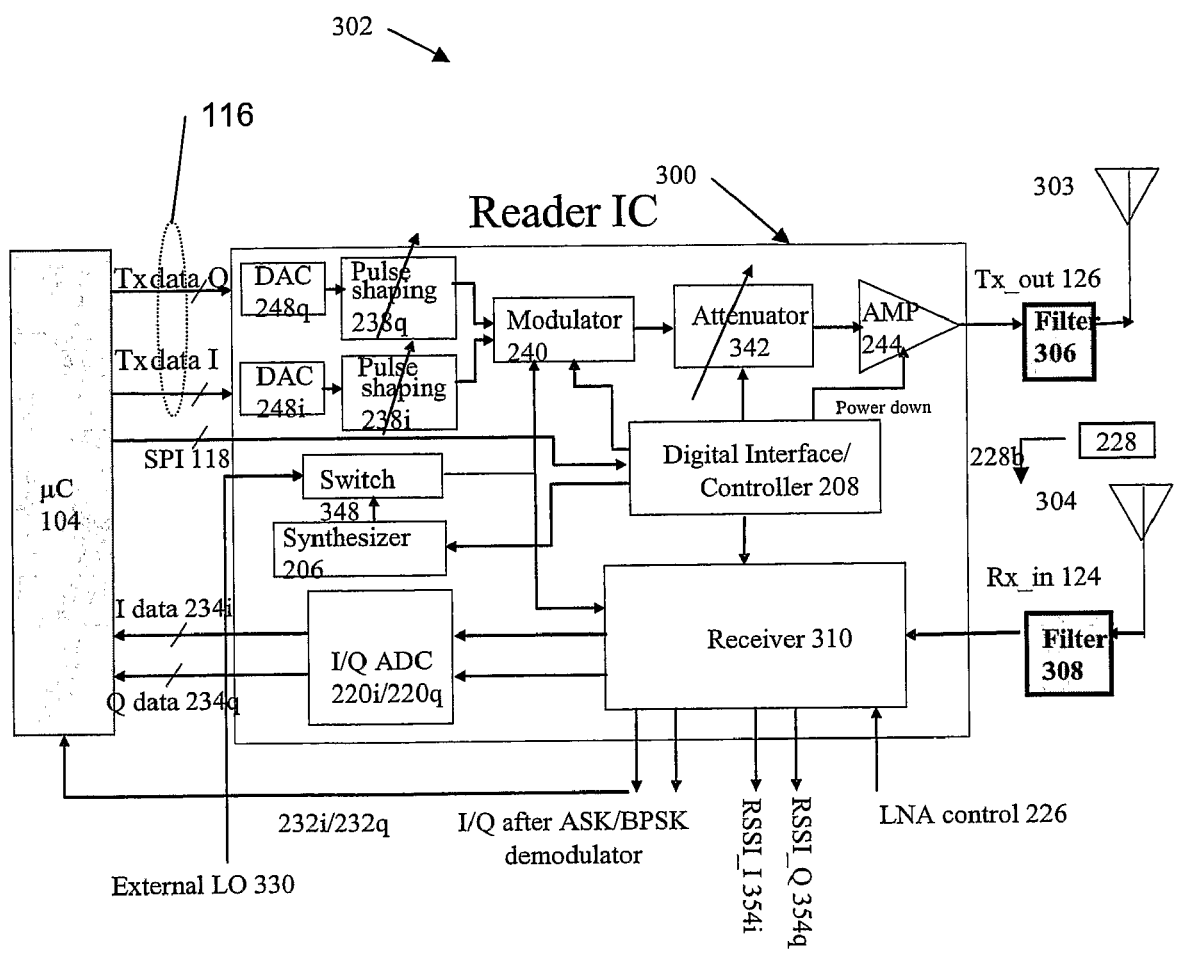
FIG. 3 shows a block level representation of a RFID system built in accordance to an embodiment of the present invention.

FIG. 3 shows a block level representation of a RFID (Radio Frequency Identification) system 302 built in accordance to an embodiment of the present invention.

Similar to the RFID system of FIG. 1, the RFID system 302 includes a RFID transceiver 300 electrically connected with the microcontroller (MCU) 104. However, the RFID transceiver 300 is connected to antennas 303 and 304 via respective filters 306 and 308. The antenna 303 is used to transmit the signals Tx_out 126, while the antenna 304 is used to receive backscatter signals 228b from the RFID tag 228, which is sent to the RFID transceiver 300 via the Rx_in signals 124.

The RFID transceiver 300 has a similar architecture to the RFID transceiver 200 of FIG. 2, thus components having like reference numerals are not further elaborated.

A receiver 310 receives the Rx_in signal 124. It will be appreciated that the receiver 310 serves the same functions as the LNA 210, together with the I-Mixer 212i and the Q-Mixer 212q, i.e. the receiver 310 amplifies the Rx_in signal 124 and subsequently performs down conversion to obtain the in-phase I and the quadrature-phase Q data components from the Rx_in signal 124. Subsequently, the I and Q data components are either digitized by the I/Q ADC 220i/220q to obtain the digitized I data 234i and Q data 234q; or the I and Q data components undergo ASK/BPSK demodulation to obtain the demodulated I-ch data 232i and the Q-ch data 232q.

The receiver 310 also sends received signal strength indicator (RSSI) RSSI_I 354i and RSSI_Q 354q data signals which provide an indication of the strength of the received signal Rx_in signal 124. The RSSI_I 354i and RSSI_Q 354q data signals are used to control the receiver 310 gain via the LNA control signal 226.

The local oscillation frequency of the RFID transceiver 300 can also be controlled externally through an external LO 330 to a switch 348. The switch 348 sends an appropriate signal to the modulator 240 so that the transmitted signal Tx_out data 126 is transmitting at the externally controlled frequency. Further, the switch 348 sends another appropriate signal to the receiver 310 to down convert the received signal Rx_in 124 at the externally controlled frequency.

An attenuator 342 is integrated between the modulator 240 and the PA 244. The attenuator 342 is a passive device that operates independently from the PA 244.

Figure 4:
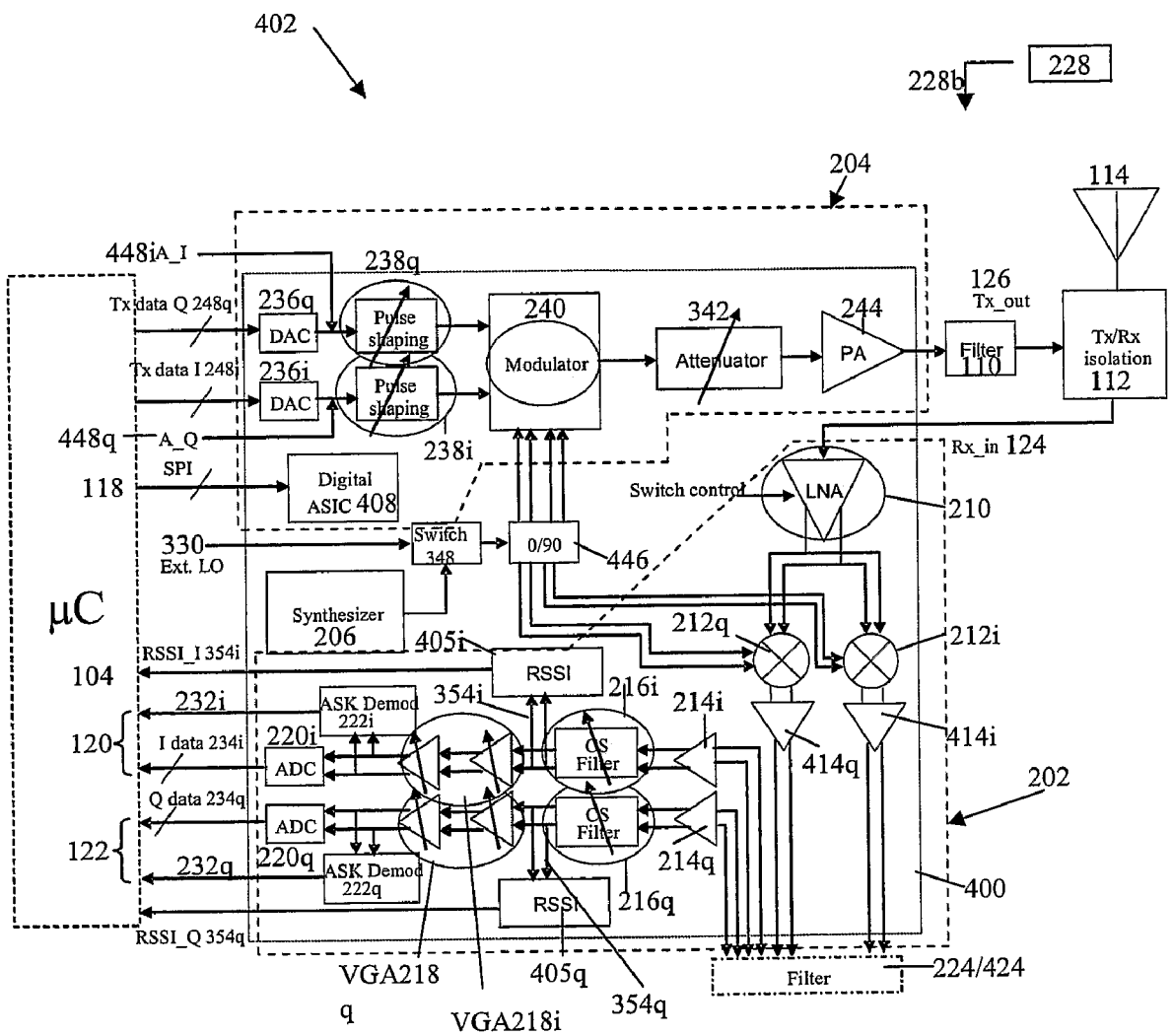
FIG. 4 shows a block level representation of a RFID system built in accordance to an embodiment of the present invention.

FIG. 4 shows a block level representation of a RFID (Radio Frequency Identification) system 402 built in accordance to an embodiment of the present invention.

The RFID system 402 includes a RFID transceiver 400 electrically connected with the microcontroller (MCU) 104, the transmitter/receiver (Tx/Rx) isolation unit 112 and the filter 110. The filter 110 is also connected with the Tx/Rx isolation unit 112. The antenna 114 is coupled to the Tx/Rx isolation unit 112 to transmit signals (Tx_out) 126 from the RFID transceiver 400 and to send the received signals Rx_in 124 to the RFID transceiver 400.

The RFID transceiver 400 has a similar architecture to the RFID transceiver 300 of FIG. 3, thus components having like reference numerals are not further elaborated.

The LNA 210 receives the Rx_in signal 124. The amplified Rx_in signal 124 will be down-converted in the I-Mixer 212$i$ and the Q-Mixer 212$q$, where the I phase and the Q phase data components from the Rx_in signal 124 are subsequently amplified by respective amplifiers 414$i$ and 414$q$ and then passed through a filter 424. A pair of capacitors, such as the capacitors 224 of FIG. 2 may be used for the filter 424. The output from the VGA 218$i$ and the VGA 218$q$ are either digitized by the ADCs 220$i$ and 220$q$ to obtain the digitized I data 234$i$ and Q data 234$q$; or undergo ASK demodulation in the respective ASK demodulators 222$i$ and 222$q$ to obtain the demodulated I-ch data 232$i$ and the Q-ch data 232$q$. Collectively, the outputs 234$i$ and 232$i$ form the Rx_data I 120 (also refer FIG. 1); while the outputs 234$q$ and 232$q$ form the Rx_data Q 122 (also refer FIG. 1).

Received signal strength indicator (RSSI) circuits 405$i$ and 405$q$ detect the strength of the signal, which is emitted from the I and the Q CSF 216$i$ and 216$q$, realized in logarithmic form. Both RSSIs 405$i$ and 405$q$ produce respective RSSI 354$i$ and RSSI_Q 354$q$ data signals, where both the RSSI_I 354$i$ and the RSSI_Q 354$q$ data signals are sent to the microcontroller 104, whereupon the microcontroller 104 will change the VGAs 218$i$ and 218$q$ gains to improve the dynamic receive range. Successive detection architecture is adopted for realizing the logarithmic amplifier. It is composed of five stages of limiting amplifier combined with a full-wave rectifier and low pass filter. The limiting amplifier design is the same as the fixed gain amplifier used in VGA.

The in-phase (I) and the quadrature-phase (Q) data components can also be sent, in the form of analog signals A_I 448$i$ and A_Q 448$q$, to the transmitter path 204. The analog signals A_I 448$i$ and A_Q 448$q$ are sent directly to their respective pulse shaping filters I-PSF 238$i$ and Q-PSF 238$q$ as A_I 448$i$ and A_Q 448$q$ are already in a form suitable for processing by the pulse shaping filters I-PSF 238$i$ and Q-PSF 238$q$.

The RFID transceiver 400 also includes a 0/90 signal generator 446, which generates LO signals in 0 degree phase and 90 degree phase.

A digital application specific integrated circuit (ASIC) 408 provides a monitor and control interface to the RFID transceiver 400. It will be appreciated that the ASIC 408 is analogous to the SPI 208 of FIG. 2, thus the ASIC 408 is not further elaborated. An external base-band (not shown) controls the RFID transceiver by having the microcontroller 104 send control signals SPI 118 to the ASIC 408. The base band is able to control the RFID transceiver 400 to operate in various modes (e.g.: to perform DSB-ASK, PR-ASK or SSB-ASK modulation) or to debug the various components in the RFID transceiver 400. It will be appreciated that to save power, the receiver path 202 and the transmitter path 204 may each be independently switched on/off. Further to save power in the talk mode, the receiver path 202 may be switched on only when the tag 228 starts to send backscatter signals 228$b$.

Figure 5:
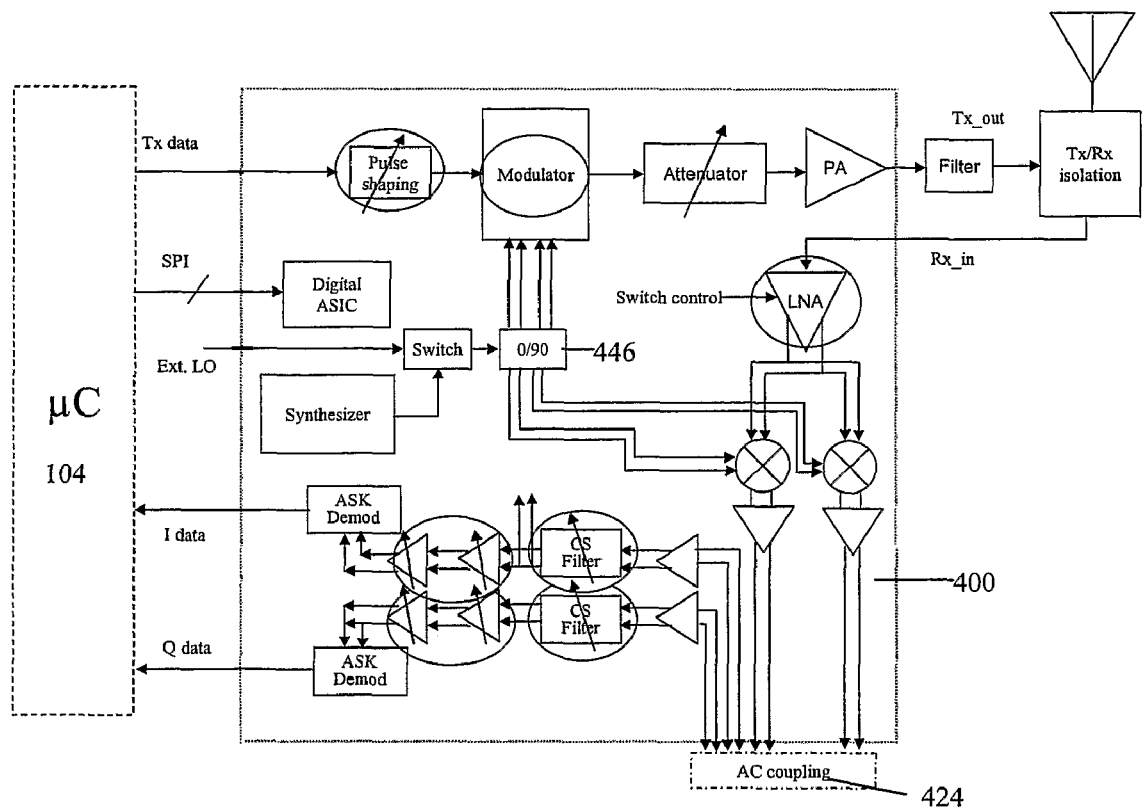
FIGS. 5 and 6 show block level representations of RFID systems used under different operating conditions.
Figure 6:
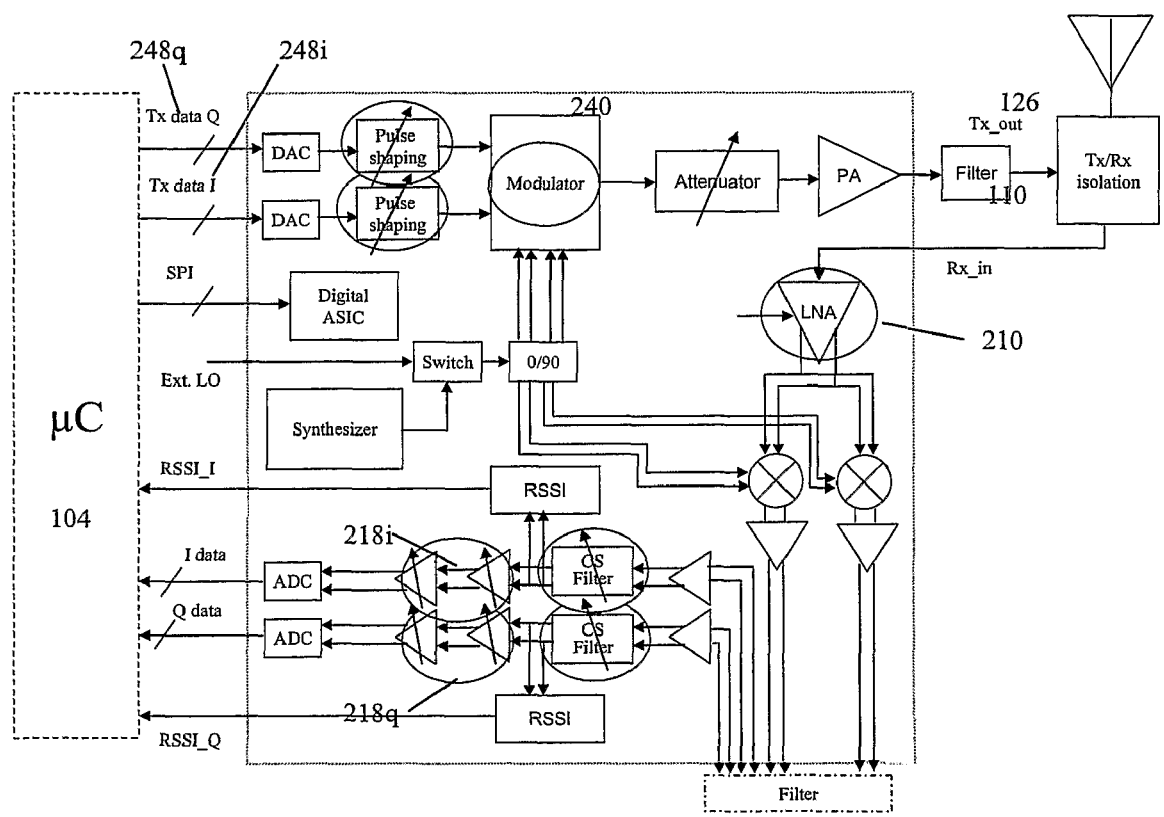

FIGS. 5 and 6 show block level representations of the RFID (Radio Frequency Identification) system of FIG. 4, when the RFID system 402 is used under different operating conditions.

In FIG. 5, the RFID system 402 is used for low-end applications which use low cost microcontrollers running at low MHz clock frequencies, wherein the DACs 236$q$ and 236$i$ (FIG. 4); the ADCs 220$i$ and 220$q$ (FIG. 4); and the RSSI circuits 405$i$ and 405$q$ are not used. Powering down the DACs 236$q$ and 236$i$; the ADCs 220$i$ and 220$q$; and the RSSI circuits 405$i$ and 405$q$ reduces the power consumed by the RFID transceiver 400. Further, as demodulation, performed by the ASK demodulators 222, is within the RFID transceiver 400, a simpler microcontroller 104, such as a 8 bit microcontroller. A capacitor (not shown) may be used for the external filter 424 to achieve AC coupling.

In FIG. 6, the RFID system 402 is used for high-end applications for example long range fix readers, which make use of DSP for: i) base-band data processing; ii) digital filtering at the filter 110 of the transmitted signal Tx_out 126; iii) I/Q data generation 248$i$ and 248$q$ for both single sideband ASK modulation and phase-reversed ASK modulation in the modulator 240; iv) modulation depth control in the modulator 240; and v) noise filtering in the LNA 210 for receiver to improve sensitivity. The DSP circuitry is located in the microcontroller 104 and base band data processing is performed in the microcontroller 104 In FIG. 6, the RSSI circuits 405$i$ and 405$q$ may be used to control the VGAs 218$i$ and 218$q$ gains to improve dynamic receive range. A high pass filter (not shown) or a resonant tank circuit (not shown) may be used for the external filter 424 for dense reader mode.

The various components of the Dual-loop synthesizer 206 (see FIGS. 2 to 6) are now described under the heading "Dual-loop synthesizer 206"

III) Dual-Loop Synthesizer 206

Figure 7:
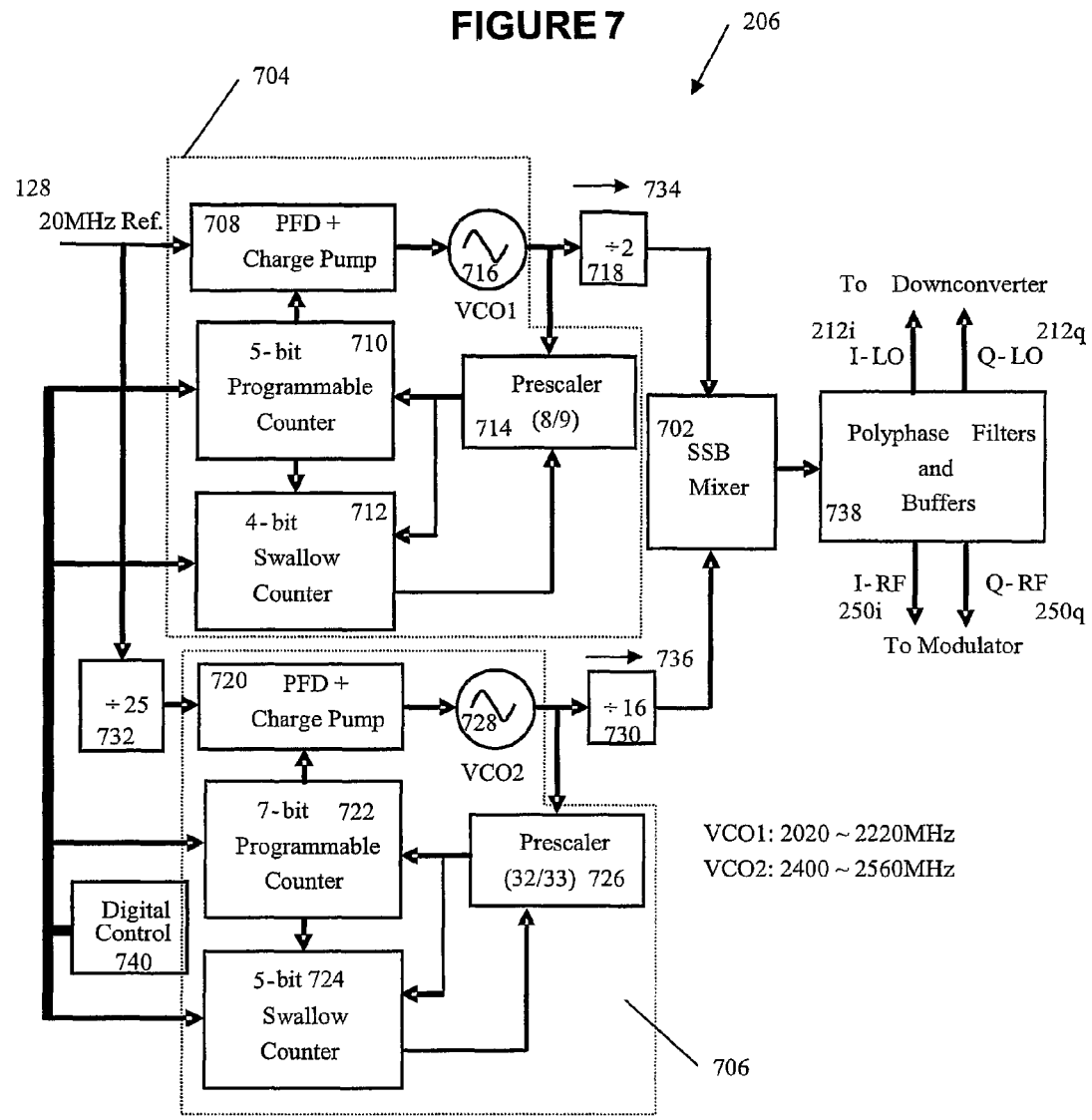
FIG. 7 shows a block level representation of the architecture of a dual-loop phase locked loop (PLL) synthesizer of a RFID transceiver built in accordance to an embodiment of the present invention.

FIG. 7 shows a block level representation of the architecture of the dual loop PLL 206 of a RFID transceiver (see FIGS. 2-6) built in accordance to an embodiment of the present invention.

The operation of the PLL 206 is controlled digitally through the SPI 208 (FIG. 2). The PLL 206 ensures that the RFID transceiver (see FIGS. 2-6) is able to operate with sufficient sensitivity and in spectrum masks complying with, for example, either the FCC (Federal Communications Commission) or the ETSI (European Telecommunications Standards Institute) standards in the UHF frequency range from about 860 MHz to about 960 MHz, which is the RFID band used in most parts of the world. The PLL 206 achieves phase-noise with frequency resolution of about 50 kHz for the band from about 860 MHz to about 960 MHz.

The PLL synthesizer 206 uses a dual-loop architecture that includes two integer-N synthesizers 704 and 706, and one single-sideband (SSB) mixer 702. The synthesizer 704 includes a phase frequency detector (PFD) and charge pump 708, a 5-bit programmable counter 710, a 4-bit swallow counter 712, a prescaler-8/9 714, a voltage-control oscillator (VCO1) 716 and uses the clock signal 128 (compare FIG. 1) from the crystal oscillator 106 (FIG. 1) as a reference, to achieve lower in-band phase-noise. In the embodiment shown in FIG. 7, the crystal oscillator 106 operates at 20 MHz. The output frequency $f_{VCO1}$ from the VCO1 716 can be obtained as follows:

$$f_{VCO1} = (8 \times P_1 + S_1) \times 20 \text{ MHz}$$

where P1 and S1 are the values of the programmable counter 710 and the swallow counter 712 respectively. The frequency range for the synthesizer 704 is from about 2060 MHz to about 2260 MHz.

The synthesizer 706 includes a PFD and charge pump 720, a 7-bit programmable counter 722, a 5-bit swallow counter 724, a prescaler-32/33 726, a voltage-control oscillator (VCO2) 728, and uses a reference frequency of about 800 KHz. The reference frequency for the synthesizer 706 is derived by dividing the MHz clock signal 128 reference by 25 (see reference numeral 732). Similarly, the output frequency $f_{VCO2}$ from the VCO2 716 can be obtained as follows:

$$f_{VCO2} = (32 \times P_2 + S_2) \times 800 \text{ KHz}$$

where P2 and S2 are the values of the programmable counter 722 and the swallow counter 724 respectively. The frequency range for the synthesizer 706 is from about 2400 MHz to about 2560 MHz.

There are eight selectable VCO bands for the VCO1 716 and the VCO2 728, so that the phase-noise does not change over the frequency range of between about 860 to about 960 MHz.

The synthesizer 704 output signal 734 frequency is divided by 2 (at a frequency divider 718) and the synthesizer 706 output signal 736 frequency is divided by 16 (at a frequency divider 730) before being fed to the SSB mixer 702. The frequency division provides, for the synthesizer 704, phase noise improvement of about 6 dB. Further, as the VCO1 716 can be tuned from about 2020 MHz to about 2220 MHz, frequency division makes available a quadrature-phase frequency of about 1010 MHz to about 1110 MHz for the synthesizer 704. Similarly, the frequency division provides, for the synthesizer 706, phase noise improvement of about 24 dB. Further, as the VCO2 728 can be tuned from about 2400 MHz to about 2560 MHz, frequency division makes available a quadrature-phase frequency of about 150 MHz to about 160 MHz for the synthesizer 706.

The frequency dividers 718 and 730 are based on conventional current-mode logic (CML) which is realized using two high-speed D flip-flops connected back-to-back. The frequency dividers 718 and 730 generate differential quadrature I and Q signals for the single-sideband (SSB) mixer 702.

After mixing the divided outputs 734 and 736 (respectively from the synthesizer 704 and the synthesizer 706) in the SSB mixer, low phase noise and a lower side-band signal from about 860 MHz to about 960 MHz with a frequency resolution of about 50 KHz is obtained, as the SSB mixer 702 is designed to reject upper-sideband frequencies from about 1160 MHz to about 1270 MHz. The higher band frequency signals can be further suppressed by the modulator 240 (FIG. 2) and PA 244 (FIG. 2) as both the modulator 240 and the PA 244 are, in the embodiment shown in FIG. 2, tuned for the frequency band from about 860 MHz to about 960 MHz. Thus the output frequency, $f_{out}$, that can be generated from the SSB mixer 702 is based on the following equation:

$$f_{out} = \frac{f_{vco1}}{2} - \frac{f_{vco2}}{16}$$

3-stage polyphase filters and buffers 738 provide the filtered and buffered differential I and Q signals, I-LO 212*i*, Q-LO 212*q*, I-RF 250*i* and I-RF 250*q*, where I-RF 250*i* and I-RF 250*q* are fed to the modulator 240 (FIG. 2), while I-LO 212*i* and Q-LO 212*q* are respectively fed to the I-Mixer 212*i* and the Q-Mixer 212*q*.

A true single-phase clock (TSPC) prescaler-8/9 is used for synthesizer 704. The prescaler consists of a divide-by-4/5 synchronous counter and a divide-by-2 asynchronous counter, in combination with 5-bit programmable counter and 4-bit swallow counter. For Synthesizer-II prescaler-32/33, a conventional 7-bit programmable counter and a conventional 5-bit swallow counter are used.

Turning to the two LC-tank VCO1 716 and VCO2 728, since the PLL synthesizer 206 covers a wider bandwidth, it is desirable to use complementary NMOS and PMOS transistors to realize the VCO1 716 and the VCO2 728, so as to get a more linear tuning curve (see FIG. 9) and thus achieve consistent performance over the operating frequency band of from about 860 MHz to about 960 MHz.

III)a) Voltage Controlled Oscillator 716

Figure 8:
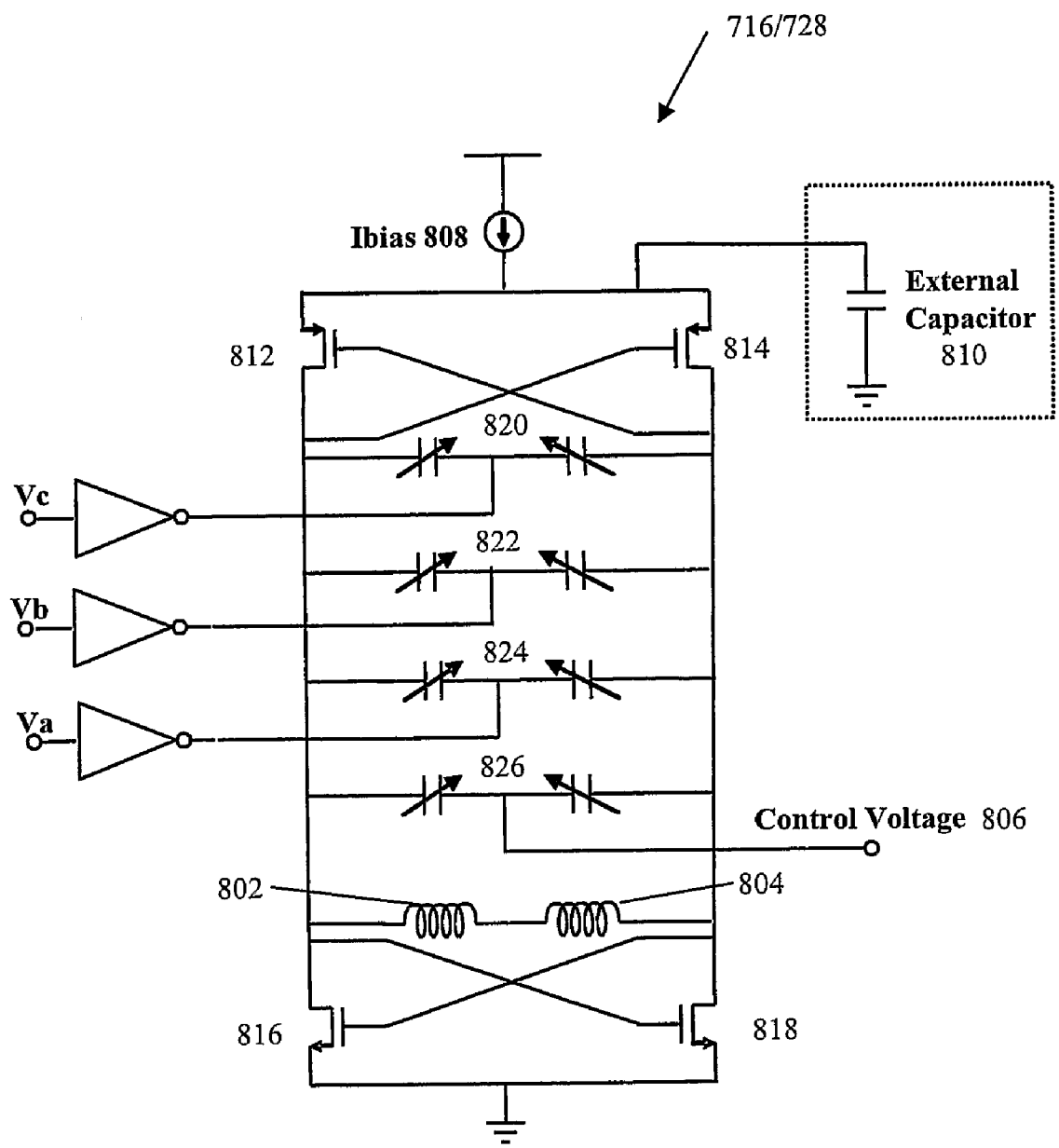
FIG. 8 shows a schematic diagram of circuitry used to implement voltage-controlled oscillators used in a PLL synthesizer of an RFID transceiver built in accordance with an embodiment of the invention.

FIG. 8 shows a schematic diagram of circuitry that can be used to implement the voltage-controlled oscillator VCO1 716 (FIG. 7) and the voltage-controlled oscillator VCO2 728 (FIG. 7) both used in the PLL sythesizer 206 of an RFID transceiver (see FIGS. 2-6) built in accordance with an embodiment of the invention.

The VCO 716/728 includes four transistors, namely two PMOS transistors 812 and 814 and two NMOS transistors 816 and 818. Two inductors 802 and 804, connected in series, are further connected between the drain terminal 816$_D$ of the NMOS transistor 816 and the drain terminal 818$_D$ of the NMOS transistor 818. The quality factor (Q value) of the inductors 802 and 804, for the embodiment shown in FIG. 8, is about 5. The gate terminal 816$_G$ of the NMOS transistor 816 is connected to the drain terminal 818$_D$ of the transistor 818 while the gate terminal 818$_G$ of the NMOS transistor 818 is connected to the drain terminal 816$_D$ of the NMOS transistor 816. A series of voltage tunable capacitors or varactors, namely 824, 822, 820 and 826 are connected between the respective drain terminals 816$_D$ and 812$_D$ of NMOS transistor 816 and PMOS transistor 812. The same tuneable capacitors or varactors 824, 822, 820 and 826 are also connected between the respective drain terminals 818$_D$ and 814$_D$ of NMOS transistor 818 and PMOS transistor 814. Each varactor is controlled by a respective input voltage signal, where input voltage signals Va, Vb, Vc and a control voltage 806 respectively control varactors 824, 822, 820 and 826. The input signal voltages Va, Vb and Vc are respectively connected to the varactors 824, 822 and 820 via an inverter. A biasing current source Ibias 808 is connected to the respective source terminals 812$_S$ and 814*s* of the PMOS transistors 812 and 814. The source terminals 812$_S$ and 814$_S$ are also connected to a ground potential via an external capacitor 810.

To get low phase-noise, the biasing current Ibias 808 is about 12 mA. The external capacitor 810 is connected to current source Ibias 808 to bypass flicker noise.

Varactors 824, 822 and 820 are binary-coded accumulation-mode MOS varactors, each having a 2 value capacitance, namely a bigger value or a smaller value. The control voltage 806, which is emitted from the PLL 206 (FIG. 2), sets the chosen frequency. Input signal voltages Va, Vb and Vc act as digital control voltages that change the VCO 716/728 bands, thereby changing the VCO1 716 (FIG. 7) operating band and the VCO2 728 (FIG. 7) operating band. The accumulator-mode MOS varactors 824, 822 and 820 are also used for frequency tuning, and allow for a tuning sensitivity of 80 MHz/V to be obtainable for VCO1 716 (FIG. 7). The input voltages, Va, Vb and Vc, in conjunction with (and explained later with reference to FIG. 9) the varactors 824, 822 and 820, allow for the VCO1 716 (FIG. 7) to have eight frequency bands (see FIG. 9), each band being selected by applying appropriate voltage logic for Va, Vb and Vc.

Similarly, the VCO 716/728 allows for the VCO2 728 (FIG. 7) to have four bands, and a tuning sensitivity smaller than 150 MHz/V. For VCO2 728, only 2 mA bias current is used.

Spiral inductors used in CMOS IC design suffer from dissipative mechanisms beyond simple conductor loss. One way to improve the phase noise is to improve the quality factor Q of the inductors 802 and 804 used. Another way to obtain good phase-noise, is to reduce the tuning sensitivity, which can be done by using multiple-bands for the VCO 716/728.

It has been found that between VCO1 716 and VCO2 728 (FIG. 7), VCO1 has a greater contribution to the phase noise of the output signal from the SSB mixer 702 (FIG. 7). Thus, emphasis is placed on reducing the tuning sensitivity of the VCO1.

Figure 9:
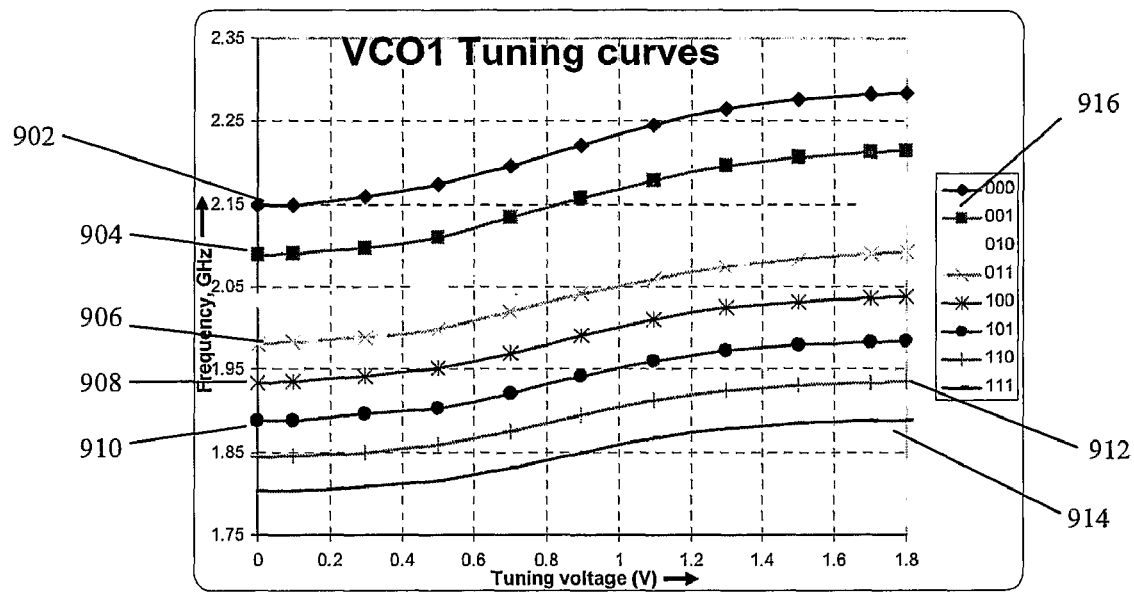
FIG. 9 shows tuning curves for all eight bands of an 8-band voltage-controlled oscillator used in a RFID transceiver built in accordance with an embodiment of the invention.

FIG. 9 shows tuning curves 902, 905, 906, 908, 910, 912, 914 and 918 for all eight bands of an 8-band voltage-controlled oscillator VCO1 used in a RFID transceiver (see FIGS. 2-6) built in accordance with an embodiment of the invention.

A corresponding one of the eight bands of the VCO1 716 (FIG. 7) will be selected for each respective logic sequence 916 for Va, Vb and Vc. For instance, when Va=0, Vb=0 and Vc=0, the tuning curve 902 will be obtained as the tuning voltage is varied from 0 to 1.8V.

III)b) Phase Frequency Detector (Pfd) and Charge Pump 708

Figure 10:
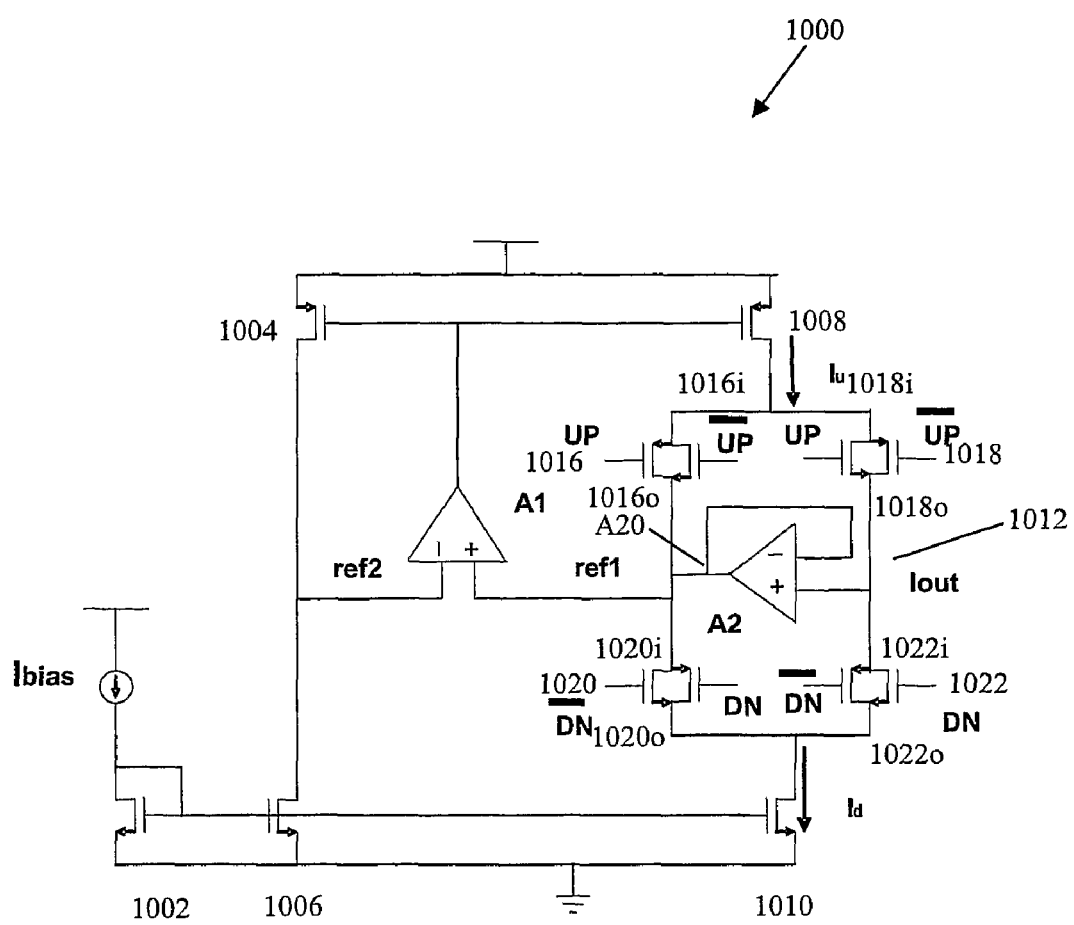
FIG. 10 shows a schematic diagram of a charge-pump circuit of a phase frequency detector (PFD) and a charge pump block used in a PLL synthesizer of an RFID transceiver built in accordance with an embodiment of the invention.

FIG. 10 shows a schematic diagram of a charge-pump circuit 1000 of the phase frequency detector (PFD) and charge pump 708 block used in the PLL sythesizer 206 of an RFID transceiver (see FIGS. 2-6) built in accordance with an embodiment of the invention.

The charge pump circuit 1000 includes a plurality of transistors, namely three NMOS transistors, 1002, 1006 and 1010 and two PMOS transistors, 1004 and 1008. The charge pump circuit 1000 further includes an amplifier A1 and a block 1012.

The source terminals of the NMOS transistors 1002, 1006 and 1010 respectively are connected to a ground potential. A biasing current source Ibias 1014 supplies current to the gate terminals of the NMOS transistors 1002, 1006 and 1010. The drain terminal and the gate terminal of the NMOS transistor 1002 are connected. The drain terminals of the NMOS transistor 1006 and the PMOS transistors 1004 are connected to an inverting terminal A1 of the amplifier A1. The drain terminal of the NMOS transistor 1010 is connected to the block 1012. The output from the block 1012 is connected to the non-inverting terminal A1 of the amplifier A1. The output terminal of the amplifier A1 is connected to the gate terminals of the PMOS transistors 1004 and 1008. The source terminals of the PMOS transistors 1004 and 1008 are connected to a reference potential. The drain terminal of the PMOS transistor 1008 is connected to the block 1012.

The block 1012 includes an amplifier A2 and four complementary switches or transmission gates 1016, 1018, 1020 and 1022. Each transmission gate 1016, 1018, 1020 and 1022 is a parallel combination of an NMOS transistor coupled to a PMOS transistor with the input at the gate terminal of either the NMOS or the PMOS transistors being complementary to the input at the gate terminal of the other transistor. Taking the transmission gate 1018 as an example, the input at the NMOS transistor is UP, while the input at the PMOS transistor is $\overline{\text{UP}}$. Similarly, and taking the transmission gate 1020 as an example, the input at the NMOS transistor is $\overline{\text{DN}}$, while the input at the PMOS transistor is DN.

Each of the transmission gates 1016, 1018, 1020 and 1022 has a respective input (1016$i$, 1018$i$, 1020$i$ and 1022$i$) and a respective output (1016$o$, 1018$o$, 1020$o$ and 1022$o$). The input terminals 1016$i$ and 1018$i$ of the transmission gates 1016 and 1018 are both connected to the drain terminal of the PMOS transistor 1008. The output terminal 1016$o$ of the transmission gate 1016 is connected to the input terminal 1020$i$ of the transmission gate 1020. The output terminal 1018$o$ of the transmission gate 1018 is connected to the input terminal 1022$i$ of the transmission gate 1022. The output terminal 1016$o$ of the transmission gate 1016 and the input terminal 1020$i$ of the transmission gate 1020 are connected to the output terminal A2$o$ of the amplifier A2. The output 1018$o$ of the transmission gate 1018 and the input terminal 1022$i$ of the transmission gate 1022 are connected to the non-inverting terminal A2$_+$ of the amplifier A2. The inverting terminal A2. of the amplifier A2 is connected to the output terminal A2$o$ of the amplifier A2. The output terminals 1020$o$ and 1022$o$ of the transmission gates 1020 and 1022 are both connected to the drain terminal of the NMOS transistor 1010.

A current can flow through the transmission gates 1016, 1018, 1020 and 1022 in either direction, i.e from the respective inputs 1016$i$, 1018$i$, 1020$i$ and 1022$i$ of the transmission gates 1016, 1018, 1020 and 1022 to the respective outputs 1016$o$, 1018$o$, 1020$o$ and 1022$o$ of the transmission gates 1016, 1018, 1020 and 1022; and similarly from the respective outputs 1016$o$, 1018$o$, 1020$o$ and 1022$o$ of the transmission gates 1016, 1018, 1020 and 1022 of the transmission gates 1016, 1018, 1020 and 1022 to the respective inputs 1016$i$, 1018$i$, 1020$i$ and 1022$i$. Depending on whether there is a voltage on the gate terminals of the transmission gates 1016, 1018, 1020 and 1022, the connection between the respective inputs 1016$i$, 1018$i$, 1020$i$ and 1022$i$ and the respective outputs 1016$o$, 1018$o$, 1020$o$ and 1022$o$ of the transmission gates 1016, 1018, 1020 and 1022 is either low-resistance or high-resistance, respectively. The operation of any of the transmission gates 1016, 1018, 1020 and 1022 is as such: when the gate input to the NMOS transistor is '0', a complementary '1' will be input to the PMOS transistor gate, thereby turning off both transistors. However when the gate input to the NMOS is '1', a complementary '0' will be input to the PMOS transistor gate, thereby both transistors are turned on and passes any signal '1' or '0' equally well without degradation. The use of the transmission gates 1016, 1018, 1020 and 1022 reduces undesirable threshold voltage effects which give rise to loss of logic levels in pass transistors.

III)c) SSB Mixer 702

Figure 11:
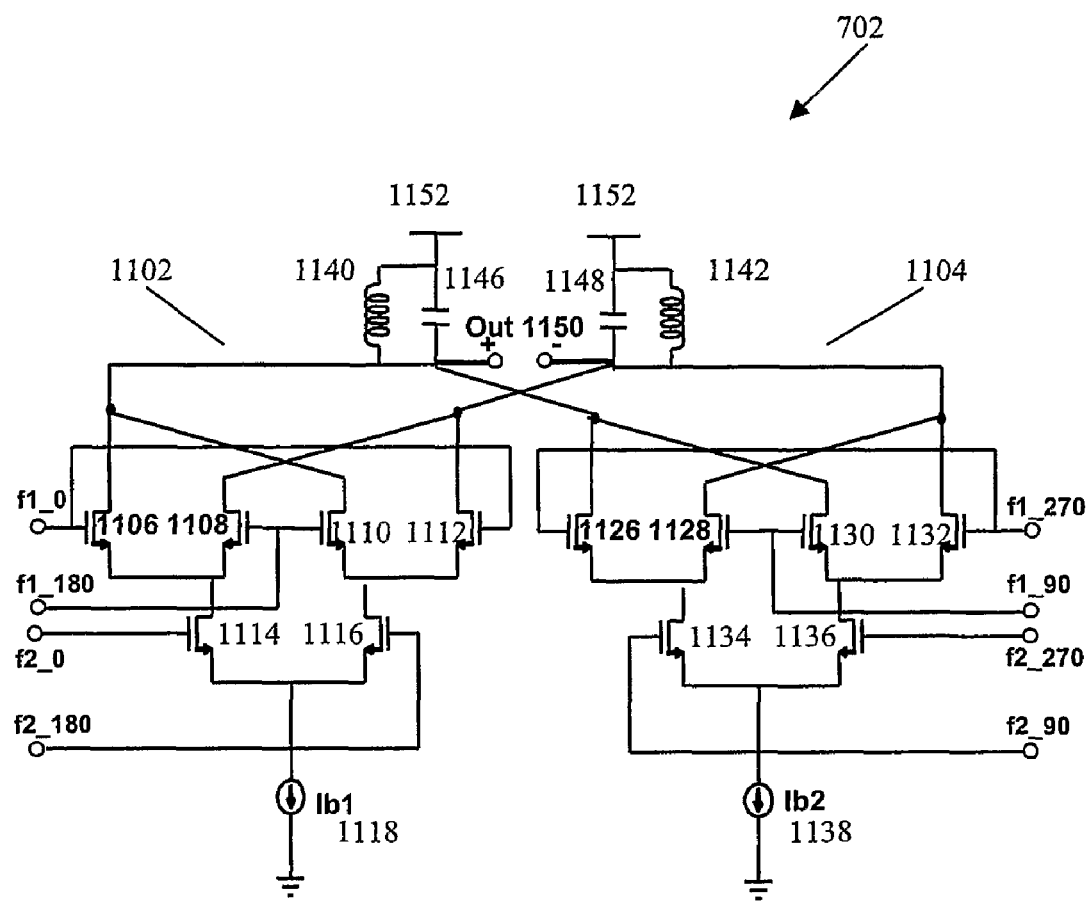
FIG. 11 shows a schematic diagram of a single sideband (SSB) mixer in a PLL synthesizer of an RFID transceiver built in accordance with an embodiment of the invention.

FIG. 11 shows a schematic diagram of the single sideband (SSB) mixer 702 used in the PLL sythesizer 206 of an RFID transceiver (see FIGS. 2-6) built in accordance with an embodiment of the invention.

The SSB mixer 702 includes two Gilbert-cell mixers 1102 and 1104.

The Gilbert-cell mixer 1102 includes a plurality of NMOS transistors 1106, 1108, 1110, 1112, 1114 and 1116; an inductor 1140; a capacitor 1146 and a current source Ib1 1118.

Similarly, the Gilbert-cell mixer 1104 includes a plurality of NMOS transistors 1126, 1128, 1130, 1132, 1134 and 1136; an inductor 1142; a capacitor 1148 and a current source Ib2 1138.

The drain terminals of the transistors 1106, 1110, 1126 and 1130 are connected together to form an Out$_+$ terminal of the SSB mixer 702. The drain terminals of the transistors 1108, 1112, 1128 and 1132 are connected together to form an Out terminal of the SSB mixer 702. Collectively, the Out$_+$ terminal and the Out terminal form the output 1150 of the SSB mixer 702, where the outputs from both the mixers 1104 and 1106 are either added or subtracted from each other.

One terminal of the capacitor 1146 is connected to the Out$_+$ terminal, while the other terminal of the capacitor 1146 is connected to a reference voltage 1152. The inductor 1140 is connected in parallel with the capacitor 1146. Similarly, one terminal of the capacitor 1148 is connected to the Out terminal, while the other terminal of the capacitor 1148 is connected to a reference voltage 1152. The inductor 1142 is connected in parallel with the capacitor 1148.

Turning to the Gilbert-cell mixer 1102, the gate terminals of the transistors 1108 and 1110 are connected together. The source terminals of the transistors 1106 and 1108 are both connected to the drain terminal of the transistor 1114. The source terminals of the transistors 1110 and 1112 are both connected to the drain terminal of the transistor 1116. The source terminals of the transistors 1114 and 1116 are both connected to Ib1 1118.

Similarly, in the Gilbert-cell mixer 1104, the gate terminals of the transistors 1128 and 1130 are connected together. The source terminals of the transistors 1126 and 1128 are both connected to the drain terminal of the transistor 1134. The source terminals of the transistors 1130 and 1132 are both connected to the drain terminal of the transistor 1136. The source terminals of the transistors 1134 and 1136 are both connected to Ib2 1138.

The I and Q signals from the frequency divider 718 (FIG. 7), which have frequencies from about 1010 to about 1110 MHz, act as local oscillator input in the form of f1_0, f1_90, f1_180 and f1_270 signals. The f1_0 signal is sent to both the gate terminals of the transistors 1106 and 1112, while the f1_90 signal is sent to both the gate terminals of the transistors 1128 and 1130. The f1_180 signal is sent to both the gate terminals of the transistors 1108 and 1110, while the f1_270 signal is sent to both the gate terminals of the transistors 1126 and 1132.

The other I and Q signals from the frequency divider 730 (FIG. 7), which have frequencies from about 150 to about 160 MHz are in the form of f2_0, f2_90, f2_180 and f2_270 signals. The f2_0 signal is sent to the gate terminal of the transistor 1114, while the f2_90 signal is sent to the gate terminal of the transistor 1134. The f2_180 signal is sent to the gate terminal of the transistor 1116, while the f1_270 signal is sent to the gate terminal of the transistor 1136. Care is taken in layout to reduce amplitude and phase mismatches.

Figure 12:
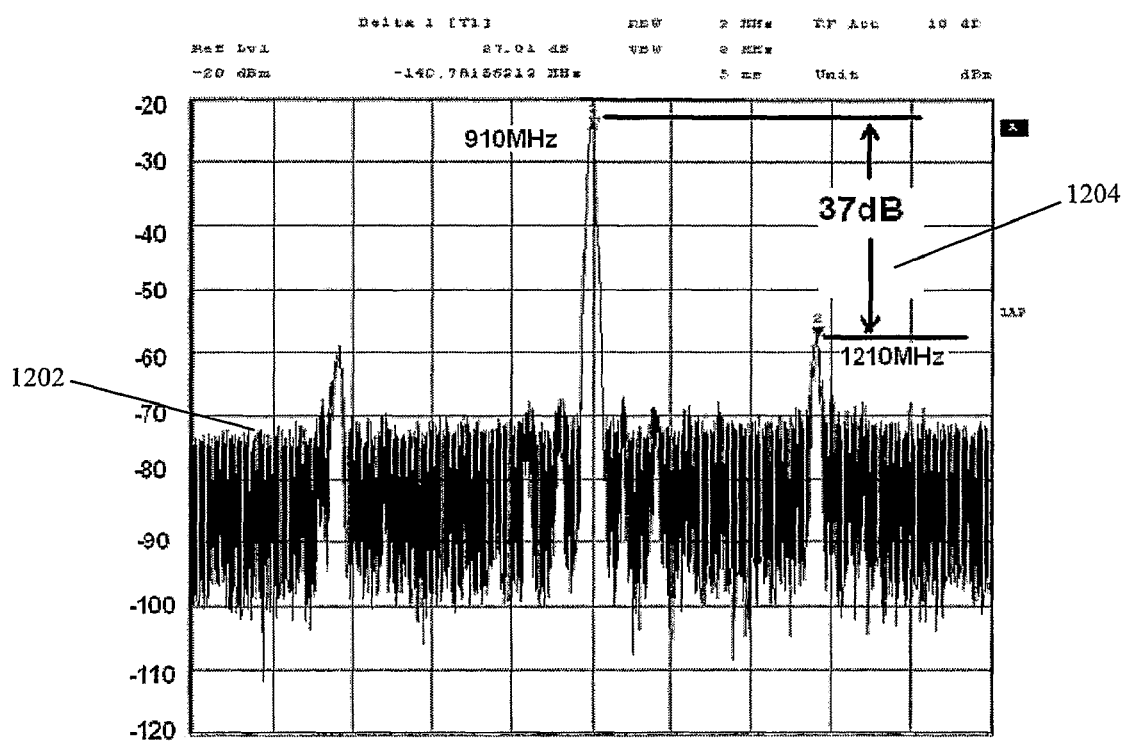
FIG. 12 illustrates image rejection of a SSB mixer.

Lower sideband signals of frequency from about 860 to about 960 MHz are generated at the output 1150 of the SSB mixer 702. Suppressed upper-sideband signals are also generated at the output. Referring to FIG. 12, the upper-sideband signal 1202 may be suppressed 1204 by more than 35 dB. FIG. 12 illustrates image rejection of the SSB mixer 702 (FIG. 7).

Further detail on the other components of the RFID transceiver (see FIGS. 2-6) are provided in the preceding paragraphs.

I) Receiver Path 202

Figure 13A:
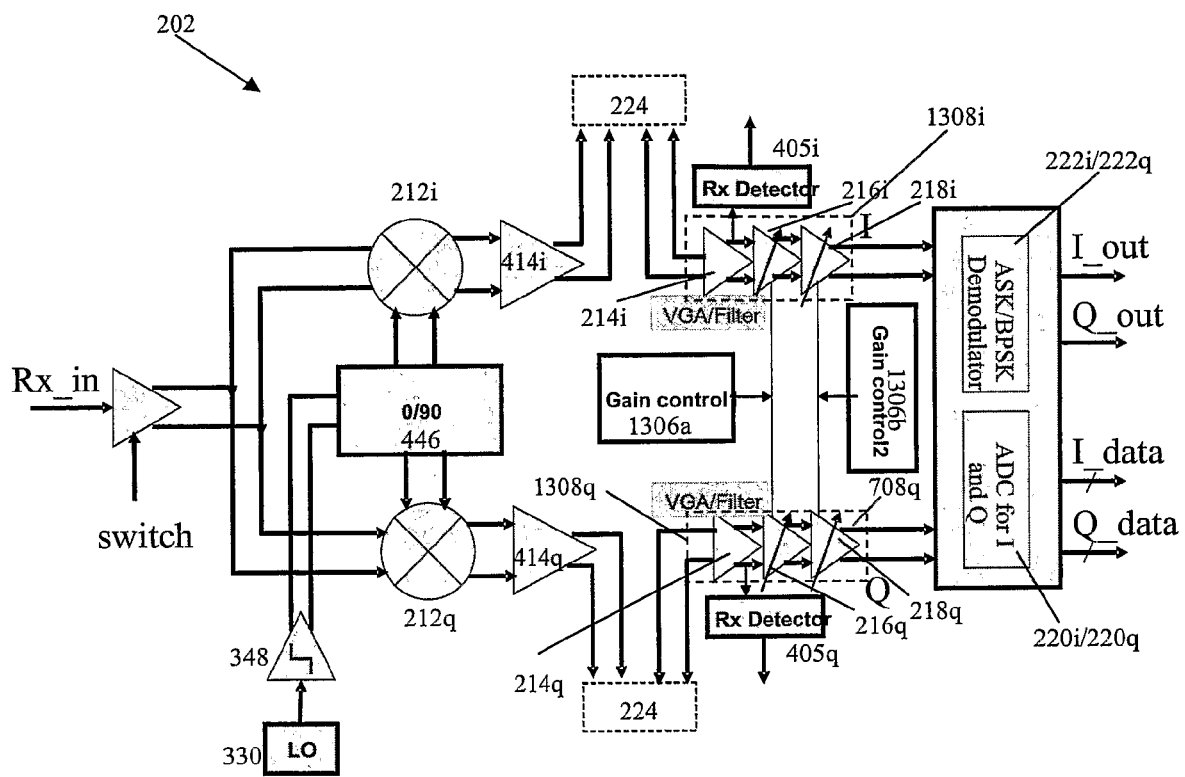
FIG. 13A shows a block level representation of the architecture of a receiver path of a RFID transceiver built in accordance to an embodiment of the present invention.

FIG. 13A shows a block level representation of the architecture of the receiver path 202 of a RFID transceiver (see FIGS. 2-6) built in accordance to an embodiment of the present invention.

The receiver path 202 includes two stage gain control. The first stage is controlled from gain control 1 unit 1306a and the second stage is controlled from gain control 2 unit 1306b. The gain control units 1306a and 1306b generate digital control signals to VGA/Filter 214 from the digital ASIC 408.

Figure 13B:
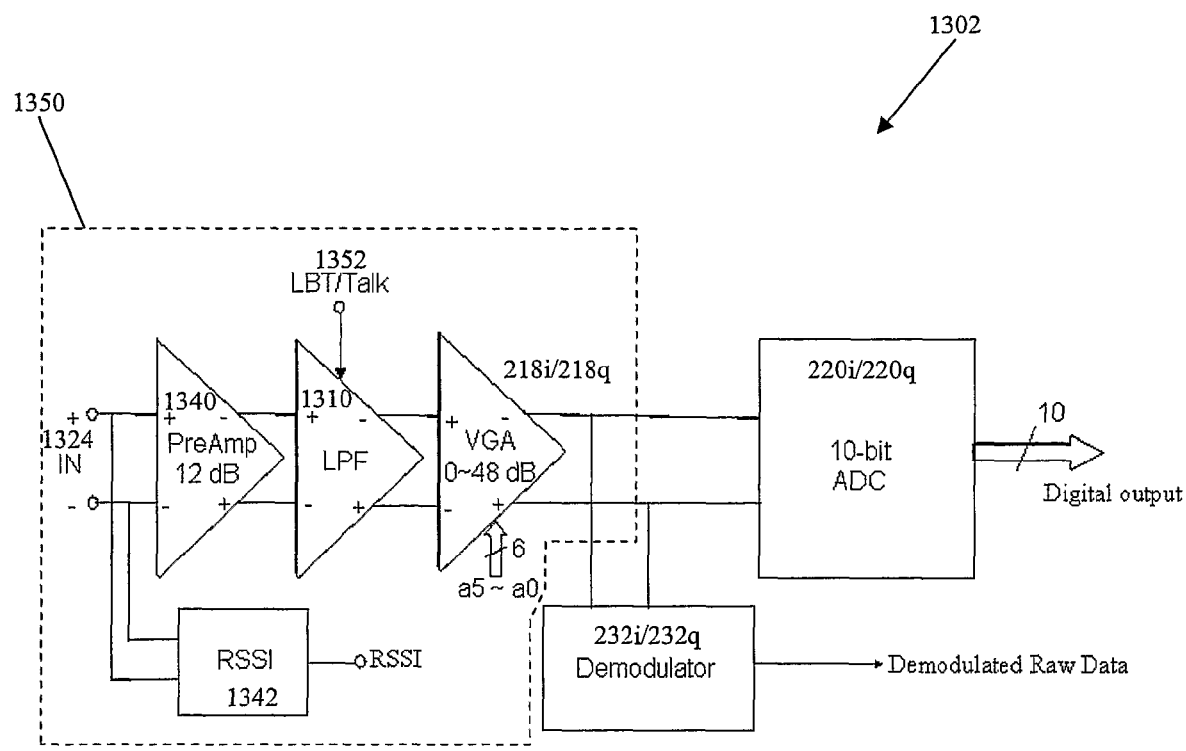
FIG. 13B shows a block level representation of another architecture of a receiver path of a RFID transceiver built in accordance to an embodiment of the present invention.

FIG. 13B shows a block level representation of another architecture of a receiver path 1302 of a RFID transceiver (see FIGS. 2-6) built in accordance to an embodiment of the present invention.

The receiver path 1302 shown in FIG. 13B uses components, such as the demodulator 232i/232q and the 10-bit ADC 220i/220q and the VGA 218i/218q shown in FIG. 2, thus like reference numerals are not further elaborated.

A VGA/Filter block 1350 provides about 12 dB of gain through a preamplifier 1340. The pre-amplifier 1340 receives an input signal 1324 and sends the amplified signal to a low pass filter (LPF) 1310. The LPF 1310 is controlled by a listen before talk (LBT) signal 1352. A received signal strength indicator (RSSI) circuit 1342 monitors for the presence of the input signal 124. The output of the RSSI_I 342 then determines whether the VGA/Filter block 1350 gain is to be set lower or higher.

Figure 13C:
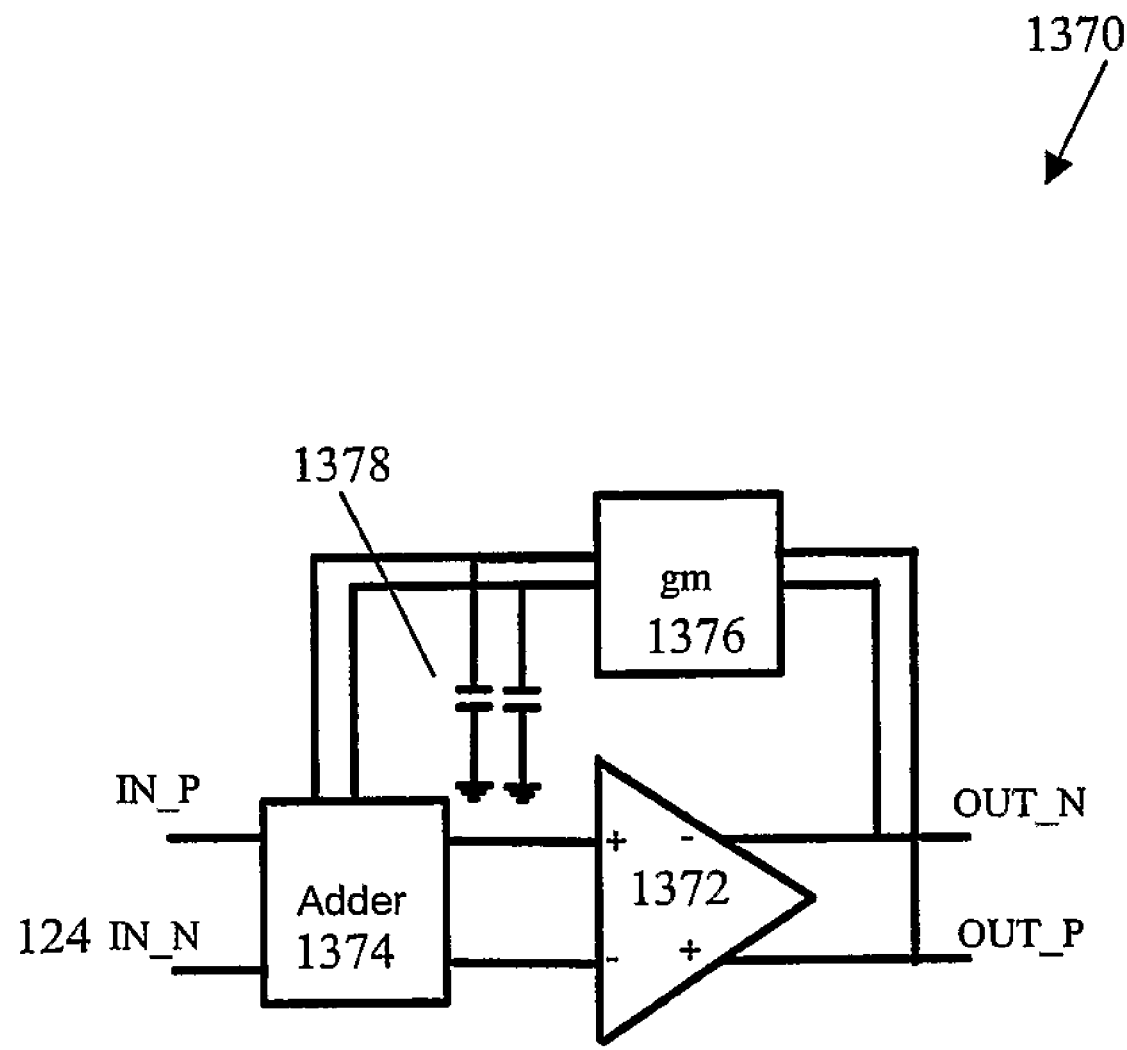
FIG. 13C shows a block level representation of a preamplifier stage of a RFID transceiver built in accordance to an embodiment of the present invention.

FIG. 13C shows a block level representation of a preamplifier stage 1370 of a RFID transceiver (see FIGS. 2-6) built in accordance to an embodiment of the present invention. It will be appreciated that the preamplifier 1340 employed in FIG. 13B, can be replaced with the preamplifier stage 1370 arrangement of FIG. 13C.

The preamplifier stage 1370 includes a fixed gain amplifier 1372, an adder 1374, a gm cell 1376 and capacitors 1378. The fixed gain amplifier provides a 12 dB gain to the input signal 124 to raise the overall gain from 48 dB to 60 dB as well as to improve the noise figure of the RFID transceiver (see FIGS. 2 to 6). To cancel DC offset, the gm cell 1376, along with the capacitors 1278, provide a gm-C filter arrangement that acts as a simple low pass filter that feeds back the output DC offset to the adder 1374 to subtract the DC components in the input signal 124. The gm-C filter provides high gain to the cancellation loop while consuming a small current in the μA range. The fixed gain amplifier 1372 may be designed based on a differential pair arrangement with diode connected loads, as shown in FIG. 8.

I)a) Receiver Path Front End

Figure 14:
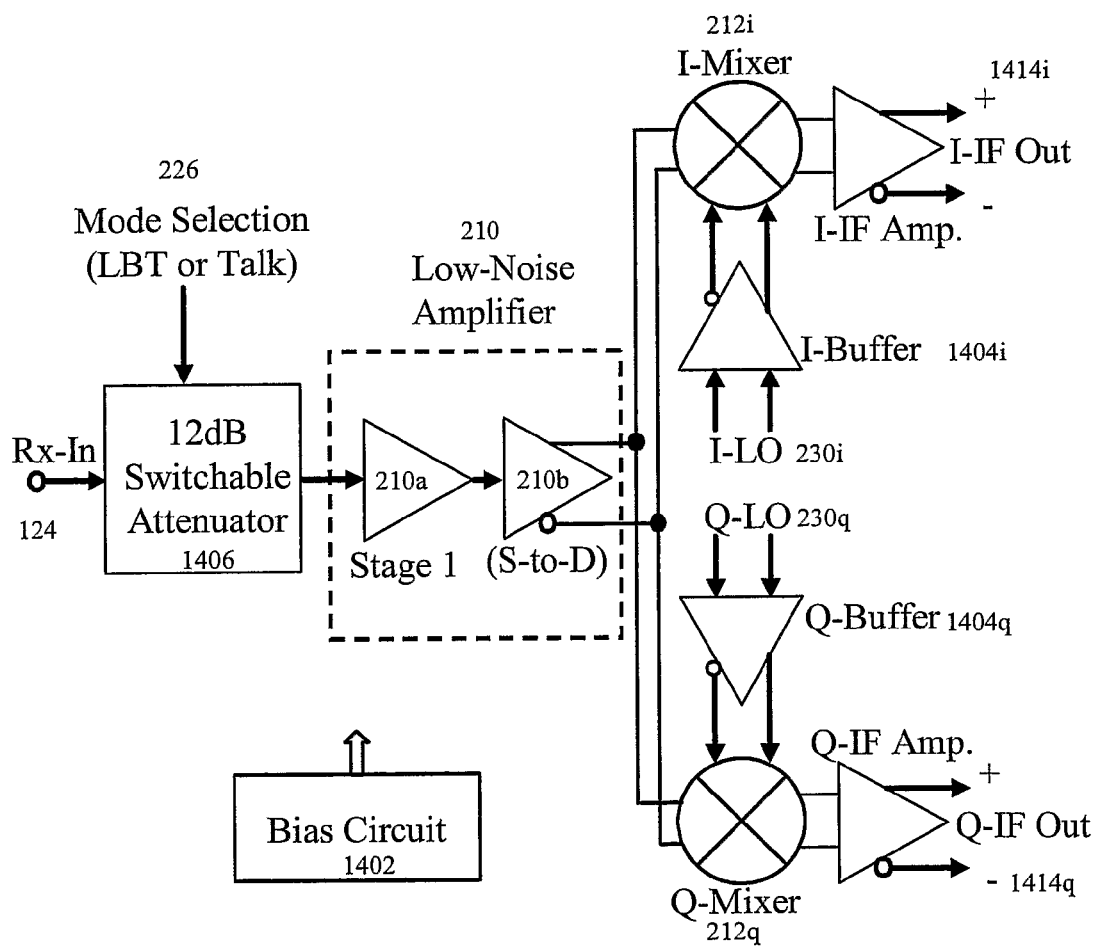
FIG. 14 shows a block level representation of the architecture of a receiver path front-end of a RFID transceiver built in accordance to an embodiment of the present invention.

FIG. 14 shows a block level representation of the architecture of a receiver path front-end 1400 of a RFID transceiver (see FIGS. 2-6) built in accordance to an embodiment of the present invention.

The signals I-LO 230i and Q-LO 230q, which are both from the PLL 206 (FIG. 2), pass through an I-Buffer 1404i and a Q-Buffer 1404q respectively before the data signals I-LO 230i and Q-LO 230q are sent to the I-Mixer 212i and the Q-Mixer 212q. The I-Mixer 212i and the Q-Mixer 212q outputs are coupled to I-IF amplifier 1414i and a Q-IF amplifier 1414q inputs respectively. The receiver path front-end 1400 also includes a bias circuit 1402.

The bias circuit 1402 provides a current that is proportional to absolute temperature (PTAT) current and bias voltages to the receiver path front-end 1400. The IF buffer at the output of the passive mixers is designed to be linear. The I-IF amplifier 1414i and the Q-IF amplifier 1414q act as IF buffers whose outputs are ac-coupled to the inputs of the I-Amp 214i (FIG. 2) and the Q-Amp 214q (FIG. 2), where in this embodiment of the invention, the I-Amp 214i and the Q-Amp 214q both have a gain of about 12 db each.

To achieve a listen-before-talk sensitivity of better than about −96 dBm and talk-mode sensitivity of better than about −85 dBm, a +12 dB switchable attenuator 806 is provided before the LNA 210.

I)a)i) LNA 210

Figure 15:
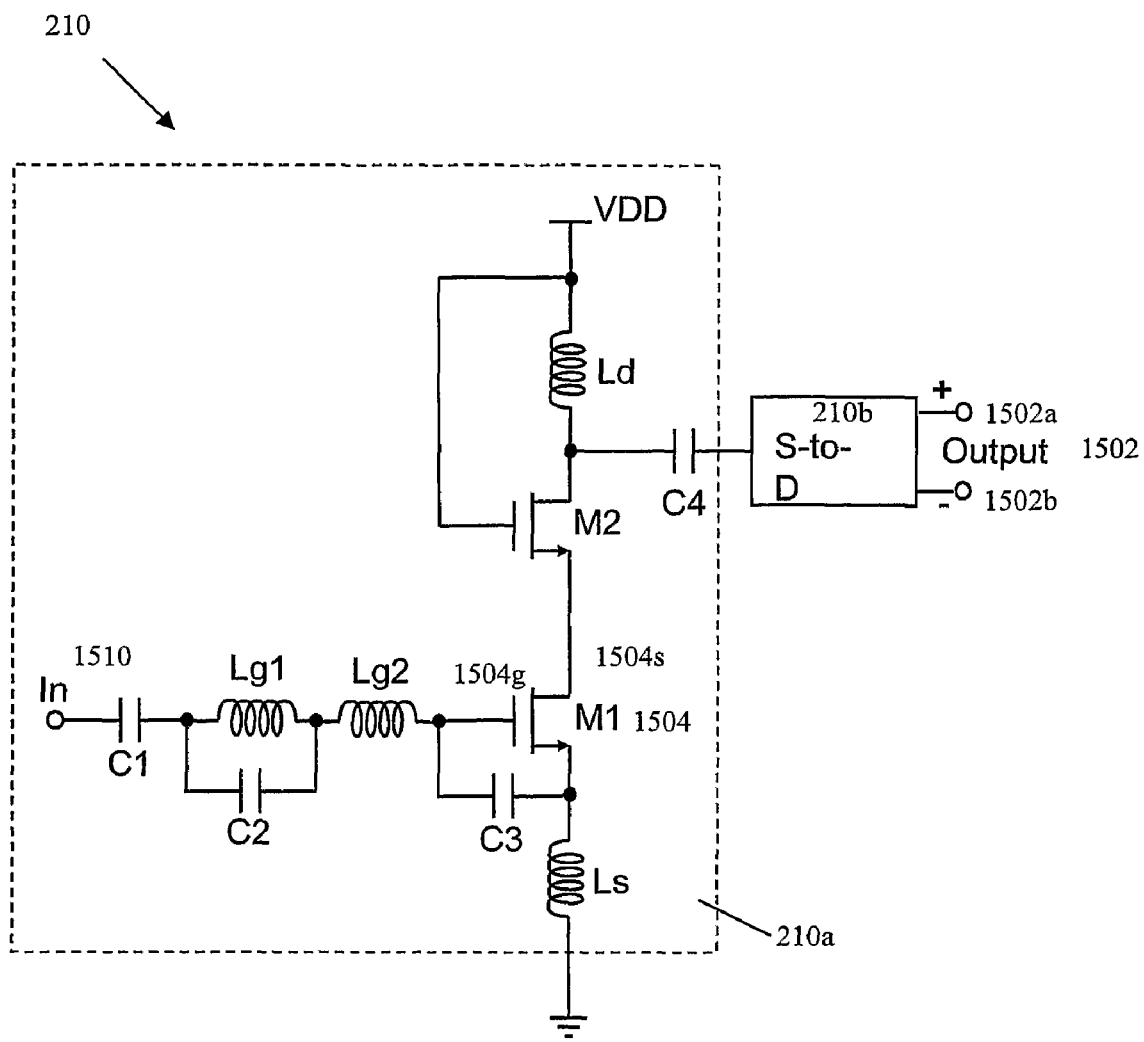
FIG. 15 shows a schematic diagram of a low noise amplifier (LNA) of a RFID transceiver built in accordance to an embodiment of the present invention.

FIG. 15 shows a schematic diagram of the LNA 210 of a RFID transceiver (see FIGS. 2-6) built in accordance to an embodiment of the present invention.

As mentioned above, the LNA 210 can operate in a high gain mode or a low gain mode depending on the different operation modes of the RFID transceiver 200.

The LNA 210 has two stages. The first stage 210a (also see FIG. 8) is a gain stage which uses single-ended cascode topology, while the second stage 210b (also see FIG. 8) is an active single-to-differential (S-to-D) stage which does not provide any gain, but provides differential outputs 1502 which are fed to the double-balanced I and Q channel passive mixers 212i and 212q (FIG. 8) as RF inputs. The first stage 210a of the LNA 210 achieves good isolation between output 1502 and input 1510. The input impedance matching is solved through the use of inductive degeneration in series with the source terminal 1504s of MOSFET (Metal Oxide Semiconductor Field Effect Transistor) 1504; inductors Lg1 and Lg2 in series with the gate 1504g; and a 1 pF capacitor C3 between the gate 1504g and the source 1504s. The inductance required at the input of the cascode stage 210a is about 24 nH, which is realized by putting two inductors Lg1 and Lg2, each rated about 12 nH, in series.

The single-to-differential stage 210b is designed with unity gain, instead of a transformer gain, to keep the overall noise figure of the LNA 210 low. Flicker noise dominates the noise figure of direct-conversion receivers. To minimize such flicker noise, passive mixers are used for the I-Mixer 212i and the Q-Mixer 212q, instead of active mixers. Compared with active mixers, passive mixers achieve better linearity, consume less power and occupy a smaller area.

Figure 16:
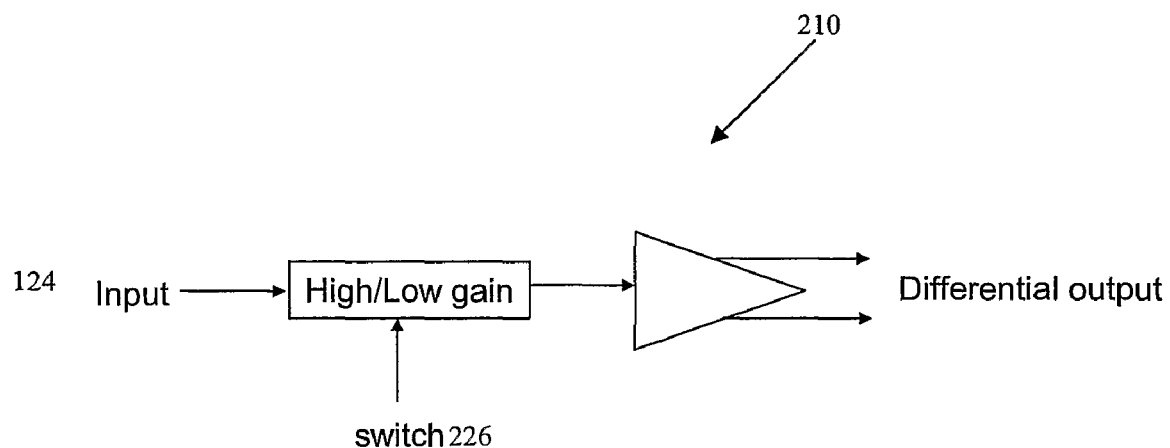
FIG. 16 shows a block level representation of the structure and configuration of a LNA in a receiver path of a RFID transceiver built in accordance to an embodiment of the present invention.

FIG. 16 shows a block level representation of the structure and configuration of the LNA 210 (FIG. 2) in the receiver path 202 (FIG. 2) of a RFID transceiver (see FIGS. 2-6) built in accordance to an embodiment of the present invention.

FIG. 16 also illustrates that, in the default logic level '0' mode, the LNA 210 operates to provide a high gain in the listen mode. When the switch changes to logic level '1', the LNA 210 will operate in talk mode and provide a low gain.

I)a)ii) I-Mixer and Q-Mixer

Figure 17:
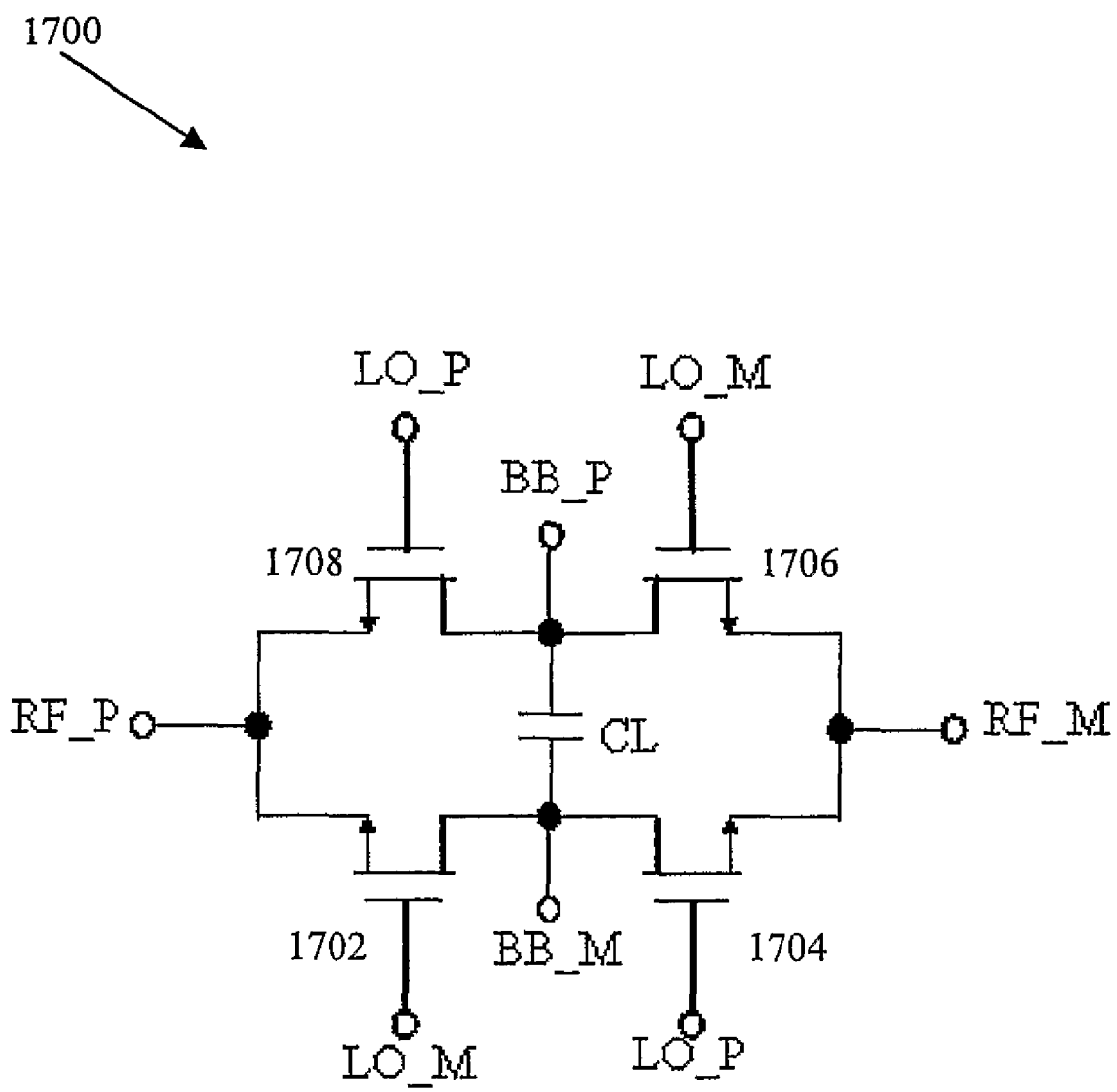
FIG. 17 shows a schematic diagram of a down-conversion mixer, which can be used to realize an in phase mixer (I-Mixer) and a quadrature mixer (Q-Mixer) of a RFID transceiver built in accordance to an embodiment of the present invention.

FIG. 17 shows a schematic diagram of a down-conversion mixer 1700, which can be used to realize the I-Mixer 212i and the Q-Mixer 212q of a RFID transceiver (see FIGS. 2-6) built in accordance to an embodiment of the present invention.

The down conversion mixer 1700 includes four NMOS transistors 1702, 1704, 1706 and 1708; and a capacitor CL.

The source terminals of the transistors 1702 and 1708 are connected together to a RF_P terminal, while the source terminals of the transistors 1704 and 1706 are connected together to a RF_M terminal. The drain terminals of the transistors 1708 and 1706 are connected together to a BB_P terminal, while the drain terminals of the transistors 1702 and 1704 are connected together to a BB_M terminal. The capacitor CL is connected between the BB_P and the BB_M terminal. The gate terminals of the four transistors 1702, 1704, 1706 and 1708 are connected to terminals LO_M, LO_P, LO_P and LO_M respectively. RF_P and RF_M are input terminals, while BB_P and BB_M are base band output signals.

I)b) Channel Select Filter and Variable Gain Amplifier (VGA)

I)b)i) Channel Select Filter (CSF) 216i/216q

FIG. 18A shows a block level representation of the channel select filter (CSF) 216i/216q of a RFID transceiver (see FIGS. 2-6) built in accordance to an embodiment of the present invention. FIG. 18B shows frequency characteristics of the CSF 216i/216q.

From FIG. 18B, it will be observed that the pass-band frequency 1802 of the CSF 216i/216q is tunable to be about 320 kHz or to be about 1.5 MHz. The operating frequency of the CSF 216i/216q. A filter select signal 1806, operating in line with table 1804, determines which pass-band frequency 1802 is selected. At select '0', the filter select signal 1806 configures the CSF 216i/216q to work in the listen mode and at the frequency 320 kHz; while at select 1', the filter select signal 1806 configures the CSF 216i/216q to work in the listen mode and at the frequency 320 kHz.

Figure 19:
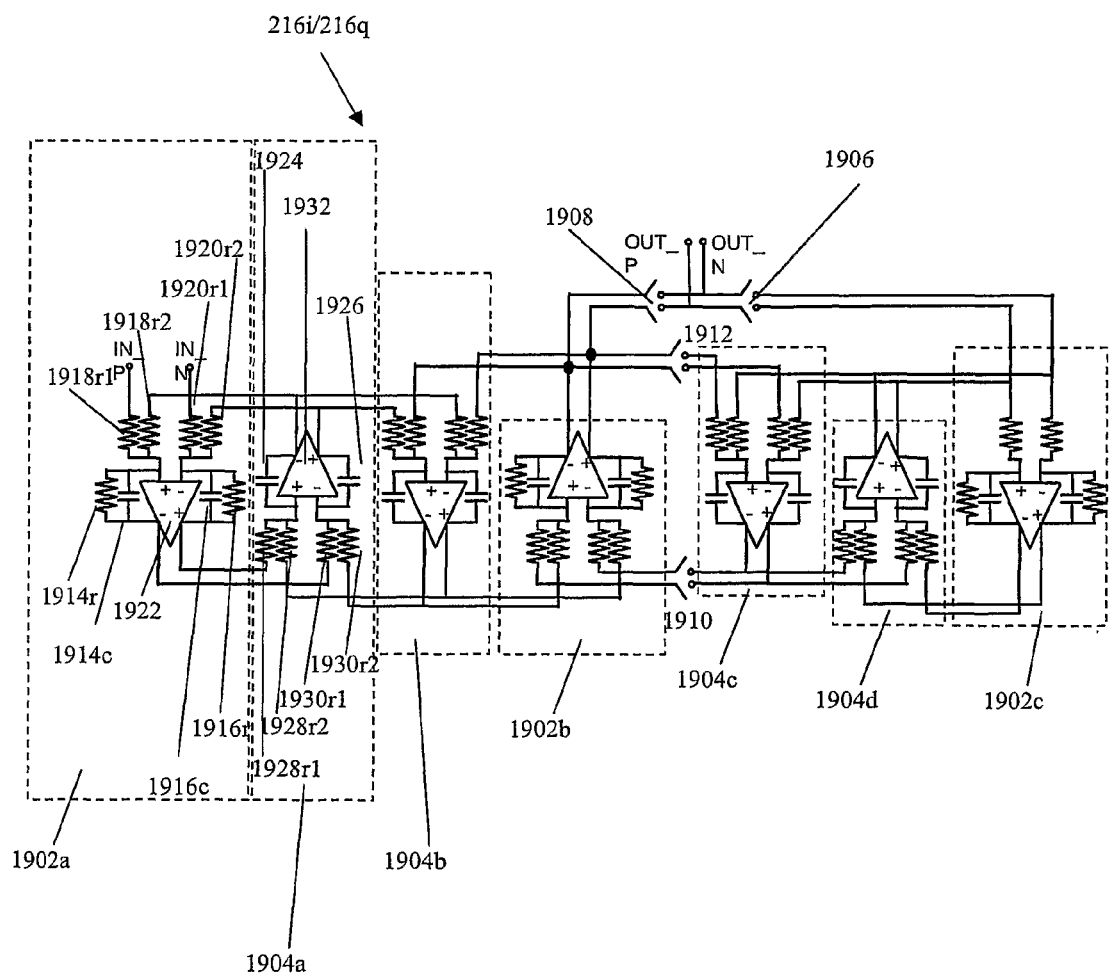
FIG. 19 shows a schematic diagram of a channel select filter (CSF) in a receiver path of a RFID transceiver built in accordance with an embodiment of the invention.

FIG. 19 shows a schematic diagram of the channel select filter (CSF) 216i/216q in the receiver path 202 (FIG. 2) of a RFID transceiver (see FIGS. 2-6) built in accordance with an embodiment of the invention.

To obtain less sensitivity to the inherent variations in the CMOS IC fabrication process, the CSF 216i/216q is a LPF designed using ladder filter architecture with an integrator based approach as shown in FIG. 19.

The CSF 216i/216q includes three first amplifier blocks 1902a, 1902b and 1902c; four second amplifier blocks 1904a, 1904b, 1904c and 1904d; and switches 1906, 1908, 1910 and 1912. Using the first amplifier block 1902a as and example, each first amplifier block (1902a, 1902b and 1902c) includes a first amplifier 1922; resistors 1914r, 1916r, 1918r1, 1918r2, 1920r1 and 1920r2; and capacitors 1914c and 1916c. The resistor 1914r and the capacitor 1914c are connected in parallel between the negative output terminal of the first amplifier 1922 and the non-inverting input of the first amplifier 1922. The resistor 1916r and the capacitor 1916c are connected in parallel between the positive output terminal of the first amplifier 1922 and the inverting input of the first amplifier 1922. One end of the resistors 1918r1 and 1918r2 is each connected in parallel to the non-inverting input of the first amplifier 1922, while the other end of the resistors 1918r1 and 1918r2 is each connected to different terminals, as shown in FIG. 19, within the CSF 216i/216q. For example, the other end of the resistor 1918r1 is connected to the IN_P terminal, while the other end of the resistor 1918r2 is connected to the negative output terminal of the second amplifier of the second amplifier block 1904a and the inverting input of the second amplifier of the second amplifier block 1904b via a respective resistor. One end of the resistors 1920r1 and 1920r2 is each connected in parallel to the non-inverting input of the first amplifier 1922, while the other end of the resistors 1920r1 and 1920r2 is each connected to different terminals as shown in FIG. 19, within the CSF 216i/216q. The positive and the negative outputs of the first amplifier 1922 are connected to different terminals, as shown in FIG. 19, within the CSF 216i/216q.

Using the second amplifier block 1904a as and example, each second amplifier block (1904a, 1904b, 1904c and 1904d) includes a second amplifier 1932; resistors 1928r1, 1928r2, 1930r1 and 1930r2; and capacitors 1924 and 1926. The capacitor 1924 is connected in parallel between the negative output terminal of the second amplifier 1932 and the non-inverting input of the second amplifier 1932. The capacitor 1926 is connected in parallel between the positive output terminal of the second amplifier 1932 and the inverting input of the second amplifier 1932. One end of the resistors 1928r1 and 1928r2 is each connected in parallel to the non-inverting input of the second amplifier 1932, while the other end of the resistors 1928r1 and 1928r2 is each connected to different terminals, as shown in FIG. 19, within the CSF 216i/216q. For example, the other end of the resistor 1928r1 is connected to the positive terminal of the first amplifier 1922, while the other end of the resistor 1928r2 is connected to the positive output terminal of the second amplifier of the second amplifier block 1904b and the inverting input of the first amplifier of the first amplifier block 1902b via a respective resistor. One end of the resistors 1932r1 and 1932r2 is each connected in parallel to the non-inverting input of the second amplifier 1932, while the other end of the resistors 19320 and 1932r2 are connected to different terminals, as shown in FIG. 19, within the CSF 216i/216q. The positive and the negative outputs of the second amplifier 1932 are connected to different terminals, as shown in FIG. 19, within the CSF 216i/216q.

The output of the first amplifier block 1902a is connected to the input of the second amplifier block 1904a, while the input of the first amplifier block 1902a is connected to both the output of the second amplifier block 1904a and the input of the second amplifier block 1904b. The input of the second amplifier block 1904a is also connected to the input of the first amplifier block 1902b and the output of the second amplifier block 1904b. The input of the second amplifier block 1904b is also connected to the switch 1912 and the output of the first amplifier block 1902*b*. The input of the first amplifier block 1902*b* is also connected to the switch 1910, while the output of the second amplifier block 1902*b* is connected to the switch 1908.

The output of the first amplifier block 1902*c* is connected to the input of the second amplifier block 1904*d*, while the input of the first amplifier block 1902*c* is connected to the output of the second amplifier block 1904*d*, the input of the second amplifier block 1904*c*, and the switch 1906. The input of the second amplifier block 1904*d* is also connected to the switch 1910 and the output of the second amplifier block 1904*c*. The input of the second amplifier block 1904*c* is also connected to the switch 1912 and the output of the block second amplifier 1904*d*.

The pole locations of the CSF 216*i*/216*q* are chosen to implement a Chebyshev transfer function with 0.5 dB passband ripple and to provide attenuation at the selected operating frequencies. The order of the filter CSF 216*i*/216*q* can switch between fourth order for 1.53 MHz cutoff frequency and seventh order for 331 kHz cutoff frequency. This serves to adapt to the talk mode (TM) and listen-before-talk (LBT) mode respectively. The CSF 216*i*/216*q* topology is fully differential for good linearity and for good power supply rejection.

I)b)ii) Variable Gain Amplifier (VGA)

Figure 20:
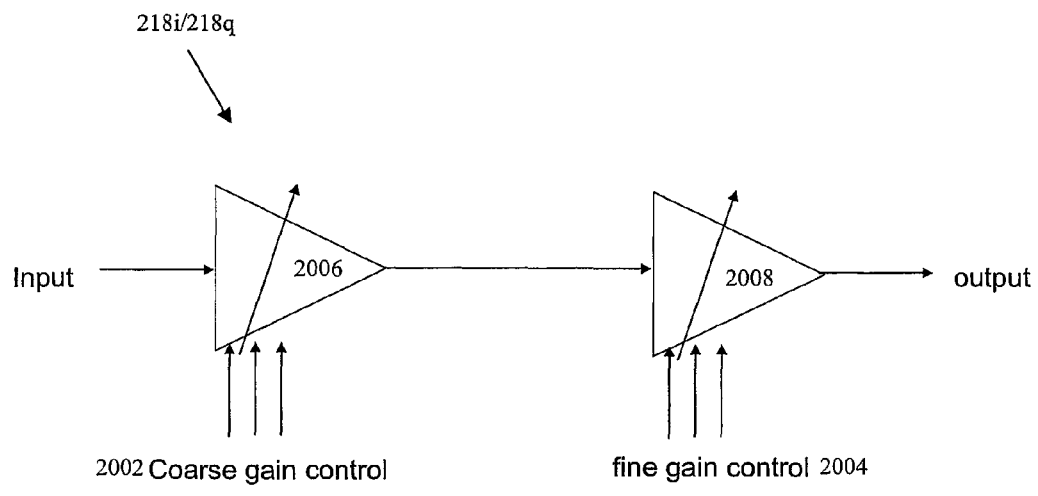
FIG. 20 shows a block level representation of a variable gain amplifier (VGA) in a receiver path of a RFID transceiver built in accordance with an embodiment of the invention.

FIG. 20 shows a block level representation of the variable gain amplifier (VGA) 218*i*/218*q* in the receiver path 202 (FIG. 2) of a RFID transceiver (see FIGS. 2-6) built in accordance with an embodiment of the invention.

The VGA 218*i*/218*q* provides gain varying from 0 dB to 48 dB in 1 dB gain step intervals. The VGA 218*i*/218*q* has a coarse gain stage 2006, which is controlled by a coarse gain control signal 2002 and a fine gain stage 2008, which is controlled by a fine gain control signal 2004. For example, at a logic sequence 2010 of "001", the coarse gain stage 2006 will provide a gain of 8 dB, while at a logic sequence 2012 of "001", the fine gain stage 2006 will provide a gain of 1 dB.

Figure 21:
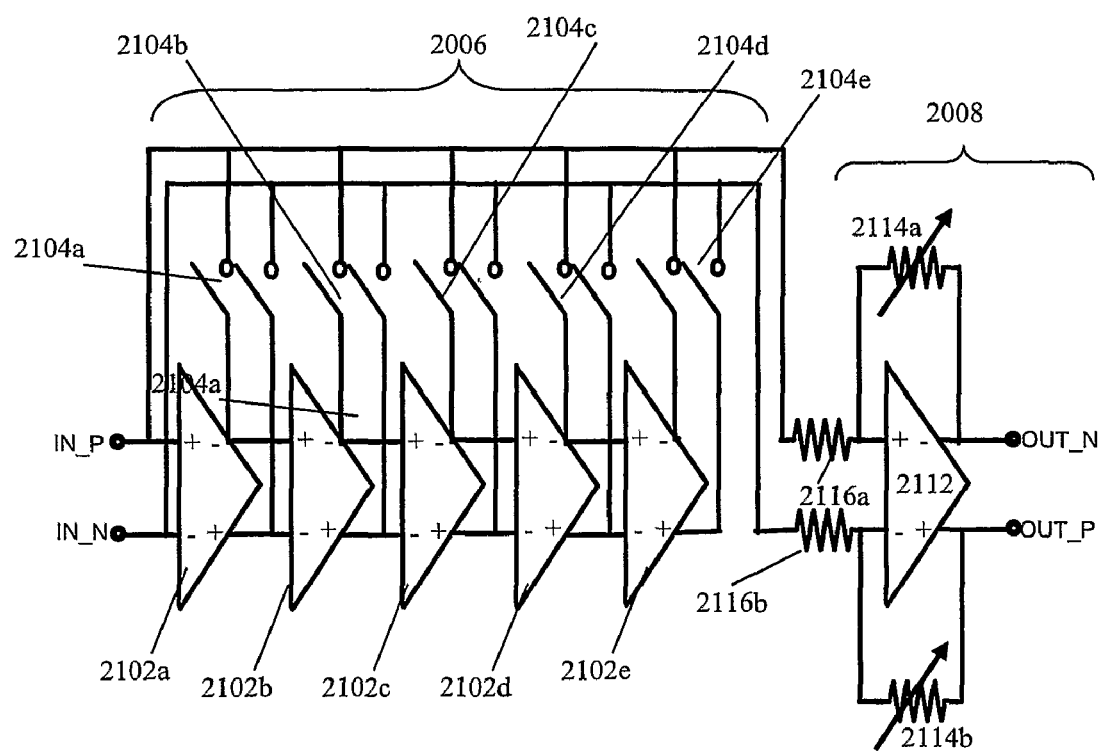
FIG. 21 shows a schematic diagram of a VGA in a receiver path of a RFID transceiver built in accordance with an embodiment of the invention.

FIG. 21 shows a schematic diagram of the variable gain amplifier (VGA) 218*i*/218*q* in the receiver path 202 (FIG. 2) of a RFID transceiver (see FIGS. 2-6) built in accordance with an embodiment of the invention.

The coarse gain stage 2006 consists of five fixed gain amplifiers 2102*a*, 2102*b*, 2102*c*, 2102*d* and 2102*e*, each of them having a respective switch 2104*a*, 2104*b*, 2104*c*, 2104*d* and 2104*e*.

The fine gain stage 2008 is realized by an amplifier 2112 employing variable resistor 2114*a* feedback configuration respectively between the OUT_N terminal of the amplifier 2112 and the non-inverting input terminal of the amplifier 2112. Another variable resistor 2114*b* is connected between the OUT_P terminal of the amplifier 2112 and the inverting input terminal of the amplifier 2112. By controlling the ratio of the feedback resistors 2114*a* and 2114*b* via the fine gain control signal 2004 (see FIG. 20), the gain can be adjusted in 1 dB step over a 8 dB gain range. A Gm-C cell (not shown) and an adder circuit (not shown) are used as the feedback circuit to cancel the DC offset. One end of a resistor 2116*a* is connected to the non-inverting input terminal of the amplifier 2112, while the other end of the resistor 2116*a* is coupled to an IN_P terminal. One end of a resistor 2116*b* is connected to the inverting input terminal of the amplifier 2112, while the other end of the resistor 2116*b* is coupled to an IN_N terminal.

The INP terminal of the VGA 218*i*/218*q* coincides with the non-inverting input of the amplifier 2102*a*, while the input IN_N terminal of the VGA 218*i*/218*q* coincides with the inverting input of the amplifier 2102*a*. The INP terminal is also coupled to the OUT_P terminal of the CSF 216*i*/216*q* (FIG. 19), while the IN_N terminal is also coupled to the OUT_N terminal of the CSF 216*i*/216*q* (FIG. 19). In addition, the IN_P terminal is coupled to the negative output terminals of the amplifiers 2102*a*, 2102*b*, 2102*c*, 2102*d* and 2102*e*, while the IN_N terminal is coupled to the positive output terminals of the amplifiers 2102*a*, 2102*b*, 2102*e*, 2102*d* and 2102*e*. The negative output terminal of the amplifier 2102*a* is connected to the non-inverting input of the amplifier 2102*b*, while the positive output terminal of the amplifier 2102*a* is connected to the inverting input of the amplifier 2102*b*.

It will be appreciated that the amplifiers 2102*b* to 2102*e* are cascaded in a similar fashion as how the amplifier 2102*a* is cascaded with the amplifier 2102*b*, with the exception that the output terminals of the amplifier 2102*e* terminate at the respective switch 2104*e*.

The gain of the coarse gain stage 2006 can be adjusted in steps of 8 dB, over a 40 dB gain range, by the coarse gain control signal 2002 closing the desired switches 2104*a*, 2104*b*, 2104*c*, 2104*d* and 2104*e*, whereby the output from the selected amplifiers 2102*a*, 2102*b*, 2102*c*, 2102*d* and 2102*e* are sent to the fine gain stage 2008 for further amplication, if necessary.

The fixed gain amplifiers 2102*a*, 2102*b*, 2102*c*, 2102*d*, 2102*e* and 2112 may each be a simple source coupled pair arrangement (not shown) with a diode connected load (not shown).

I)c) ASK Demodulator 222

The ASK modulated signal when directly down converted to Zero IF (which means LO signal is at the same frequency of the RF carrier) will be a square wave irrespective of the modulation depth. The amplitude of the square waveform depends on the modulation depth. Since the modulation depth can vary from 10% to 100%, the amplitude for which the demodulator has to work varies from 0.05 V (p-p) to 2 V (p-p). Hence, a high swing comparator (not shown) is used for demodulating the ASK modulated signal. Thus, the ASK demodulator 222 is optimized to work from 10%~100% ASK signals.

I)d) ADCs 220*i*/220*q*

The 10-bit ADCs 220*i*/220*q* use pipe-lined architectures to obtain a analogue to digital conversion rate of around 10 Mps II) Transmitter Path 204

Pulse-Shaping Filter (PSF) 238*i*/238*q*

Figure 22:
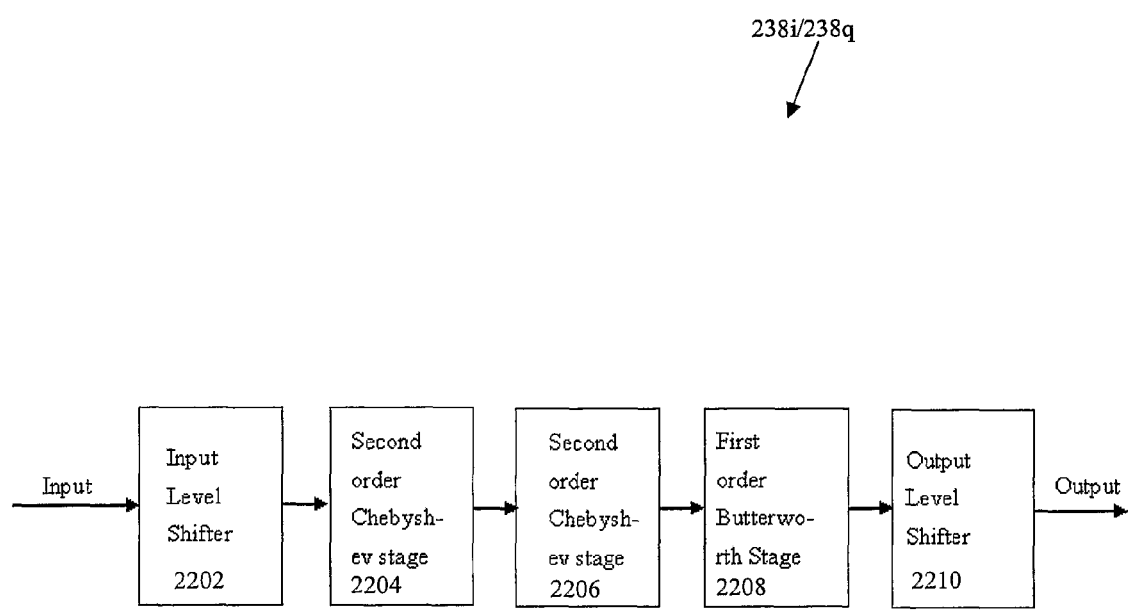
FIG. 22 shows a block level representation of a pulse-shaping filter (PSF) in a transmitter path of a RFID transceiver built in accordance with an embodiment of the invention.

FIG. 22 shows a block level representation of the pulse-shaping filter (PSF) 238*i*/238*q* in the transmitter path 204 (FIG. 2) of a RFID transceiver (see FIGS. 2-6) built in accordance with an embodiment of the invention.

The PSF 238*i*/238*q* includes an input level shifter 2202 which receives an input signal which is emitted by the respective DACs 236*i* and 236*q* (see FIG. 2). The input level shifter 2202 is coupled to a second order Chebyshev stage filter 2204, which is in turn coupled to another second order Chebyshev stage filter 2206. The another second order Chebyshev stage filter 2206 is coupled to a first order Butterworth stage filter 2208. Finally, an output level shifter 2210 is coupled to the first order Butterworth stage filter 2208 where the output level shifter 2210 output is sent to the modulator 240 (see FIG. 2) input.

FIG. 23A shows a block level representation of the pulse-shaping filter (PSF) 238*i*/238*q* in the transmitter path 204 (FIG. 2) of a RFID transceiver (see FIG. 2-6) built in accordance with an embodiment of the invention. FIG. 23B shows frequency characteristics of the pulse-shaping filter PSF 238*i*/238*q*.

From FIG. 23B, it will be observed that the pass-band frequency 2302 of the PSF 238*i*/238*q* is tunable to be about 40 kHz, 80 kHz or 160 kHz. A filter select signal 2306, operating in line with table 2304, determines which pass-band frequency 2302 is selected. At select '00', the filter select signal 2306 configures the PSF 238i/238q to have a passband frequency of about 40 kHz; at select '01', the filter select signal 2306 configures the PSF 238i/238q to have a passband frequency of about 80 kHz; at select '10', the filter select signal 2306 configures the PSF 238i/238q to have a passband frequency of about 160 kHz; while select '11' is not used.

It was described above that the tunable pulse shaping filters I-PSF 238i and Q-PSF 238q are designed to have a first attenuation of 30 dB at 150 KHz, 300 KHz and 750 KHz respectively; and a second attenuation of 65 dB at 280 KHz, 560 KHz and 1120 KHz respectively.

To meet these attenuation requirements, a fifth order biquad structure with the first four poles being realized by a Chebyshev filter and the last pole being realized by a Butterworth filter was employed. FIG. 24 shows the biquad structure 2400.

The bi-quad structure 2400 was chosen as it has less passive (RC) component value spread. As the corner frequencies and the stop band frequencies are related for the three filters, the resistor determining the frequency becomes multiples ($R_Q$ and $R_2$) as well when the capacitor ($C_1$ and $C_2$) is constant. Hence, the resistors $R_Q$ and $R_2$ were realized as parallel connection of three arms such that one or two arms are switched off to get the response for 80 KHz and 160 KHz filter respectively. A digital combinatorial logic (not shown) sends the filter select signal 2306 (FIG. 23) to have the PSF 238i/238q (compare FIG. 2) operate in the different frequency modes of 40, 80 and 160 kHz. The input level shifter 2202 (also compare FIG. 22) converts the common mode voltage from 0.25 V to 0.9 V (VDD/2). The output level shifter 2210 (also compare FIG. 22) converts the common mode voltage from 0.9 V to 0.35 V to drive the modulator 240 (FIG. 2) having a PMOS based input (not shown). When the PSF 238i/238q (FIG. 2) and the level shifters 2202 and 2210 are powered up, total current consumption is about 1.8 mA. In power down, the current consumption is less than about 1 μA.

II)a) Modulator 240

Figure 25:
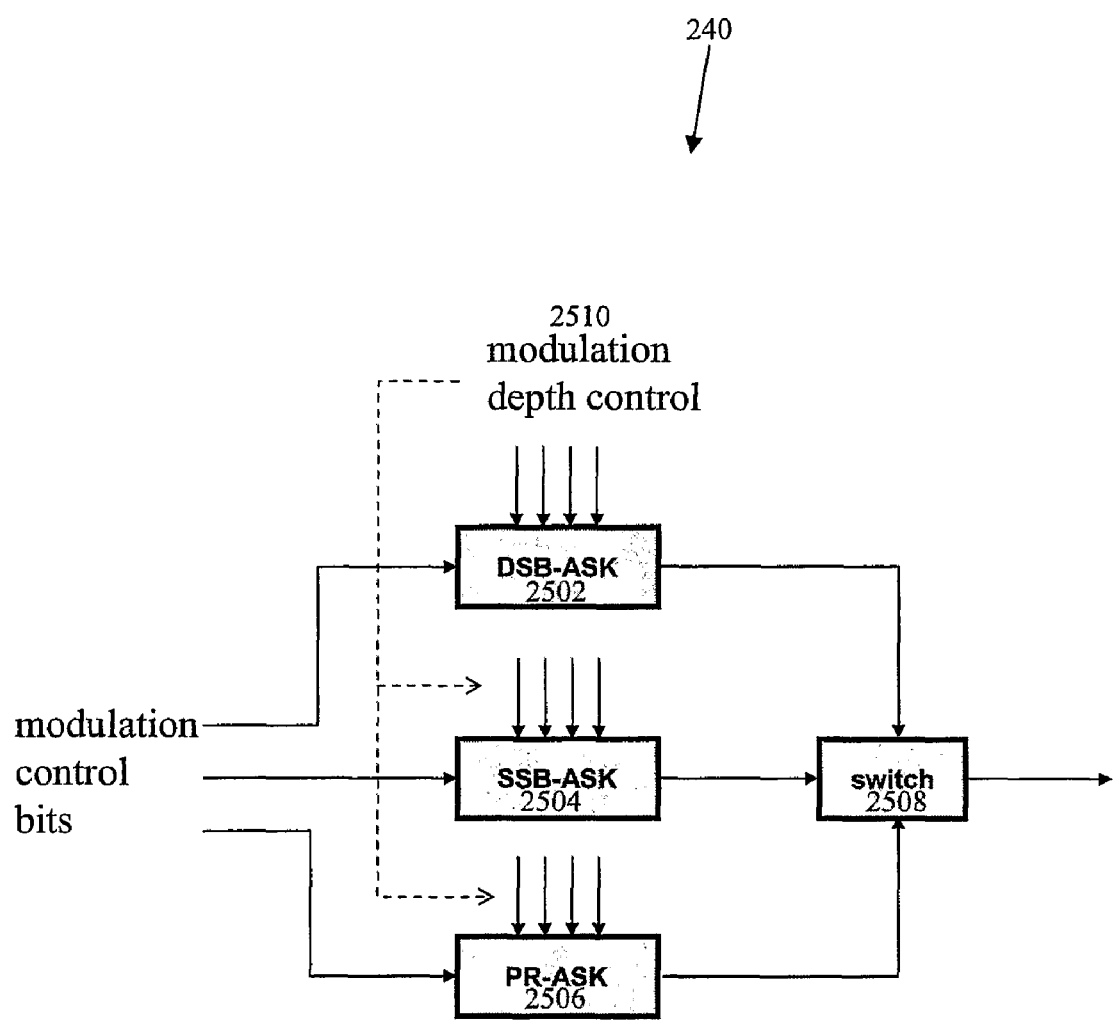
FIG. 25 shows a block level representation of a modulator in a transmitter path of a RFID transceiver built in accordance with an embodiment of the invention.

FIG. 25 shows a block level representation of the modulator 240 (FIG. 2) in the transmitter path 204 (FIG. 2) of a RFID transceiver (see FIG. 2-6) built in accordance with an embodiment of the invention.

The modulator 240 provides the three modulation schemes of DSB-ASK, PR-ASK and SSB-ASK through a DSB-ASK unit 2502, a PR-ASK unit 2504 and a SSB-ASK unit 2506 respectively. The DSB-ASK unit 2502, the PR-ASK unit 2504 and the SSB-ASK unit 2506 are controlled using a switch 2508. The modulation depth provided by each of the DSB-ASK unit 2502, the PR-ASK unit 2504 and the SSB-ASK unit 2506 is controlled by a modulation depth control signal 2510, whereby each ASK signal can have different modulation depths. The modulator 240 may be implemented using Gilbert-cell mixers with high linearity.

Figure 26:
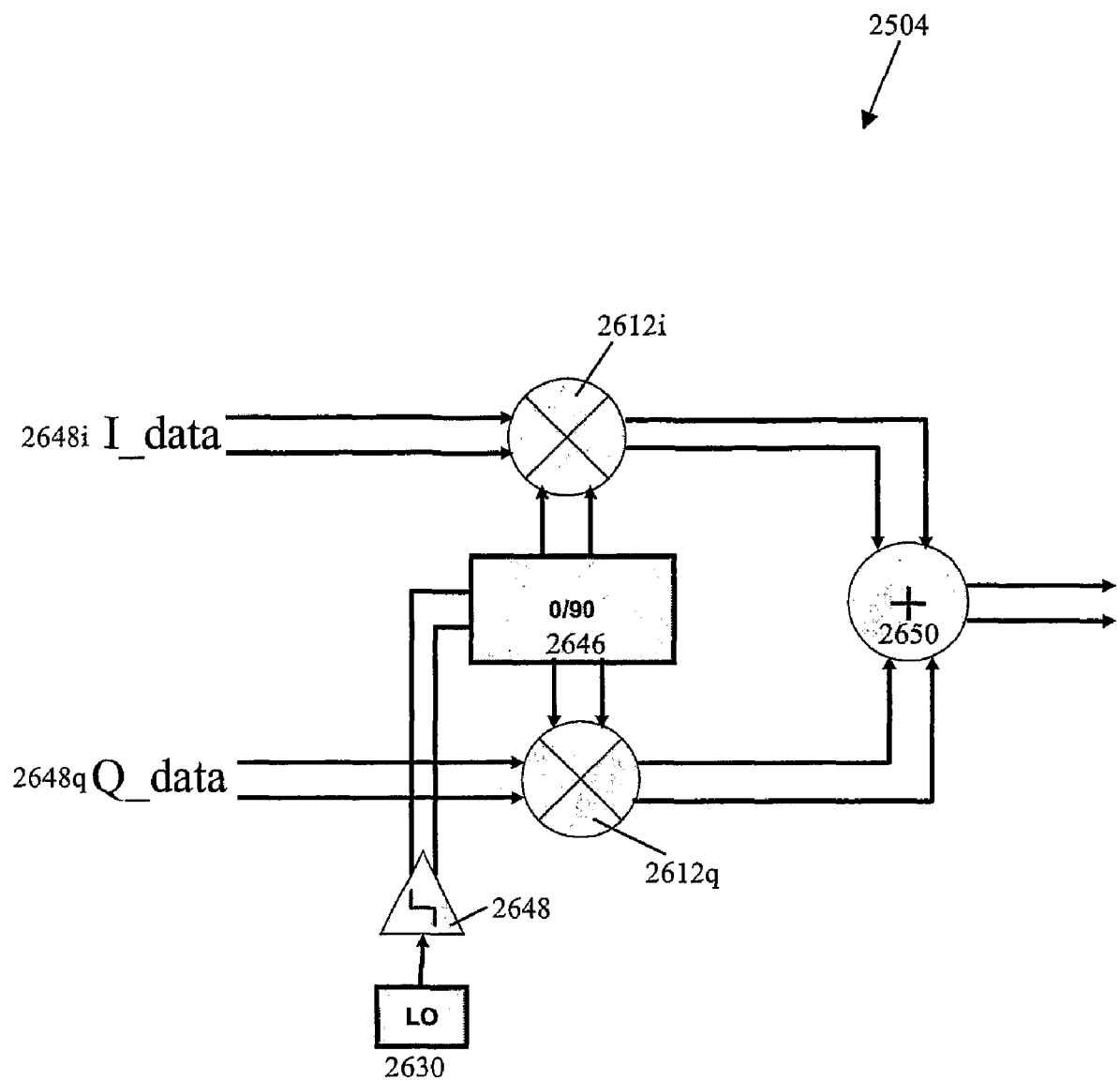
FIG. 26 shows a block level representation of a single sideband amplitude shift keying (SSB-ASK) unit used by a RFID transceiver built in accordance with an embodiment of the invention.

FIG. 26 shows a block level representation of the single sideband amplitude shift keying (SSB-ASK) unit 2504 (also compare FIG. 25) used by a RFID transceiver (see FIG. 2-6) built in accordance with an embodiment of the invention.

The SSB-ASK unit 2504 includes an I-Mixer 2612i, a Q-Mixer 2612q, a summer unit 2650, a 0/90 quadrature signal generator 2646, an external local oscillator (LO) unit 2630 and a single to differential converter 2648. The 0/90 quadrature generator 2646 is coupled to both the I-Mixer 2612i and the Q-Mixer 2612q, while I-Mixer 2612i and the Q-Mixer 2612q are coupled to the summer unit 2650.

The I-Mixer 2612i and the Q-Mixer 2612q respectively facilitate modulation of a carrier with a frequency determined by the external LO unit 2630, where the carrier is modulated with I_data signal 2648i and Q_data signal 2648q. It will be appreciated that the I_data 2648i and the Q_data 2648q are analogous to the I_data signal 248i (FIG. 2) and the Q_data signal 248q (FIG. 2) after processing in the respective DACs 236i and 236q (FIG. 2) and PSFs 238i and 238q (FIG. 2). The outputs from the I-Mixer 2612i and the Q-Mixer 2612q are then added in the summer unit 2650 for amplification in the power amplifier 244 (FIG. 2).

II)b) Power Amplifier 244

Figure 27:
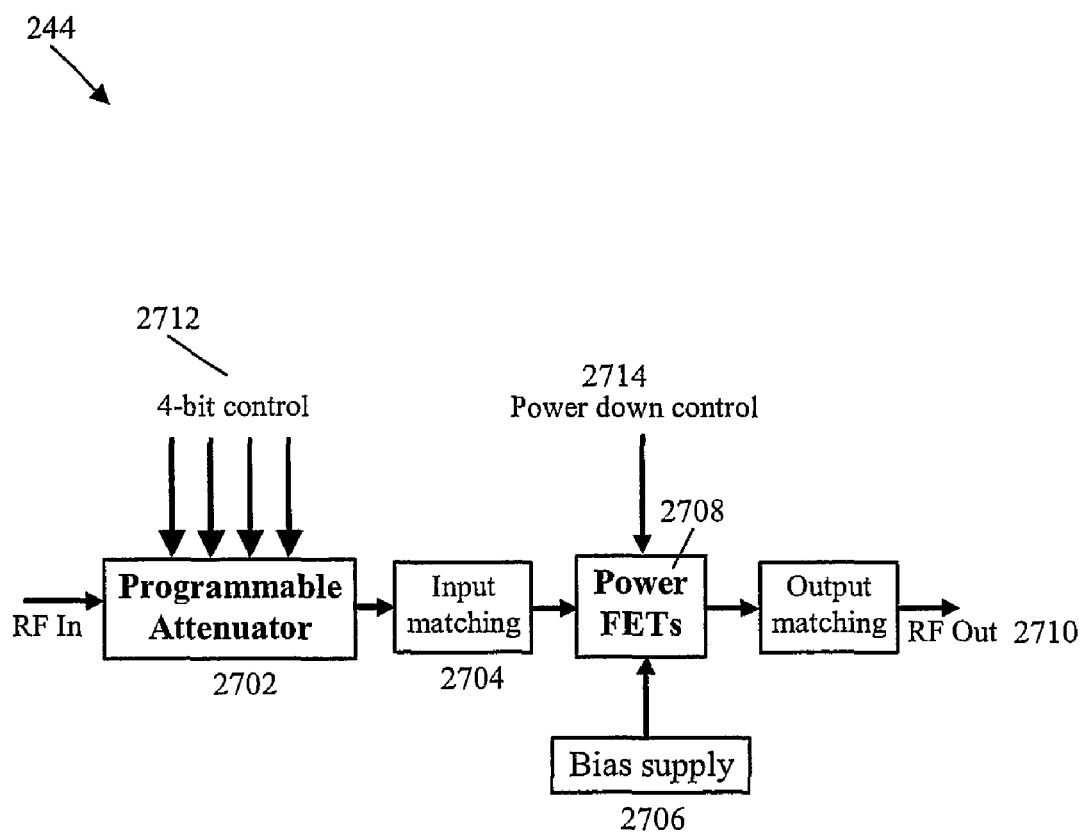
FIG. 27 shows a block level representation of a power amplifier (PA) in a transmitter path of a RFID transceiver built in accordance with an embodiment of the invention.

FIG. 27 shows a block level representation of the power amplifier (PA) 244 in the transmitter path 204 (FIG. 2) of a RFID transceiver (see FIG. 2-6) built in accordance with an embodiment of the invention.

The power amplifier 244 includes a programmable attenuator 2702, an input matching unit 2704, power FETs 2708, a bias supply 2706 and an output matching unit 2710.

The programmable attenuator 2702 is coupled to the input matching unit 2704. The power FETs 2708 are coupled to the input matching unit 2704, the bias supply 2706 and the output matching unit 2710. The programmable attenuator 2702 is controlled by a 4-bit control signal 2712, while the power FETs are controlled by a power down control signal 2714.

Single-stage Class-A amplifiers with power output of +10 dBm and output P1 dB of +11 dBm and power added efficiency of more than about 25% may be used. The power amplifier 244 is fully-integrated with programmability of transmit power in step of 1 dB up to 16 dB. The various components 2702, 2704, 2706, 2708 and 2710 use PTAT reference current source to enable them to operate from about −25° C. to about +75° C.

Figure 28:
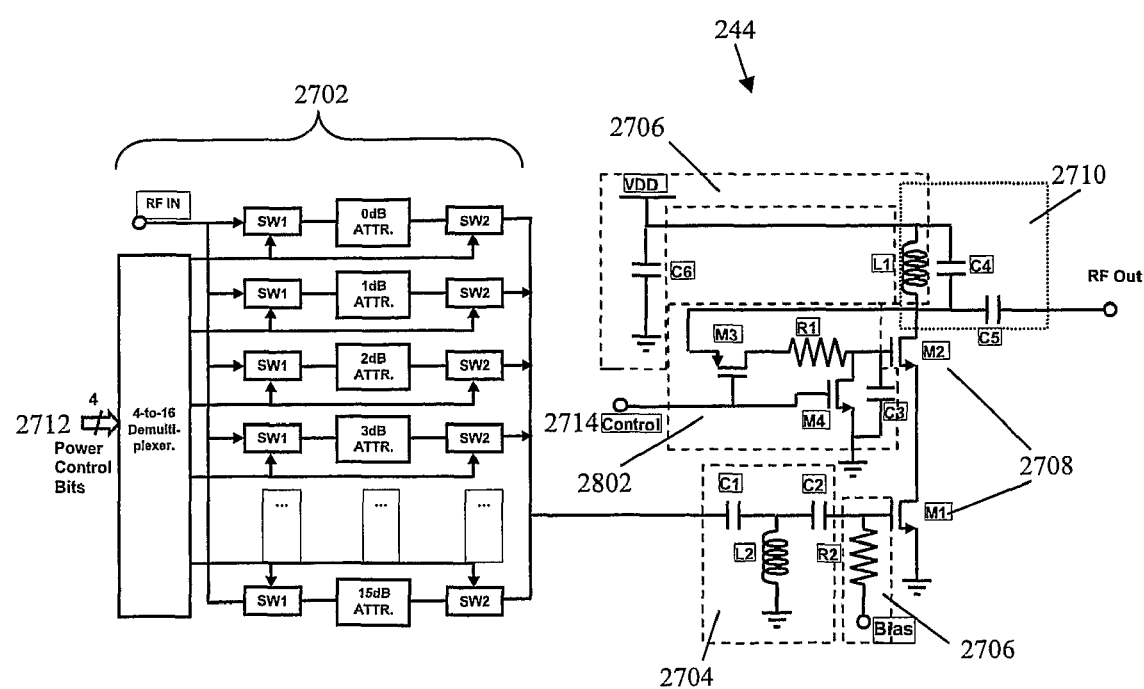
FIG. 28 shows a schematic diagram of a PA in a transmitter path of a RFID transceiver built in accordance with an embodiment of the invention.

FIG. 28 shows a schematic diagram of the power amplifier 244 in the transmitter path 204 (FIG. 2) of a RFID transceiver (see FIG. 2-6) built in accordance with an embodiment of the invention.

The various components 2702, 2704, 2706, 2708 and 2710 (FIG. 27) are connected as shown in FIG. 28.

In the embodiment shown in FIG. 28, the Linear Class-A power amplifier 244 is designed with 15 dB power control range. M1 and M2 are transistors having a cascode structure. M1 is biased to operate in Class-A mode, the bias voltage coming from a PTAT circuit (not shown) connected through resistor R2. M2 is self biased from the output through resistor R1 and capacitor C3, which improves the linearity of M2. M3 and M4 are transistors used to power down M2. M3 is a PMOS transistor which is used to switch on and off the gate voltage of M2. When the control voltage 2714 is low, the gate voltage of M2 is supplied from the drain of M2. When the control voltage 2714 is high, the gate of M2 is cut off from the drain of M2. M4 is a NMOS transistor which is part of a power off control circuit 2802. The function of M4 is to connect the gate of M2 to the ground to avoid floating during power down conditions. Inductor L1, capacitor C4 and capacitor C5 are part of the output matching circuit 2710 which provides maximum power for an optimum load impedance of 50 Ohm. The optimum load impedance is found with load-pull simulation. L1 also functions as DC feeding and can thus be considered to form part of the bias supply unit 2706 unit as well. Capacitor C6 is a decoupling capacitor for DC supply. Capacitor C1, inductor L2 and capacitor C2 are part of the input matching circuit 2704. All of the passive components are integrated on chip. C1 to C5 may be MIM capacitors, while C6 may be a MOS capacitor. L1 and L2 may be spiral inductors on a top metal layer. R1 and R2 may be polyresistors. The bias voltage is generated from a PTAT circuit (not shown) which may have reverse characteristics over temperature to the power amplifier 244 so that the resultant characteristic of power output vs. temperature is nearly flat over the entire temperature range from −25° C. to +75° C.

V) Application Specific Integrated Circuit (ASIC) 408

Figure 29:
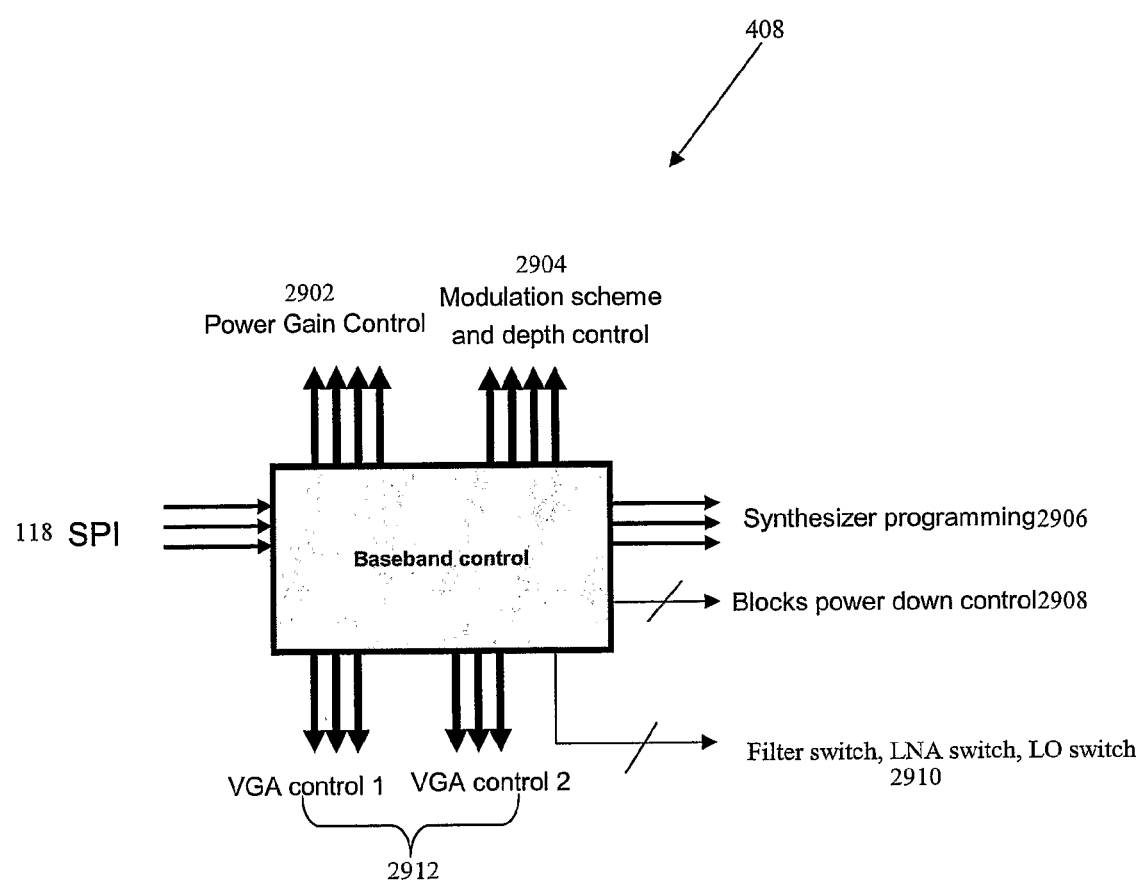
FIG. 29 shows a block level representation of a digital application specific integrated circuit (ASIC) of a RFID transceiver built in accordance with an embodiment of the invention.

FIG. 29 shows a block level representation of the digital application specific integrated circuit (ASIC) 408 (also compare FIG. 4) of a RFID transceiver (see FIG. 2-6) built in accordance with an embodiment of the invention.

The ASIC 408 provides a simple monitor and control interface to all the functions of the RFID transceiver (see FIG. 2-6) through a power gain control signal 2902; a modulation scheme and depth control signal 2904; a synthesizer programming signal 2906; a power down control signal 2908; a filter switch, LNA switch, LO switch control signal 2910; and VGA control 1 and VGA control 2 signals 2912. Communication with the ASIC 408 is achieved using the serial peripheral interface signal 118 (also see FIG. 4).

For example, the synthesizer programming signal 2906 can be used to control the operation of the PLL 206 (see FIG. 4), while the VGA control 1 and VGA control 2 signals 2912 can control the operation of the I-VGA 218$i$ (FIG. 2) and the I-VGA 218$q$ (FIG. 2).

Table 3002 in FIG. 30 summarises the logic control of the ASIC 408 and the corresponding effect achieved for each respective logic sequence. From table 3002, it can be appreciated that the RFID transceiver (see FIG. 2-6) is switched on (i.e. logic level '10') only when the RFID transceiver (see FIG. 2-6) receives backscatter signals.

The ASIC 408 provides for 20 shift registers for individual control of each of the individual components (for example 210, 212$i$ and 212$q$, etc of FIG. 2) in the RFID transceiver (see FIG. 2-6). Tables 3004 and 3006 in FIG. 30 summarises how each individual component in the RFID transceiver (see FIG. 2-6) can be powered down. It will be appreciated that selective powering down of the desired individual components facilitates debugging of the RFID transceiver (see FIG. 2-6).

Measured Results

The RFID transceiver (see FIG. 2-6) was fabricated in a commercial foundry using a standard 0.18 μm CMOS process. The analog and mixed-signal circuits are simulated using h-spice and the RF blocks simulated using ADS (Advanced Design System). The RFID transceiver (see FIG. 2-6) was packaged in a low-cost commercial TQFP100 package. The RFID transceiver (see FIG. 2-6) performance was evaluated separately on a FR4 board and evaluated from a temperature of about −25° C. to about +75° C. A UHF RFID reader system, incorporating a RFID transceiver (see FIG. 2-6) built in accordance with an embodiment of the invention, was also fabricated to credit card size on 2-layer FR4 PCB material, with components on only one side of the PCB and the other side of the PCB being a complete ground plane. The performance of three such UHF RFID reader systems were tested and compared with the performance of commercially available discrete UHF reader. Measurement results, as discussed below, indicate that a UHF RFID reader systems incorporating a RFID transceiver (see FIG. 2-6) built in accordance with an embodiment of the invention, matches the performance of conventional high-cost bulky Reader modules.

Figure 31:
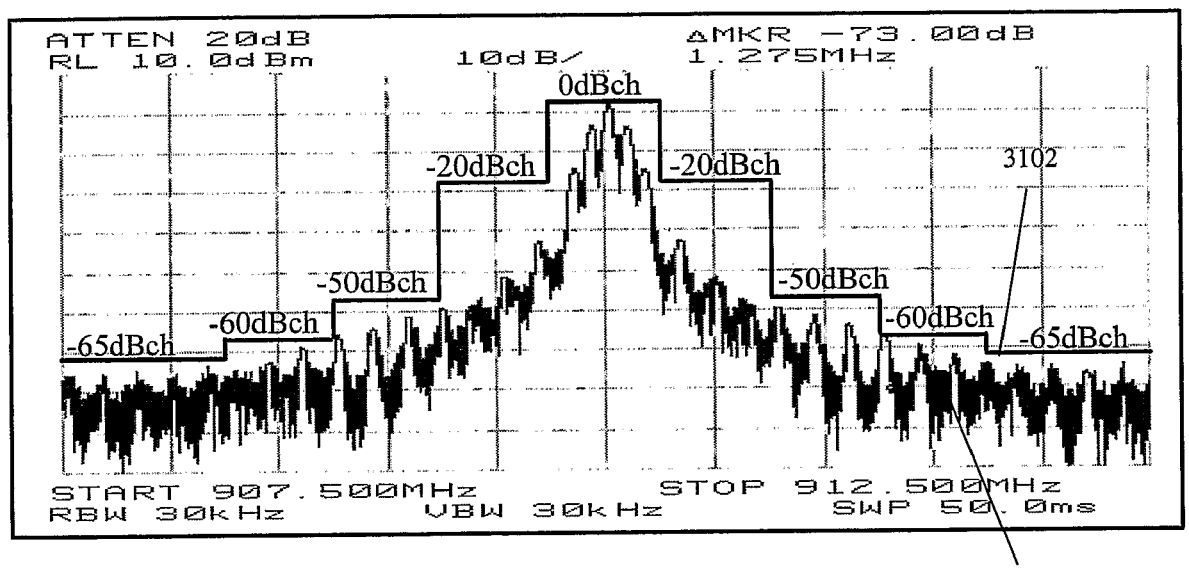
FIG. 31 shows the transmit spectrum mask for a multiple interrogator environment, which meets the EPC Gen-2 standard, and an output spectrum of a RFID transceiver built in accordance with an embodiment of the invention.

FIG. 31 shows the transmit spectrum mask 3102 for a multiple interrogator environment, which meets the EPC Gen-2 standard. Channel spacing 3106 is about 500 kHz for US. From FIG. 31, it is observed that the measured output spectrum 3104, facilitated by the PSF, the band limited modulator and the power amplifier components of the RFID transceiver (see FIG. 2-6) meets the standard.

Figure 32:
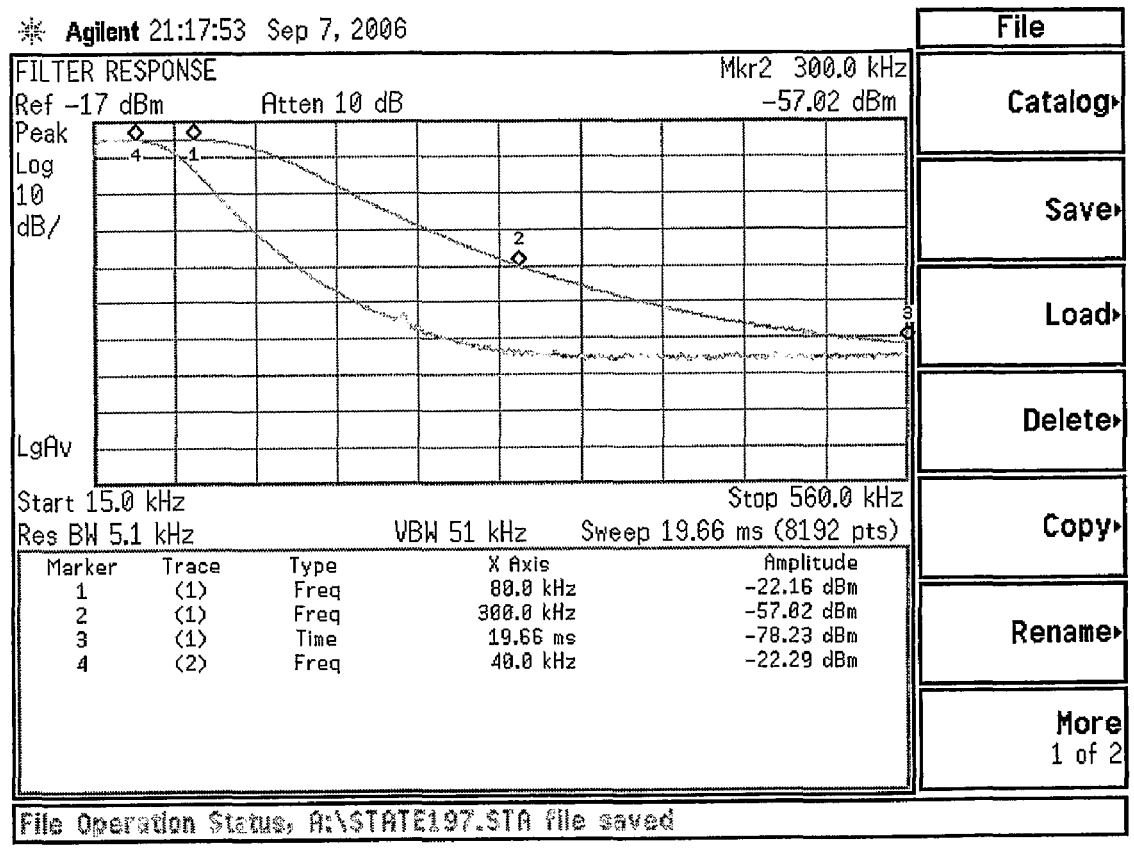
FIG. 32 shows measured pulse-shaping filter characteristics of a RFID transceiver built in accordance with an embodiment of the invention.

FIG. 32 shows measured pulse-shaping filter characteristics of a RFID transceiver (see FIG. 2-6) built in accordance with an embodiment of the invention.

Figure 33:
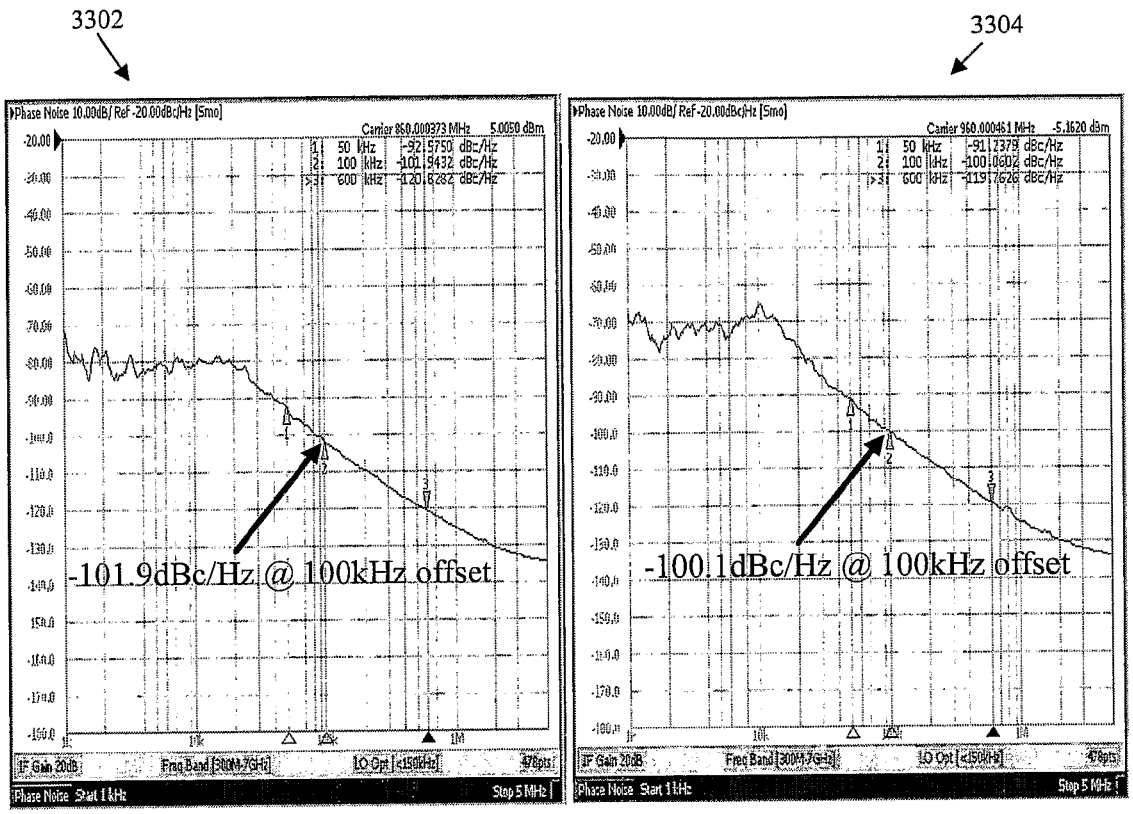
FIG. 33 shows measured carrier phase-noise at 860 MHz and 960 MHz of a RFID transceiver built in accordance with an embodiment of the invention.

FIG. 33 shows measured carrier phase-noise at 860 MHz (graph 3302) and 960 MHz (graph 3304) of a RFID transceiver (see FIG. 2-6) built in accordance with an embodiment of the invention. FIG. 33 illustrates that there is consistent phase noise over the entire RFID UHF band, where the measured noise is about −101 dBc/Hz at 100 kHz offset throughout the frequency range.

FIG. 34A shows DSB-ASK modulation of a RFID transceiver (see FIG. 2-6) built in accordance with an embodiment of the invention. FIG. 34B shows PR-ASK modulation of a RFID transceiver (see FIG. 2-6) built in accordance with an embodiment of the invention. FIG. 34C shows SSB-ASK modulation of a RFID transceiver (see FIG. 2-6) built in accordance with an embodiment of the invention. FIGS. 34A to 34C demonstrate the possibility of using the RFID transceiver (see FIG. 2-6) for all the modulation schemes used under the EPC Global Gen-2 standard. The desired modulation depth can be adjusted through the high-resolution 10-bit DACs.

FIG. 35A shows a channel-select filter response in listen before talk mode of a RFID transceiver (see FIG. 2-6) built in accordance with an embodiment of the invention. FIG. 35B shows a channel-select filter response in talk mode of a RFID transceiver (see FIG. 2-6) built in accordance with an embodiment of the invention.

Figure 36:
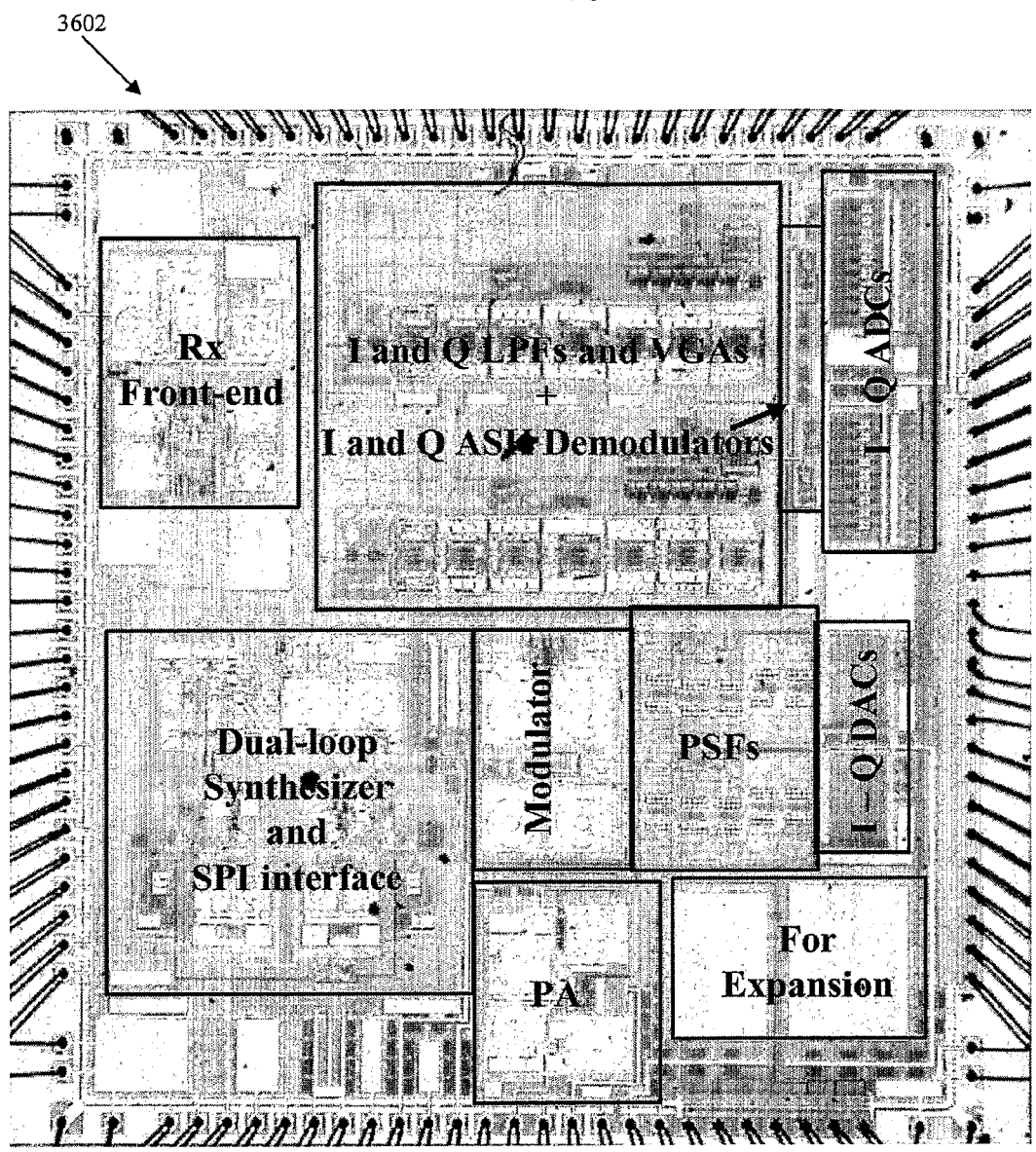
FIG. 36 shows a photograph of a die having a RFID transceiver built in accordance with an embodiment of the invention.

FIG. 36 shows a photograph of a die 3602 having a RFID transceiver (see FIG. 2-6) built in accordance with an embodiment of the invention. The die 3602 is about 6×6 mm and manufactured using a 1P6M 0.18 um CMOS process from Chartered semiconductor. The die 3602 can be fabricated on A TQP-100 package on FR-4 PCB.

Figure 37:
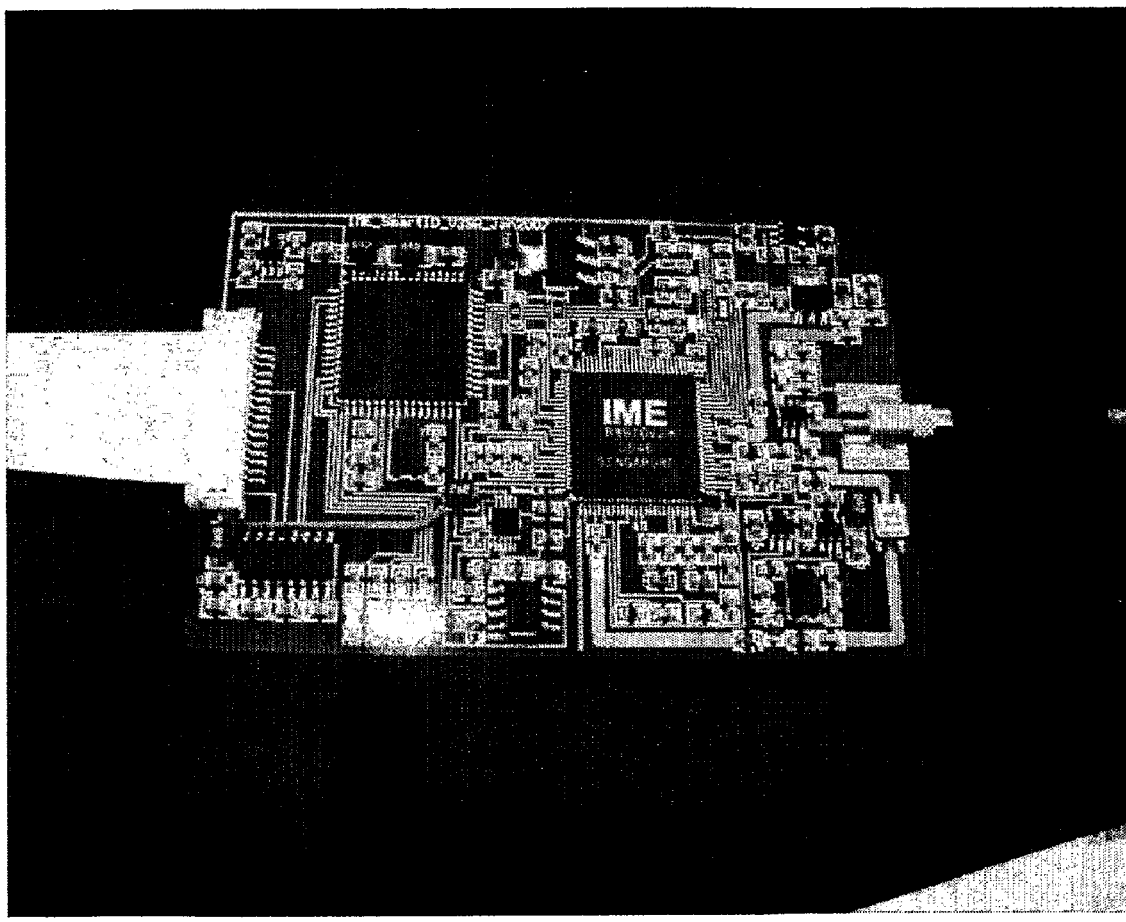
FIG. 37 shows a photograph of a UHF (ultra high frequency) RFID reader system incorporating a RFID transceiver built in accordance with an embodiment of the invention.

FIG. 37 shows a photograph of a UHF RFID reader system incorporating a RFID transceiver (see FIG. 2-6) built in accordance with an embodiment of the invention.

FIG. 38 shows a table summarizing the performance results of a RFID transceiver (see FIG. 2-6) built in accordance with an embodiment of the invention.

FIG. 39 shows a table summarizing the range performance results of a RFID transceiver (see FIG. 2-6) built in accordance with an embodiment of the invention.

Figure 40:
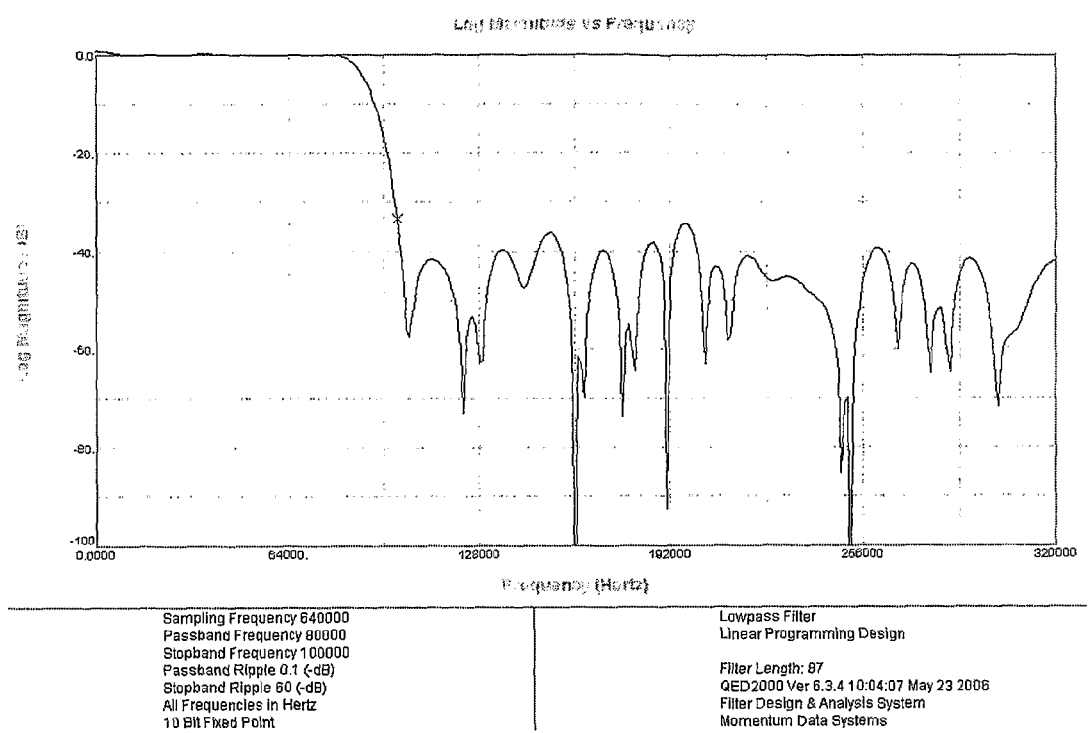
FIG. 40 shows the response of a digital low pass filter (channel select filter) of a RFID transceiver built in accordance with an embodiment of the invention.

FIG. 40 shows the response of a digital low pass filter (channel select filter) of a RFID transceiver (see FIG. 2-6) built in accordance with an embodiment of the invention. The response is to a 10 bit word length for a 80 kHz pass band.

Figure 41:
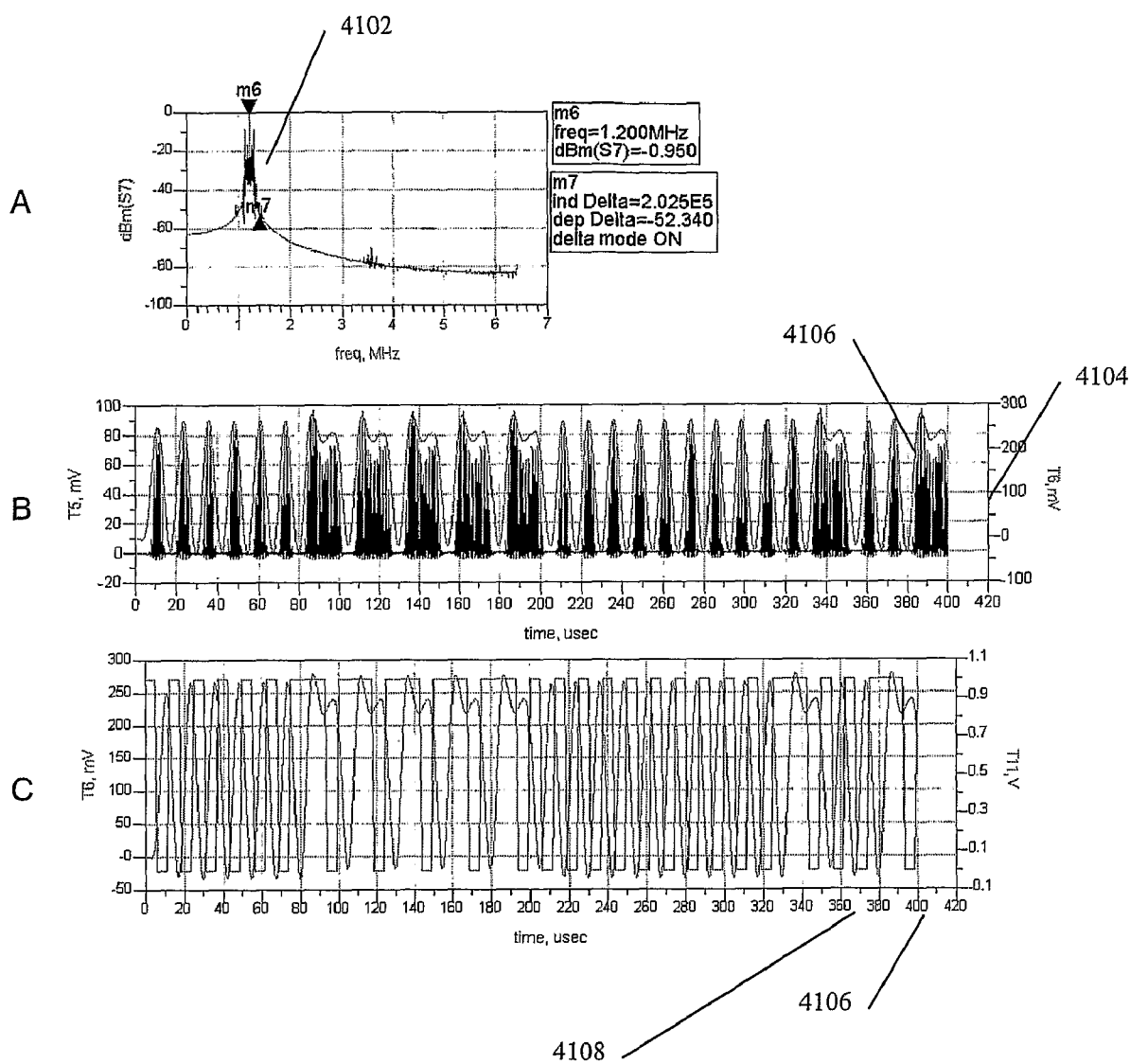
FIG. 41A shows a signal in a transmission path of a RFID transceiver built in accordance with an embodiment of the invention.
FIG. 41B shows a transmitted signal from a RFID transceiver built in accordance with an embodiment of the invention, along with a detection envelope.
FIG. 41C compares a transmission spectrum mask of a RFID transceiver built in accordance with an embodiment of the invention against a detection envelope.

FIG. 41A shows a signal 4102 in a transmission path of a RFID transceiver (see FIG. 2-6) built in accordance with an embodiment of the invention. The signal 4102 has undergone analog filtering but not modulation yet. FIG. 41B shows a transmitted signal 4104 from a RFID transceiver (see FIG. 2-6) built in accordance with an embodiment of the invention, along with a detection envelope 4106. FIG. 41C compares a transmission spectrum mask 4108 of a RFID transceiver (see FIG. 2-6) built in accordance with an embodiment of the invention against the detection envelope 4106.

Figure 42:
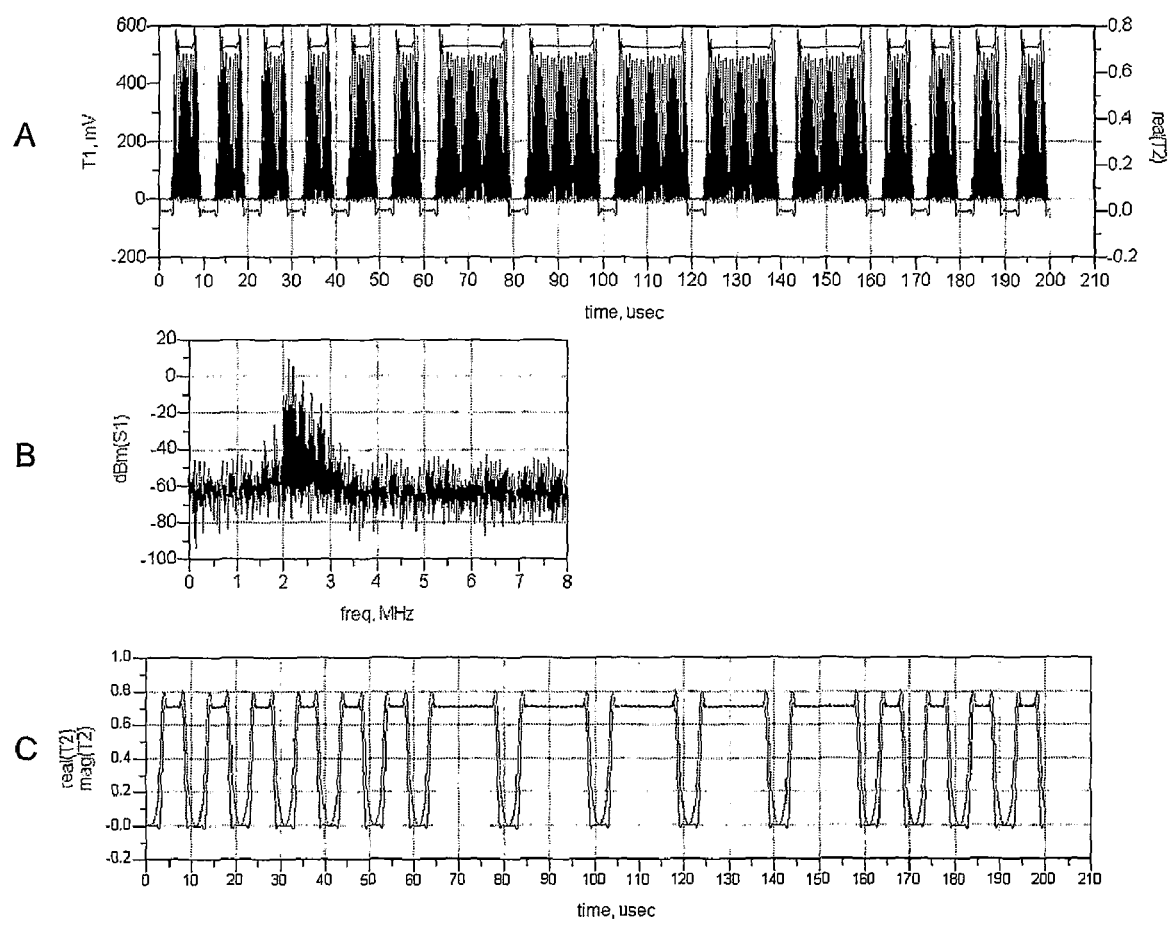
FIG. 42A shows a detected signal, in time domain, in a RFID transceiver built in accordance with an embodiment of the invention.
FIG. 42B shows a SSB modulation spectrum of a RFID transceiver built in accordance with an embodiment of the invention.
FIG. 42C shows a detected signal, in time domain, in a RFID transceiver built in accordance with an embodiment of the invention.

FIG. 42B shows a SSB modulation spectrum of a RFID transceiver (see FIG. 2-6) built in accordance with an embodiment of the invention. FIGS. 42A and 42C show detected signals, in time domains, in a RFID transceiver (see FIG. 2-6) built in accordance with an embodiment of the invention.

FIG. 43 shows waveforms in a receiver path of a RFID transceiver (see FIG. 2-6) built in accordance with an embodiment of the invention, where an ideal local oscillator is used.

Figure 44:
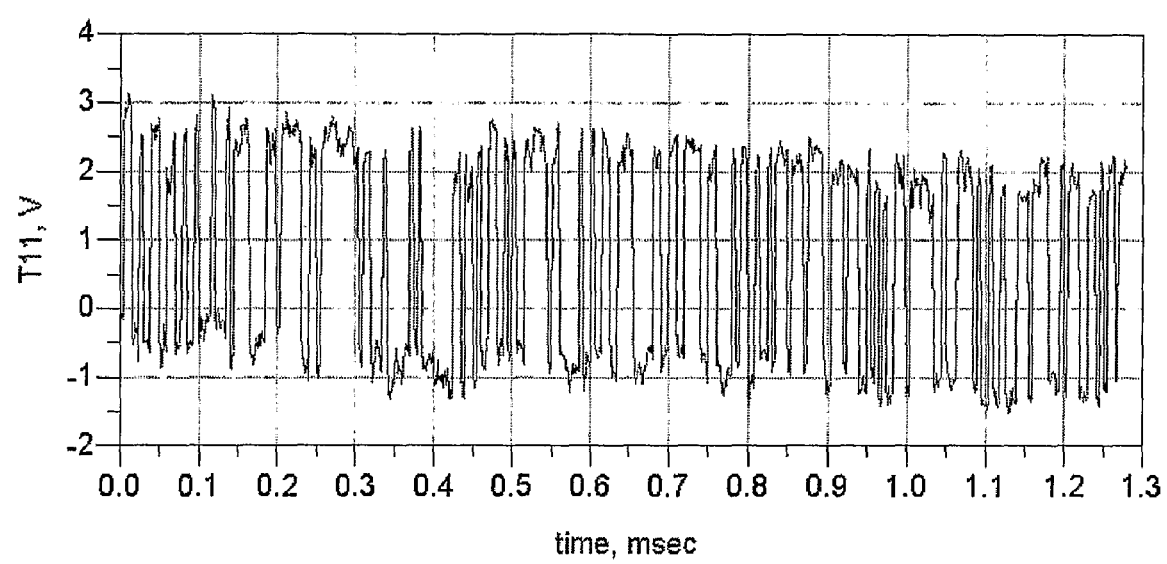
FIG. 44 shows the effect of phase noise, with a blocking signal present, on signal performance of a RFID transceiver built in accordance with an embodiment of the invention.

FIG. 44 shows the effect of phase noise, with a blocking signal present, on signal performance of a RFID transceiver (see FIG. 2-6) built in accordance with an embodiment of the invention.

Figure 45:
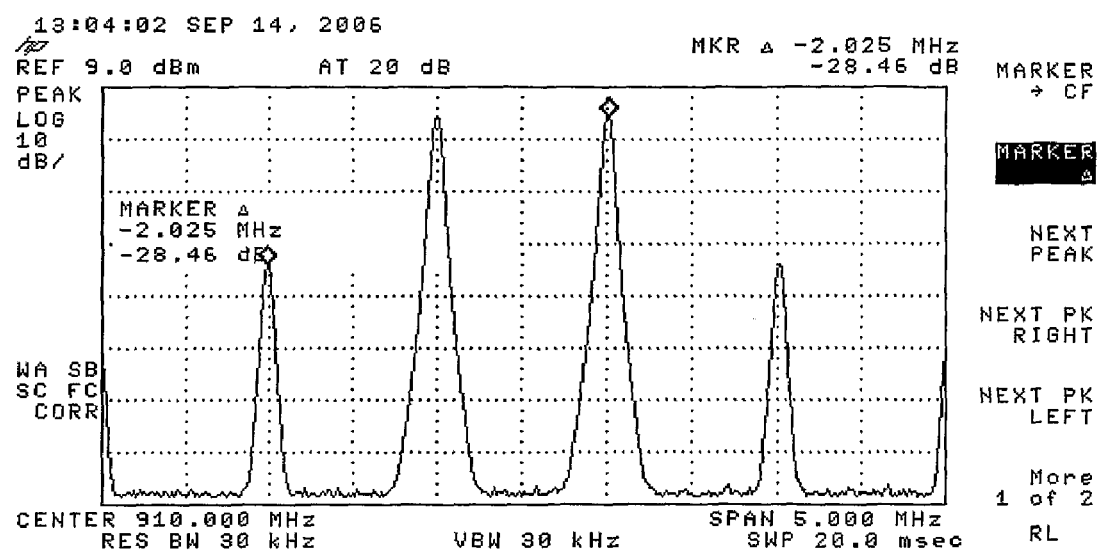
FIG. 45 shows a two-tone output spectrum emitted from a power amplifier of a RFID transceiver built in accordance with an embodiment of the invention.

FIG. 45 shows a two-tone output spectrum emitted from a power amplifier of a RFID transceiver (see FIG. 2-6) built in accordance with an embodiment of the invention.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A radio frequency identification transceiver, comprising:
a transmitter path, comprising;
   a pulse shaper to tunably shape a pulse of a signal to be transmitted in different predefined frequency ranges;
   a modulator to modulate the shaped pulse to be transmitted into one of a plurality of predefined frequency ranges;
a receiver path, comprising:
   a demodulator to demodulate a received signal from the plurality of predefined frequency ranges;
   an in-phase mixer to provide a first differential in-phase signal and a second differential in-phase signal;
   a quadrature mixer to provide a first differential quadrature signal and a second differential quadrature signal;
   an in-phase amplifier coupled to the in-phase mixer to amplify the first differential in-phase signal and the second differential in-phase signal;
   a quadrature amplifier coupled to the quadrature mixer to amplify the first differential quadrature signal and the second differential quadrature signal.

2. The radio frequency identification transceiver of claim 1, wherein the transmitter path further comprises a digital-to-analog converter to convert a digital signal to be transmitted to an analog signal to be transmitted, wherein the digital-to-analog converter is coupled to the pulse shaper such that the analog signal to be transmitted is supplied to the pulse shaper.

3. The radio frequency identification transceiver of claim 1, wherein the transmitter path further comprises an attenuator to attenuate portions of the modulated signal to be transmitted, wherein the attenuator is coupled to the modulator to receive the modulated signal to be transmitted.

4. The radio frequency identification transceiver of claim 1, wherein the transmitter path further comprises at least one amplifier to amplify the modulated signal to be transmitted.

5. The radio frequency identification transceiver of claim 1, wherein the receiver path further comprises at least one amplifier to amplify the received signal.

6. The radio frequency identification transceiver of claim 5, wherein the amplifier is a low noise amplifier.

7. The radio frequency identification transceiver of claim 5, wherein the amplifier comprises two amplifier stages, a gain stage and a single-to-differential stage to provide a first differential signal and a second differential signal.

8. The radio frequency identification transceiver of claim 1, wherein the receiver path further comprises at least one tunable filter to filter the amplified differential signals provided by the in-phase amplifier and the quadrature amplifier.

9. The radio frequency identification transceiver of claim 8, wherein the receiver path further comprises:
   an in-phase variable gain amplifier to amplify the filtered first differential in-phase signal and the filtered second differential in-phase signal;
   a quadrature variable gain amplifier to amplify the filtered first differential quadrature signal and the filtered second differential quadrature signal.

10. The radio frequency identification transceiver of claim 9, wherein the demodulator is coupled to an output of the in-phase variable gain amplifier to receive the amplified filtered first differential in-phase signal and the amplified filtered second differential in-phase signal and to an output of the quadrature variable gain amplifier to receive the amplified filtered first differential quadrature signal and the amplified filtered second differential quadrature signal.

11. The radio frequency identification transceiver of claim 9, wherein the receiver path further comprises:
   an in-phase analog-to-digital converter to convert an analog in-phase signal provided by the in-phase variable gain amplifier to a digital in-phase signal;
   a quadrature analog-to-digital converter to convert an analog quadrature signal provided by the quadrature variable gain amplifier to a digital quadrature signal.

12. The radio frequency identification transceiver of claim 1, further comprising:
   a synthesizer to provide oscillator signals.

13. The radio frequency identification transceiver of claim 12, wherein the synthesizer is coupled to the in-phase mixer to provide an in-phase local oscillator signal to the in-phase mixer;
   wherein the synthesizer is coupled to the quadrature mixer to provide a quadrature local oscillator signal to the quadrature mixer.

14. The radio frequency identification transceiver of claim 12, wherein the synthesizer is coupled to the modulator to provide an in-phase radio frequency oscillator signal and a quadrature radio frequency oscillator signal to the modulator.

15. The radio frequency identification transceiver of claim 12, wherein the synthesizer comprises at least one phase locked loop circuit.

16. The radio frequency identification transceiver of claim 1, wherein the predefined frequency ranges are in the range of about 860 MHz to about 960 MHz.

* * * * *